United States Patent
Kawahito et al.

(10) Patent No.: US 10,636,822 B2
(45) Date of Patent: Apr. 28, 2020

(54) PHOTOELECTRIC CONVERSION ELEMENT AND SOLID-STATE IMAGE CAPTURING DEVICE

(71) Applicant: National University Corporation Shizuoka University, Shizuoka-shi, Shizuoka (JP)

(72) Inventors: Shoji Kawahito, Shizuoka (JP); Min-Woong Seo, Shizuoka (JP); Keita Yasutomi, Shizuoka (JP); Yuya Shirakawa, Shizuoka (JP)

(73) Assignee: National University Corporation Shizuoka University, Shizuoka-shi, Shizuoka (*) Notice: Subject to any disclaimer, the term of this patent is extended or adjusted under 35 U.S.C. 154(b) by 0 days.

(21) Appl. No.: 16/327,364

(22) PCT Filed: Aug. 24, 2017

(86) PCT No.: PCT/JP2017/030414
§ 371 (c)(1),
(2) Date: Feb. 22, 2019

(87) PCT Pub. No.: WO2018/038230
PCT Pub. Date: Mar. 1, 2018

(65) Prior Publication Data
US 2019/0206915 A1 Jul. 4, 2019

(30) Foreign Application Priority Data

Aug. 24, 2016 (JP) .................. 2016-164162
Aug. 24, 2016 (JP) .................. 2016-164163

(51) Int. Cl.
*H01L 27/146* (2006.01)
*H04N 5/378* (2011.01)
(Continued)

(52) U.S. Cl.
CPC .... *H01L 27/14616* (2013.01); *H01L 27/1461* (2013.01); *H01L 27/14607* (2013.01);
(Continued)

(58) Field of Classification Search
CPC ......... H01L 27/14616; H01L 27/14607; H01L 27/1461; H04N 5/3745; H04N 5/378
See application file for complete search history.

(56) References Cited

U.S. PATENT DOCUMENTS

| 7,843,029 B2* | 11/2010 | Kawahito | ................ G01C 3/02 257/431 |
| 8,730,382 B2* | 5/2014 | Aoyama | ........... H01L 27/14603 348/229.1 |

(Continued)

FOREIGN PATENT DOCUMENTS

| WO | 2007/119626 A1 | 10/2007 |
| WO | 2009/147862 A1 | 12/2009 |

(Continued)

*Primary Examiner* — Earl N Taylor
(74) *Attorney, Agent, or Firm* — Metrolex IP Law Group, PLLC

(57) ABSTRACT

In a photoelectric-conversion element having a large light receiving region for a high-speed transfer, and a solid-state image sensor including the photoelectric-conversion element, the photoelectric-conversion element includes first to eighth charge read-out regions, which are provided at positions symmetric with respect to a center position of a light receiving region and first to eighth field-control electrodes, which are arranged on both sides of charge-transport paths extending from the center position of the light receiving region to the first to eighth charge read-out regions, respectively, and change depletion potentials of the charge-transport paths and the octuple charge-transfer channels.

20 Claims, 51 Drawing Sheets

(51) Int. Cl.
*H04N 5/3745* (2011.01)
*H04N 5/361* (2011.01)
*H04N 5/363* (2011.01)

(52) U.S. Cl.
CPC .......... *H04N 5/378* (2013.01); *H04N 5/3745* (2013.01); *H04N 5/361* (2013.01); *H04N 5/363* (2013.01)

(56) References Cited

U.S. PATENT DOCUMENTS

| | | | | |
|---|---|---|---|---|
| 9,503,663 | B2* | 11/2016 | Etoh | H04N 5/3696 |
| 10,325,953 | B2* | 6/2019 | Kawahito | G01S 7/481 |
| 2011/0090385 | A1* | 4/2011 | Aoyama | H01L 27/14603 348/308 |
| 2014/0362268 | A1* | 12/2014 | Etoh | H04N 5/3696 348/306 |
| 2017/0171485 | A1* | 6/2017 | Kawahito | H01L 27/1446 |
| 2019/0206915 | A1* | 7/2019 | Kawahito | H01L 27/14607 |

FOREIGN PATENT DOCUMENTS

| | | |
|---|---|---|
| WO | 2013/129559 A1 | 9/2013 |
| WO | 2015/118884 A1 | 8/2015 |

\* cited by examiner

AT A TIMING WHEN CHARGES ARE TRASFERED TO SD7
TD0 = 0.0[V]

FIG. 18A  WHEN CHARGES FOR DARK CURRENT ARE EXHAUSTED
TD0 = 3.3[V]
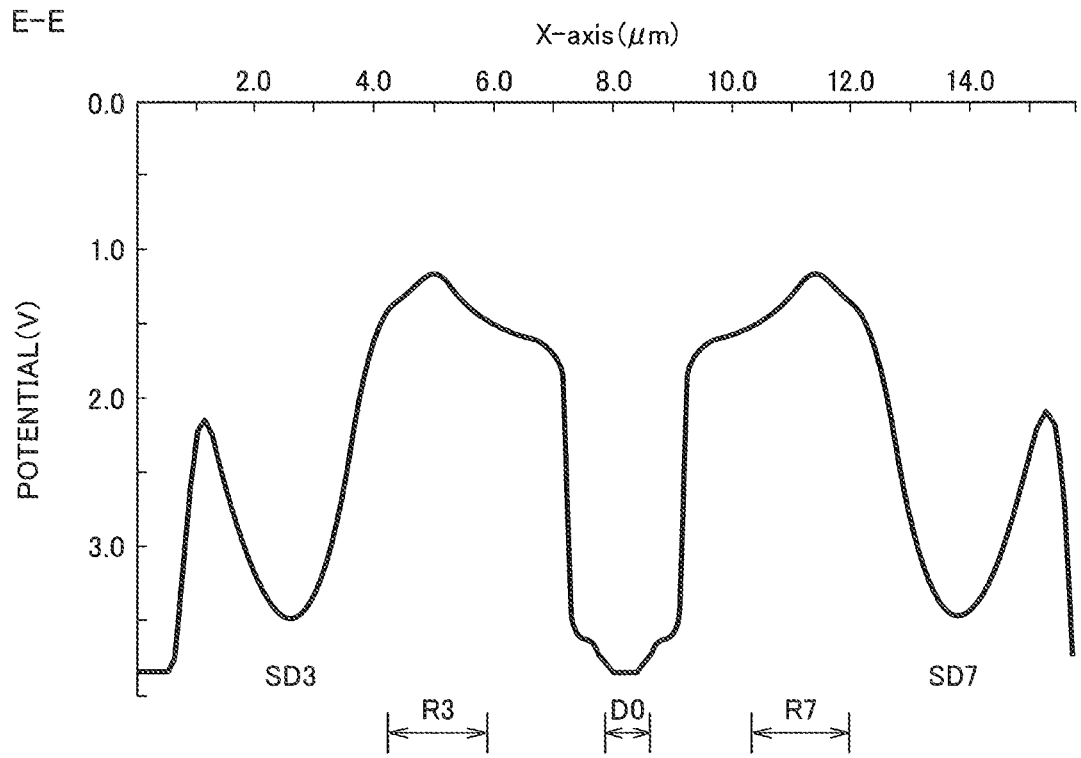
FIG. 18B
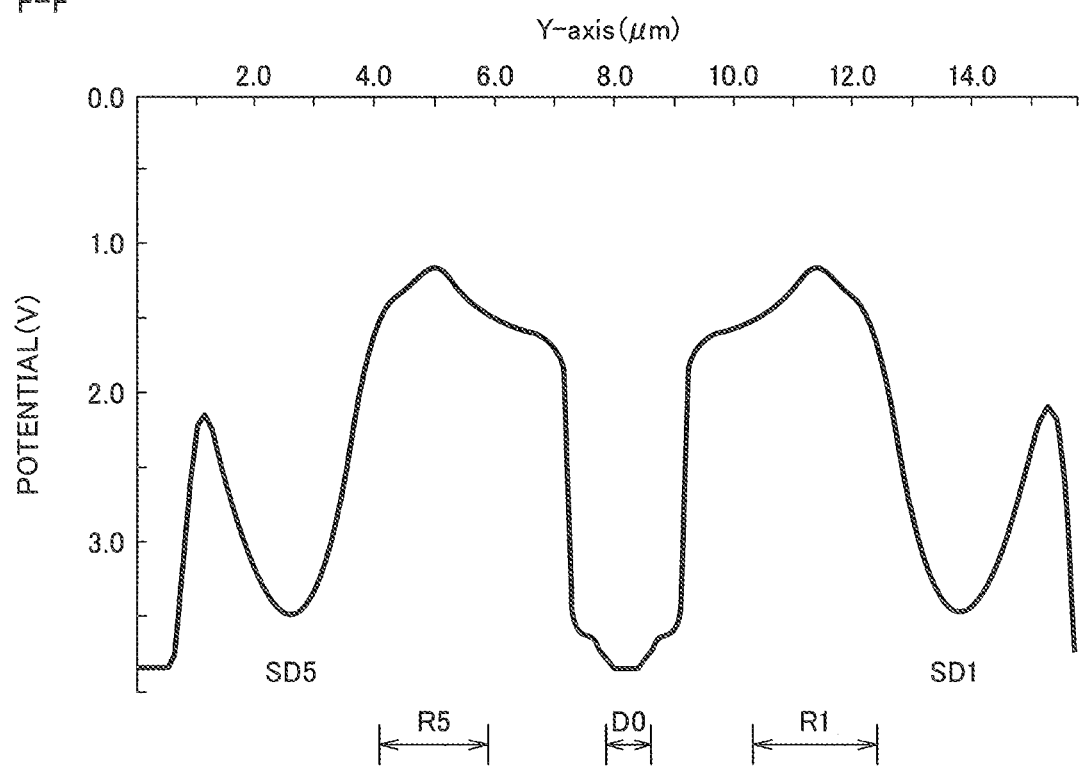

TG:OFF/CA:ON/TX:OFF

TG:OFF/CA:ON/TX:ON

TG:OFF/CA:OFF/TX:ON

PHOTOELECTRIC CONVERSION ELEMENT AND SOLID-STATE IMAGE CAPTURING DEVICE

TECHNICAL FIELD

The present invention relates to a photoelectric-conversion element, which converts an optical signal into a signal charge consisting of electrons or positive holes (holes), and to a solid-state image sensor (image capturing device) in which the photoelectric-conversion elements or pixels, each of the pixels having a structure equivalent to that of the photoelectric-conversion element, are one-dimensionally or two-dimensionally arrayed.

BACKGROUND ART

In a time-of-flight (TOF) range sensor that acquires a range image through use of the flight time of light, a MOS structure is used for controlling a potential just under a gate electrode in a vertical direction against a principal surface of a semiconductor chip, in which the MOS structure is merged. For example, as recited in PTL 1, a CMOS range-finding element and a TOF image sensor including the CMOS range-finding elements are proposed. The CMOS range-finding element includes an n-type charge-generation buried-region buried in a p-type semiconductor layer, charge-transfer buried-regions, charge read-out buried regions, an insulator covering the layer and the regions, transfer electrodes, which are arranged on the insulator and transfer signal charges to the charge-transfer buried-regions, and read-out gate electrodes, which are arranged on the insulator and transfer signal charges to the charge read-out buried regions. The charge-generation buried-region receives a light pulse, and optical signals are photoelectrically converted into signal charges in the semiconductor layer just under the charge-generation buried-region. Then, based on a distribution ratio of the charges accumulated in the charge-transfer buried-regions, a distance from a target is measured.

With the CMOS range-finding element and the TOF image sensor, which includes the CMOS range-finding elements, there are concerns over such problem that noise and a dark current may be caused. The noise and the dark current are ascribablr to, for example, interface defects and interface states just under the transfer electrode of the CMOS range-finding element. Further, in a case where the transfer electrodes described in PTL 1 are used, actually, it is difficult to control a potential-gradient over a long distance, and it is impossible to maintain an electric field substantially constant over a long charge-transfer channel. Thus, in the photoelectric-conversion element such as a range-finding element having a long charge-transfer channel, there is caused such inconvenience that carriers are stopped in the middle of the charge-transfer channel and expected performance is not easily obtained.

Moreover, in recent year, in a field of biomedical science, a time-resolution image sensor has been used more widely. Among techniques adopting the time-resolution image sensor is fluorescence lifetime imaging microscopy (FLIM) for measuring a time period of attenuation of fluorescence, or the fluorescence lifetime, by measuring intensity of fluorescence, the fluorescence is excited by irradiating light to molecules in cells. It is expected that the application of FLIM provide a considerable impact on a field of medical science and preventive medicine.

As recited in PTL 2, the inventors of the present invention have already proposed a four-tap lateral electric field (LEF) control photoelectric-conversion element capable of acquiring continuous time-resolution components with four short time-windows at low noise while maintaining a high signal/noise ratio (S/N ratio), the photoelectric-conversion element disclosed in PTL 2 includes four charge-accumulation regions provided at quadruple positions symmetric with respect to a center position of a light-receiving area and field-control electrode (gate electrode) pairs provided to both sides of paths to the respective charge-accumulation regions. The charges generated through the photoelectric conversion are transported while destinations of the charges are sequentially set to the first charge-accumulation region to the fourth charge-accumulation region. A time-window is set to a period of a subnanosecond, and single-shot measurement is performed with triple or quadruple time-windows at the same time. Subsequently, the third or fourth incoming light corresponding to the timing for the triple or quadruple time-windows are delayed as a whole to perform measurement in a measurement time range directly after the time-window of the first time. Those actions are repeated at several times and joined. In this manner, time resolution of a subnanoseconds required for the fluorescence lifetime measurement and a measurement time range of several nanoseconds can be achieved.

According to the technology recited in PTL 2, a potential profile to maintain an electric field substantially constant is easily controlled over the long charge-transfer channel, and the signal charges are transported to the plurality of regions through the long charge-transfer channel at a high speed with satisfactory symmetry. Moreover, there can be provided the photoelectric-conversion element, which can avoid a problem of occurrence of noise and a dark current caused by, for example, interface defects and interface states in the interface at the semiconductor surface and a problem of reduction in transport speed, and the solid-state image sensor with low noise, high resolution, and a high response speed in which the plurality of photoelectric-conversion elements are arrayed. However, in a case of a single shot, there is a problem in that the four-tap photoelectric-conversion element can acquire only three or four components among a plurality of fluorescence time resolution components. Further, in a case where acquisition is performed by repeating a single shot, there is a problem in that a total measurement time is increased.

CITATION LIST

Patent Literature

[PTL 1] WO 2007/119626
[PTL 2] WO 2015/118884

SUMMARY OF INVENTION

Technical Problem

In view of the above-mentioned problems, the present invention has an object to provide a photoelectric-conversion element capable of reducing a total measurement time and a solid-state image sensor including the photoelectric-conversion elements.

Solution to Problem

In order to achieve the above-mentioned object, a first aspect of the present invention inheres in a photoelectric-conversion element, which includes (a) an image-capturing region including a buried photodiode formed of an element-allocating layer of a first conductivity type and a surface buried region of a second conductivity type, the surface buried region being buried in an upper portion of the element-allocating layer, (b) a plurality of charge read-out regions of n pieces, having a second conductivity type, the charge read-out regions are provided away from one another, being disposed at quintuple or more positions, surrounding a light receiving region defined in a center of the image-capturing region, and having impurity concentration higher than that of the element-allocating layer, (c) a plurality of charge-transfer channels of a second conductivity type, which have independent paths extending from the light receiving region to the plurality of charge read-out regions, respectively, and (d) a plurality of paired field-control electrodes disposed at both sides of the plurality of charge-transfer channels, the paired field-control electrodes are arranged at positions surrounding the light receiving region. In the photoelectric-conversion element according to the first aspect, a destination of majority carriers being generated in the surface buried region is sequentially controlled to be determined toward any of the plurality charge-accumulation regions by sequentially and cyclically applying field-control pulses having different phases to the plurality of field-control electrodes, and by sequentially changing depletion potentials of the surface buried region and the plurality of charge-transfer channels.

A second aspect of the present invention inheres in a solid-state image sensor in which the photoelectric-conversion element pertaining to the first aspect is used as a pixel, and a plurality of the pixels are arrayed on a single semiconductor chip. In each of the plurality of pixels forming the solid-state image sensor according to the second aspect, a destination of majority carriers being generated in the surface buried region is sequentially controlled to be determined toward any of the plurality of charge-accumulation regions by sequentially and cyclically applying field-control pulses having different phases to the plurality of field-control electrodes, and by sequentially changing depletion potentials of the surface buried region and the plurality of charge-transfer channels.

Advantageous Technical Advantages of Invention

According to the present invention, the photoelectric-conversion element capable of reducing a total measurement time and the solid-state image sensor including the photoelectric-conversion elements can be provided.

BRIEF DESCRIPTION OF DRAWINGS

FIG. 18A is a view illustrating a potential profile of the band edge (bottom) of the conduction band of the photoelectric-conversion element according to the third modification of the first embodiment at the time for exhausting charges ascribable to background light, X-axis is taken from the E-E direction of FIG. 14.

FIG. 18B is a view illustrating a potential profile of the band edge (bottom) of the conduction band of the photoelectric-conversion element according to the third modification of the first embodiment, Y-axis is taken from the F-F direction of FIG. 14.

DESCRIPTION OF EMBODIMENTS

Figure 1:
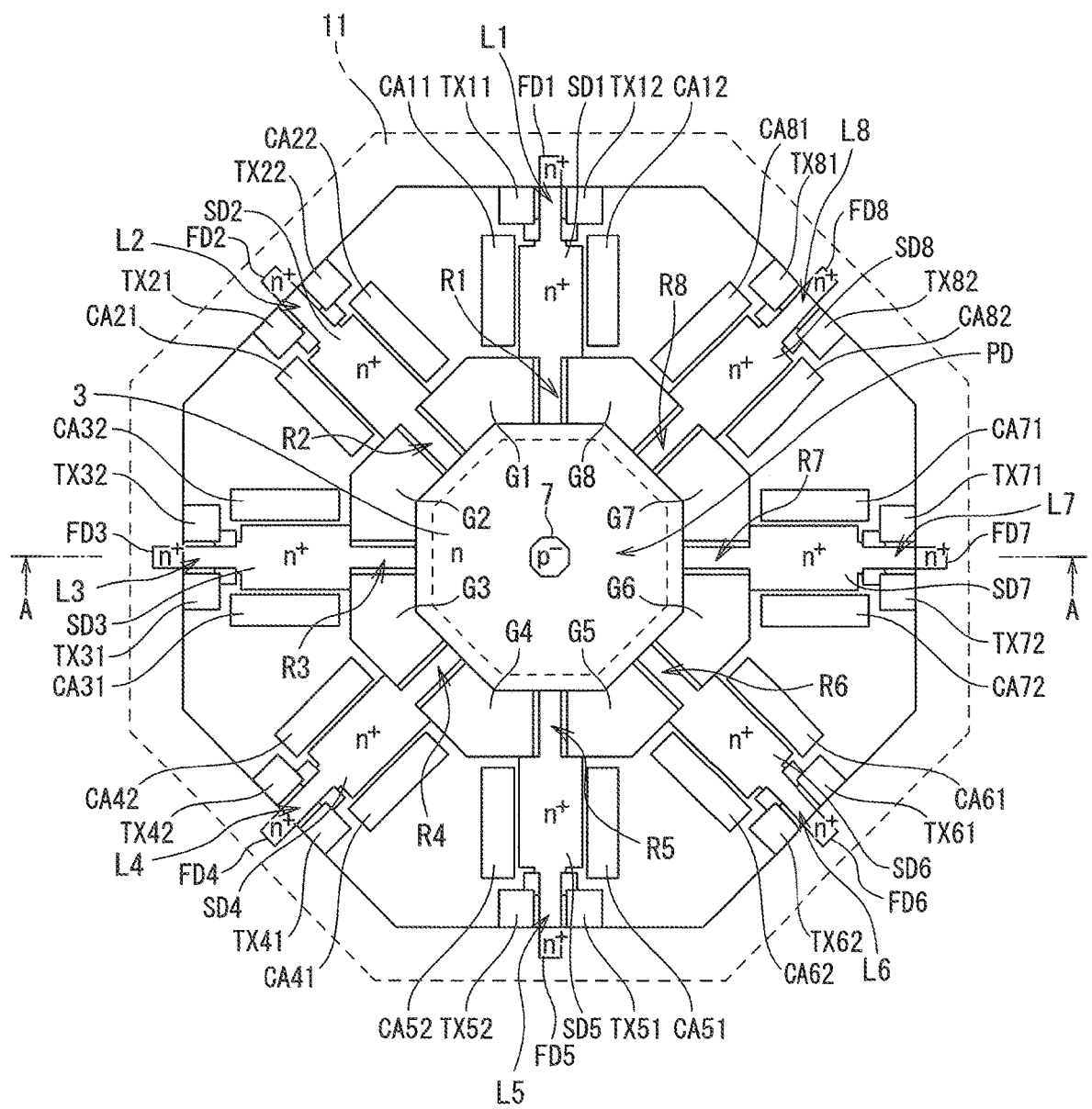
FIG. 1 is a schematic plan view (top view) illustrating an outline of a photoelectric-conversion element according to a first embodiment of the present invention.

Now, with reference to the drawings, first and second embodiments of the present invention are described. In the following description of the drawings, the same or similar portions are provided with the same or similar reference numerals. However, the drawings are schematic, and it should be noted that a relationship of a thickness and a plane dimension, a thickness ratio of the respective layers, and the like are different from the reality. Therefore, a specific thickness and a dimension are required to be determined by considering the following description. Further, needless to say, a dimensional relationship and a ratio in one drawing are partially different from those in the other drawings.

Further, in the first and second embodiments described below, a device and a method for carrying out the technical idea of the present invention are exemplified. The technical idea of the present invention is not limited to materials, shapes, structures, arrangement, and the like of the components described below. Various changes can be added to the technical idea of the present invention within a technical scope defined by claims described in the scope of claims. Further, directions indicating "right and left" and "up and down" in the following description are merely defined for convenience of the description, and do not limit the technical idea of the present invention. Thus, for example, needless to say, when the sheet orientaion is turned by 90 degrees, the "right and left" and the "up and down" are switched to be understood, and when the sheet orientaion is turned by 180 degrees, the "right" and the "left" are switched to the "left" and the "right," respectively.

Further, in the drawing, it is clear to a person skilled in the art that a region and a layer with a symbol "n" or "p" are a member and a component, such as a semiconductor region and a semiconductor layer, formed of a semiconductor. Further, a superscript "+" provided to an upper right side of the symbol "n" and "p" in the drawings indicates that a semiconductor region with the superscript "+" has impurity concentration relatively higher than a semiconductor region without the superscript "+." A superscript "−" provided to an upper right side of the symbol "n" and "p" indicates that a semiconductor region with the superscript "−" has impurity concentration relatively lower than a semiconductor region without the superscript "−." Further, semiconductor regions with the same symbol "n+" do not necessarily indicate to have the same impurity concentration.

First Embodiment

Configuration of Photoelectric-Conversion Element

Figure 2:
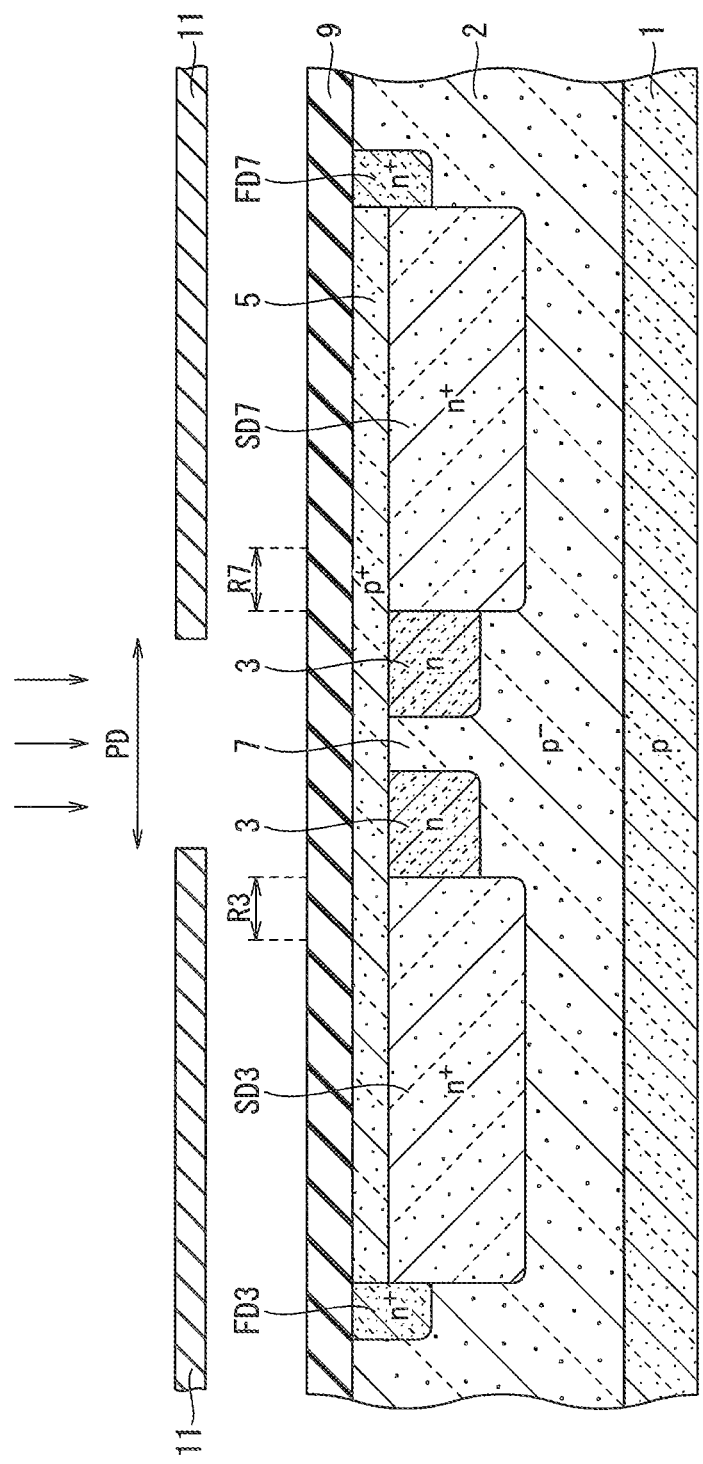
FIG. 2 is a schematic cross-sectional view illustrating an outline structure of the photoelectric-conversion element according the first embodiment, taken from the A-A direction of FIG. 1.

As illustrated in the plan view of FIG. 1, the cross-sectional view of FIG. 2, and the like, a photoelectric-conversion element according to the first embodiment of the present invention includes image-capturing regions (2, 3, 5 and 7), an insulator 9 provided on the image-capturing region (2, 3, 5 and 7), a first charge-accumulation region SD1, a second charge-accumulation region SD2, a third charge-accumulation region SD3, . . . , and an eighth charge-accumulation region SD8 and a first field-control electrode G1, a second field-control electrode G2, a third field-control electrode G3, . . . , and an eighth field-control electrode G8. The image-capturing region (2, 3, 5 and 7) includes a first conductivity type (p-type) element-allocating layer 2, a second conductivity type (n-type) surface buried region 3 buried in a part of a top of the element-allocating layer 2, a p-type potential-hill creating-portion 7 having high impurity concentration, which is provided to a center of the surface buried region 3, and a p-type pinning layer 5 provided so as to be contacted with a surface of the surface buried region 3. The first charge-accumulation region SD1, the second charge-accumulation region SD2, the third charge-accumulation region SD3, . . . , and the eighth charge-accumulation region SD8, which are n-type and have impurity concentration higher than the element-allocating layer 2, are provided away from one another at octagonal positions symmetric with respect to a center position of a light receiving region PD so as to surround the light receiving region PD defined in the center of the image-capturing region (2, 3, 5 and 7), the first field-control electrode G1, the second field-control electrode G2, the third field-control electrode G3, . . . , and the eighth field-control electrode G8 are arranged at the positions surrounding the light receiving region PD on the insulator 9 so as to be paired on both sides of octuple charge-transfer channels R1, R2, R3, . . . , and R8 extending from the center position of the light receiving region PD to the first charge-accumulation region SD1, the second charge-accumulation region SD2, the third charge-accumulation region SD3, . . . , and the eighth charge-accumulation region SD8, respectively.

Each of the octuple charge-transfer channels R1, R2, R3, . . . , and R8 is formed to be sandwiched by adjacent two of field-control electrodes among the octuple field-control electrodes including the first field-control electrode G1, the second field-control electrode G2, the third field-control electrode G3, . . . , and the eighth field-control electrode G8. For example, the first charge-transfer channel R1 position at an uppermost part in FIG. 1 is a region sandwiched by the eighth field-control electrode G8 and the first field-control electrode G1, the second charge-transfer channel R2 on a left side of the first charge-transfer channel R1 in FIG. 1 is a region sandwiched by the first field-control electrode G1 and the second field-control electrode G2. The third charge-transfer channel R3 and the seventh charge-transfer channel R7, which are on the same straight line horizontal in the right-and-left direction in FIG. 1, are exemplified in FIG. 2.

Figure 3:
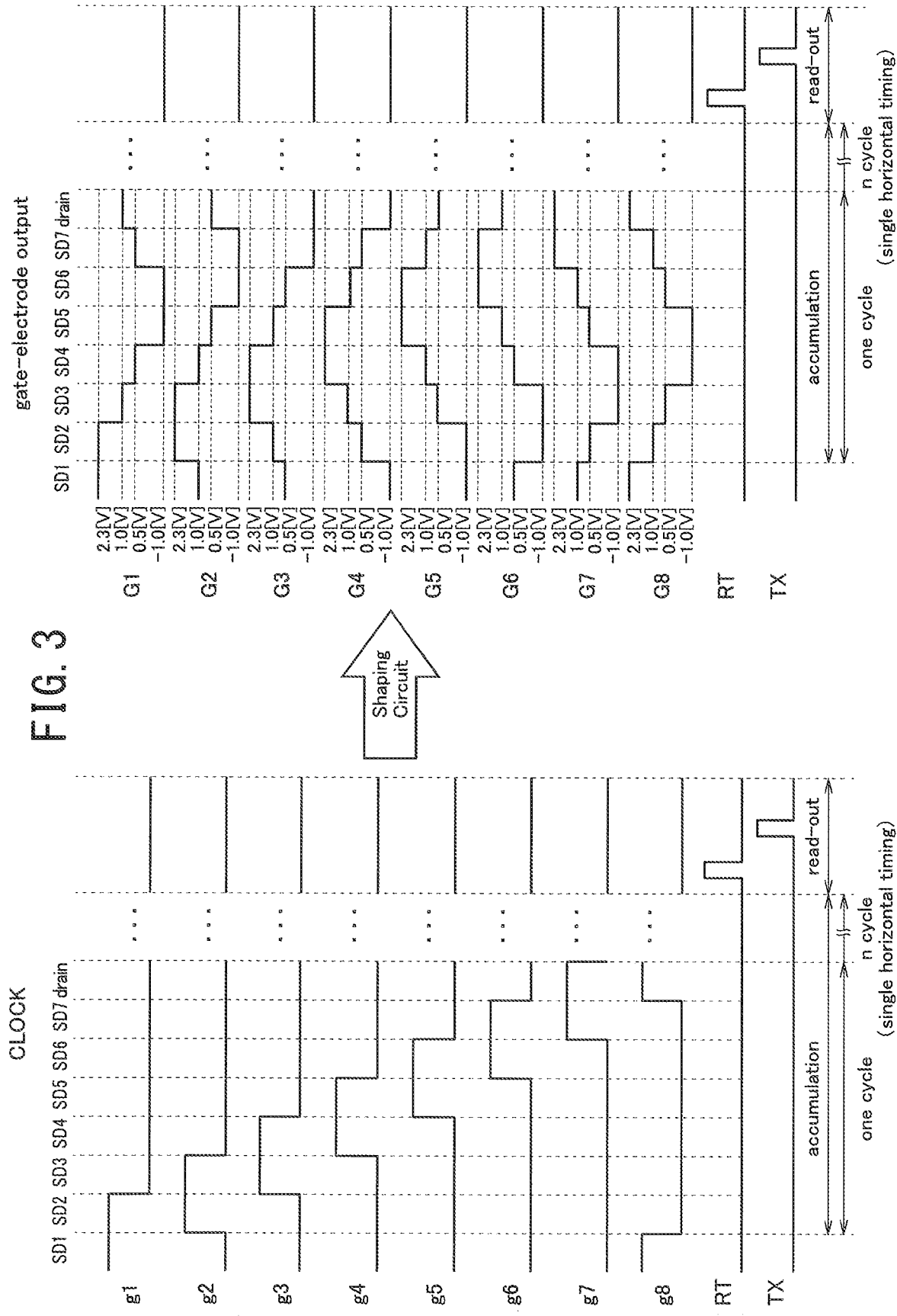
FIG. 3 is a timing view illustrating an operation of the photoelectric-conversion element according to the first embodiment of the present invention.
Figure 6:
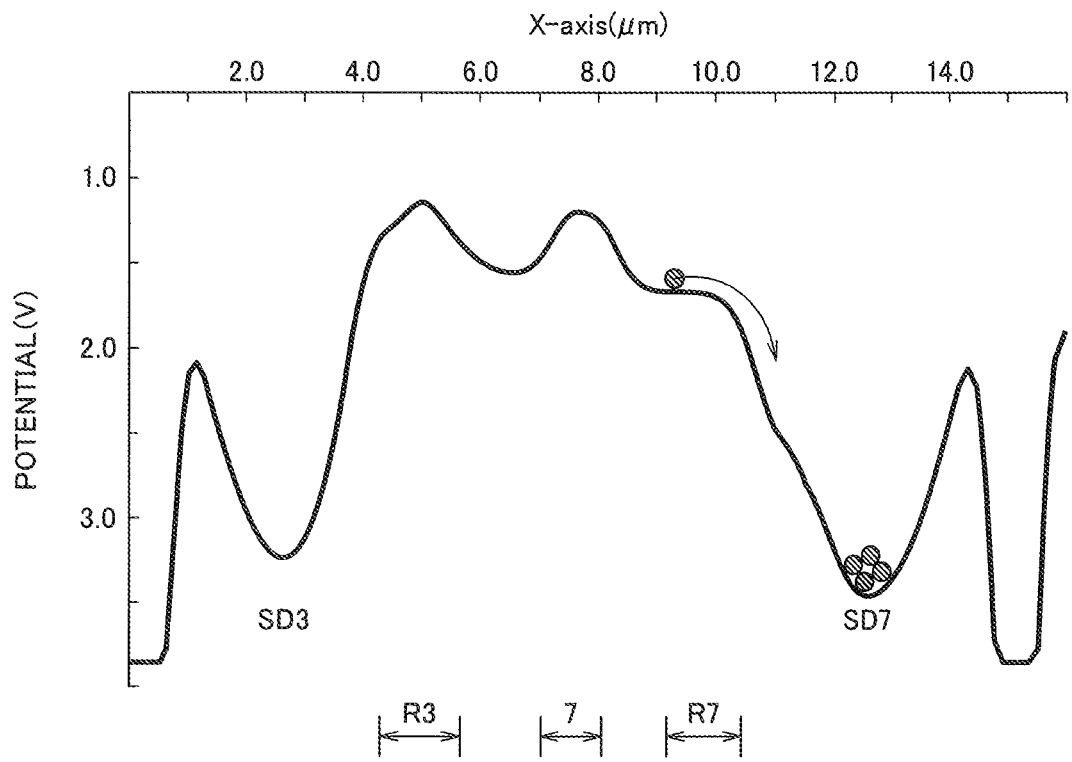
FIG. 6 is a view illustrating a potential profile of a band edge (bottom) of a conduction band of the photoelectric-conversion element according to the first embodiment, X-axis is taken from the B-B direction of FIG. 5.
Figure 7:
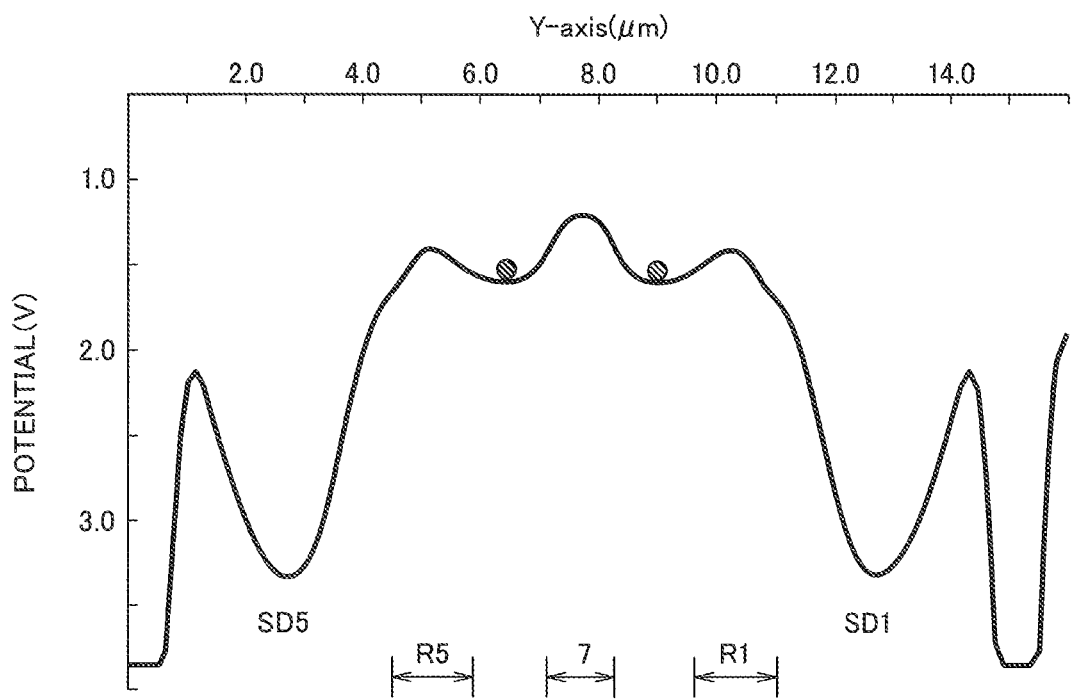
FIG. 7 is a view illustrating a potential profile of the band edge (bottom) of the conduction band of the photoelectric-conversion element according to the first embodiment, Y-axis is taken from the C-C direction of FIG. 5.

The photoelectric-conversion element according to the first embodiment sequentially applies field-control pulses having phases different from each other cyclically as illustrated in FIG. 3 to the first field-control electrode G1, the second field-control electrode G2, the third field-control electrode G3, . . . , and the eighth field-control electrode G8 and sequentially changes a depletion potential of the surface buried region 3. Accordingly, a potential-gradient for transporting charges as illustrated in FIG. 6 and FIG. 7 is sequentially formed to any one of the charge-transfer channels. In this manner, the photoelectric-conversion element controls to sequentially determine a destination of majority carriers generated in the surface buried region 3 to any of the first charge-accumulation region SD1, the second charge-accumulation region SD2, the third charge-accumulation region SD3, . . . , and the eighth charge-accumulation region SD8. That is, the photoelectric-conversion element according to the first embodiment performs charge modulation by causing the first field-control electrode G1, the second field-control electrode G2, the third field-control electrode G3, . . . , and the eighth field-control electrode G8, which are eight gates that perform electric field control by a static induction effect in a direction crossing a charge-transport path, to shift photoelectrons, which are generated in the light receiving region PD having a substantially octagonal shape in a planar pattern, at a high speed through electric field control along the octuple charge-transfer channels R1, R2, R3, . . . , and R8, which extend radially outward from the center of the light receiving region PD.

As apparent from the plan view of FIG. 1, it is preferred that arrangement topology of the first charge-accumulation region SD1, the second charge-accumulation region SD2, the third charge-accumulation region SD3, . . . , and the eighth charge-accumulation region SD8 be an eight-fold rotational symmetry with respect to the center position of the light receiving region PD. However, the arrangement topology is not necessarily required to be an accurate eight-fold rotational symmetry. Each of the first charge-accumulation region SD1, the second charge-accumulation region SD2, the third charge-accumulation region SD3, . . . , and the seventh charge-accumulation region SD7 illustrated in FIG. 1 functions as a signal charge-accumulation region for accumulating the majority carriers generated in the surface buried region 3 as signal charges, and the eighth charge-accumulation region SD8 functions as a charge-exhaust region for exhausting charges ascribable to background light generated in the surface buried region 3 from the backlight.

A first charge read-out region FD1, a second charge read-out region FD2, a third charge read-out region FD3, . . . , and an eighth charge read-out region FD8, which are n-type and have high impurity concentration, are provided in a floating state to outer ends of the first charge-accumulation region SD1, the second charge-accumulation region SD2, the third charge-accumulation region SD3, . . . , and the eighth charge-accumulation region SD8, respectively. Accordingly, septuple output photoelectric-conversion elements are achieved. In the septuple output photoelectric-conversion elements according to the first embodiment, each of the first charge read-out region FD1, the second charge read-out region FD2, the third charge read-out region FD3, . . . , and the seventh charge read-out region FD7 reads out the majority carriers generated in the surface buried region 3 as signal charges, and the eighth charge read-out region FD8 functions as a charge-exhaust region (drain region) for exhausting charges ascribable to background light generated in the surface buried region 3 from the backlight.

In the photoelectric-conversion element according to the first embodiment, on an inner side of the insulator 9 on both the sides of the first charge-accumulation region SD1, the second charge-accumulation region SD2, the third charge-accumulation region SD3, . . . , and the eighth charge-accumulation region SD8, there are provided auxiliary electrodes CA11, CA21, CA31, . . . , CA81, CA12, CA22, CA32, . . . , and CA82 to which an electric field for promoting accumulation of charges to the first charge-accumulation region SD1, the second charge-accumulation region SD2, the third charge-accumulation region SD3, . . . , and the eighth charge-accumulation region SD8. However, the auxiliary electrodes CA11, CA21, CA31, . . . , CA81, CA12, CA22, CA32, . . . , and CA82 may be omitted.

As illustrated in FIG. 1, in the photoelectric-conversion element according to the first embodiment, the first charge-accumulation region SD1, eight n-type charge read-out channels L1, L2, L3, . . . , and L8 are deployed, extending from the second charge-accumulation region SD2, the third charge-accumulation region SD3, . . . , and the eighth charge-accumulation region SD8 to the corresponding first charge read-out region FD1, the corresponding second charge read-out region FD2, the corresponding third charge read-out region FD3, . . . , and the corresponding eighth charge read-out region FD8, respectively. On outer sides of the auxiliary electrodes CA11, CA21, CA31, . . . , CA81, CA12, CA22, CA32, . . . , and CA82, and on both sides of the plurality of charge read-out channels L1, L2, L3, . . . , and L8, transfer electrodes. TX11, TX21, TX31, . . . , TX81, TX12, TX22, TX32, . . . , and TX82 for performing the LEF-control are arranged to be paired.

Charge-transfer pulses for transferring the majority carriers from the first charge-accumulation region SD1, the second charge-accumulation region SD2, the third charge-accumulation region SD3, . . . , and the eighth charge-accumulation region SD8 to the corresponding first charge read-out region FD1, the corresponding second charge read-out region FD2, the corresponding third charge read-out region FD3, . . . , and the corresponding eighth charge read-out region FD8 are applied to the transfer electrodes TX11, TX21, TX31, . . . , TX81, TX12, TX22, TX32, . . . , and TX82, at the same time. An electric field for promoting transfer of charges to the first charge read-out region FD1, the second charge read-out region FD2, the third charge read-out region FD3, . . . , and the eighth charge read-out region FD8 is applied.

As illustrated in FIG. 1, FIG. 2, and the like, a shielding plate 11 is further provided above the insulator 9. Through an opening of the shielding plate 11, a planar pattern of the light receiving region PD is defined in the center of the image-capturing region (2, 3, 5 and 7), and light is selectively emitted to the light receiving region PD. In the plan view of FIG. 1, in the center of the image-capturing region (2, 3, 5 and 7), the light receiving region PD being the opening of the shielding plate 11 is defined. There is exemplified a case where the third charge-transfer channel R3 and the seventh charge-transfer channel R7 are set so as to be continuous to the light receiving region PD in a horizontal direction (X direction) in the image-capturing region (2, 3, 5 and 7) covered with the shielding plate 11. Similarly, the first charge-transfer channel R1 and the fifth charge-transfer channel R5 are set so as to be continuous to the light receiving region PD along a vertical direction (Y direction) orthogonal to the horizontal charge-transfer channels in the image-capturing region (2, 3, 5 and 7) below the shielding plate 11.

Further, when it is assumed that the X direction and the Y direction build a rectangular coordinate system, at a position on a straight line in a 45-degree direction that satisfies y=x, the fourth charge-transfer channel R4 and the eighth charge-transfer channel R8 are set so as to be continuous to the light receiving region PD. At a position on a straight line in a −45-degree direction that satisfies y=⁻x, the second charge-transfer channel R2, and the sixth charge-transfer channel R6 are set so as to be continuous to the light receiving region PD. Thus, in the plan view of FIG. 1, the octuple charge-transfer channels R1, R2, R3, . . . , and R8, each of which extends radially outward from the light receiving region PD to establish an angle of 45 degrees between center axis of the adjacent charge-transfer channels are defined. Further, to the eight ends of the first charge-transfer channel R1, the second charge-transfer channel R2, the third charge-transfer channel R3, . . . , and the eighth charge-transfer channel R8, the first charge-accumulation region SD1, the second charge-accumulation region SD2, the third charge-accumulation region SD3, . . . , and the eighth charge-accumulation region SD8 are connected, respectively.

Operation of Photoelectric-Conversion Element

The field-control electrodes, which are positioned symmetrically with respect to a desired charge-transport path, among the first field-control electrode G1, the second field-control electrode G2, the third field-control electrode G3, . . . , and the eighth field-control electrode G8 are paired, and gate signals of the same magnitude are applied to the desired paired field-control electrodes. For example, when a signal charge generated in the light receiving region PD are intended to be transported to the seventh charge read-out region FD7 via the seventh charge-accumulation region SD7 illustrated in FIG. 5 along the seventh charge-transfer channel R7, a first control-electrode pair (G2, and G3), a second control-electrode pair (G1 and G4), a third control-electrode pair (G8 and G5), and fourth control-electrode pair (G7 and G6) are defined with respect to the line B-B being a center axis of the seventh charge-transfer channel R7 as a symmetric axis, and voltages having a different level from each other are sequentially applied to the first control-electrode pair (G2, and G3), the second control-electrode pair (G1 and G4), the third control-electrode pair (G8 and G5), and the fourth control-electrode pair (G7 and G6). Note that, a maximum width of the regular octagonal shape of the light receiving region PD is approximately 4.5 micrometers.

Figure 5:
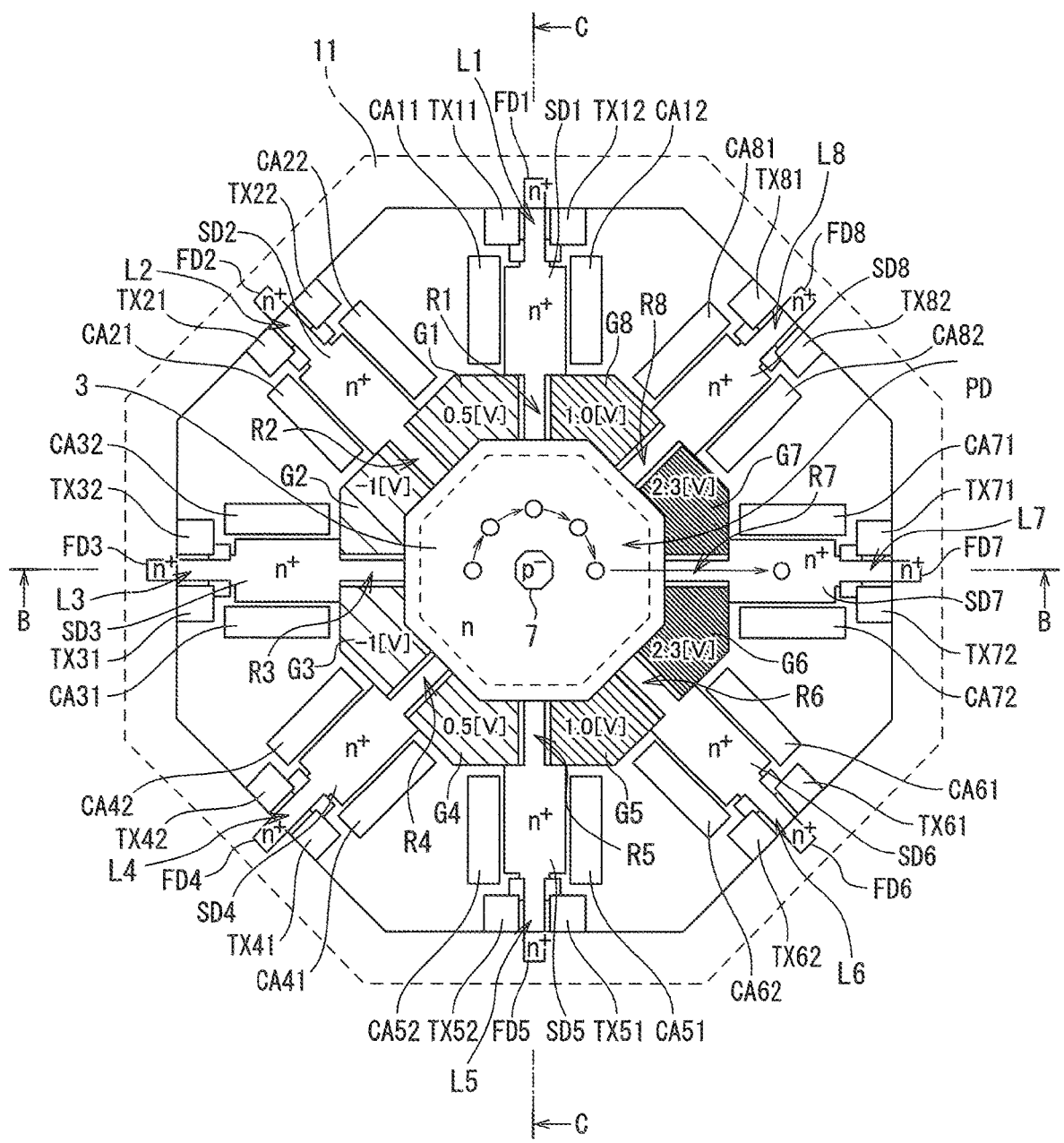
FIG. 5 is a schematic plan view (top view) illustrating the operation of the photoelectric-conversion element according to the first embodiment of the present invention.

In FIG. 5, there is exemplified a state in which a gate signal having a first potential level L (−1 volt) is applied to the first control-electrode pair (G2, and G3). In this state, a gate signal having a second potential level M (0.5 volt) higher than the first potential level L is applied to the second control-electrode pair (G1 and G4). A third potential level H (1.0 volt) higher than the second potential level M is applied to the third control-electrode pair (G8 and G5). A gate signal having a fourth potential level V (2.3 volts) higher than the third potential level H is applied to the fourth control-electrode pair (G7 and G6).

That is, the quadruple control-electrode pairs are formed of the octuple field-control electrodes in an upper and lower symmetry so that the potential to be applied becomes higher sequentially from the first control-electrode pair (G2, and G3) to the fourth control-electrode pair (G7 and G6) being a terminal side in the arrangement of the first control-electrode pair (G2, and G3), the second control-electrode pair (G1 and G4), the third control-electrode pair (G8 and G5), and the fourth control-electrode pair (G7 and G6) as is illustrated in FIG. 5 and the voltages to be applied to the quadruple control-electrode pairs are controlled to have levels different from each other.

The different electric-control voltages generated from a first field-control pulse g1, a second field-control pulse g2, a third field-control pulse g3, . . . , and an eighth field-control pulse g8 in a shaping circuit are applied to the first control-electrode pair (G2, and G3), the second control-electrode pair (G1 and G4), the third control-electrode pair (G8 and G5), and the fourth control-electrode pair (G7 and G6), respectively, in the case where the seventh charge-transfer channel R7 is used. By a lateral static induction effect, the depletion potentials of the light receiving region PD and the charge-transfer channels are changed. Accordingly, the potential-gradients different from each other depending on the areas are established as illustrated in FIG. 6 and FIG. 7, and the moving directions of the signal charges to be transported along the valley of the potentials in the image-capturing region (2, 3, 5 and 7) are sequentially controlled.

As illustrated in FIG. 5, the signal charges generated in the light receiving region PD are transported along the valley of the potentials formed so as to surround the potential-hill creating-portion 7 having a high potential with respect to the electrons, and reach an entrance of the seventh charge-transfer channel R7 defined between the fourth control-electrode pair (G7 and G6). Further, the signal charges generated in the light receiving region PD are transported to the seventh charge-accumulation region SD7 via the seventh charge-transfer channel R7. At this time, as illustrated in FIG. 6, the potential with respect to the electrons of the third charge-transfer channel R3 defined between the first control-electrode pair (G2, and G3) is shallow, and a potential-gradient, descending smoothly so that the potential with respect to the electrons on the seventh charge-transfer channel R7 side is the deepest, is established by lateral static induction effect. Further, by setting the impurity concentration of the seventh charge-accumulation region SD7 to be high, as illustrated in FIG. 6, a potential-gradient, descending from the seventh charge-transfer channel R7 to the seventh charge-accumulation region SD7 is established.

Now, let's consider a case in which the voltages illustrated in FIG. 3 are applied to the arrangement of the quadruple control-electrode pairs. FIG. 6 is a view for illustrating a potential profile in a state in which a gate portion to the third charge-accumulation region SD3, which is continuous to the third charge-transfer channel R3 is closed and another gate portion to the seventh charge-accumulation region SD7 is opened. In FIG. 6, the potential with respect to the electrons of the third charge-transfer channel R3 is the shallowest.

Meanwhile, as illustrated in FIG. 7, the potentials with respect to the electrons of the fifth charge-transfer channel R5 and the first charge-transfer channel R1 are deeper than the potential of the third charge-transfer channel R3, but are shallower than the potential of the seventh charge-transfer channel R7. In FIG. 6 and FIG. 7, a plurality of valleys of the potential is established, respectively, between the third charge-transfer channel R3 and the potential-hill creating-portion 7, between the fifth charge-transfer channel R5 and the potential-hill creating-portion 7, and between the first charge-transfer channel R1 and the potential-hill creating-portion 7 by lateral static induction effect, and the valleys of the potentials are arranged to surround the potential-hill creating-portion 7. A first potential valley, which has a potential-gradient smoothly extending from an entrance of the third charge-transfer channel R3 to the entrance of the seventh charge-transfer channel R7 via an entrance of the second charge-transfer channel R2, an entrance of the first charge-transfer channel R1, and an entrance of the eighth charge-transfer channel R8 is established as a route (charge-transport path) on the upper side of the light receiving region PD by lateral static induction effect. Although the illustration is omitted in FIG. 5, a second potential valley, which has a potential-gradient smoothly extending from an entrance of the third charge-transfer channel R3 to the entrance of the seventh charge-transfer channel R7 via an entrance of the fourth charge-transfer channel R4, an entrance of the fifth charge-transfer channel R5 and an entrance of the sixth charge-transfer channel R6 is established as a route (charge-transport path) on the lower side of the light receiving region PD in a symmetrical topology with respect to the upper route by lateral static induction effect. Further, in this state, a potential barrier for blocking the transport of the charges is established by lateral static induction effect to each of the first charge-transfer channel R1, the second charge-transfer channel R2, the third charge-transfer channel R3, the fourth charge-transfer channel R4, the fifth charge-transfer channel R5, the sixth charge-transfer channel R6, and the eighth charge-transfer channel R8.

That is, a gate portion to the fifth charge-accumulation region SD5, which is set for the fifth charge-transfer channel R5 and a gate portion to the first charge-accumulation region SD1, which is set for the first charge-transfer channel R1, are closed. Similarly, for example, when the fifth charge-transfer channel R5 in the lowest side in FIG. 5 is used to transport the charges to the fifth charge-accumulation region SD5 and the fifth charge read-out region FD5, the first control-electrode pair (G8 and G1), the second control-electrode pair (G2, and G7), the third control-electrode pair (G3 and G6), and the fourth control-electrode pair (G4 and G5) are newly defined along the line C-C forming the center axis of the fifth charge-transfer channel R5 and voltages having predetermined levels are distributed to quadruple control-electrode pairs of the first control-electrode pair (G8 and G1), the second control-electrode pair (G2, and G7), the third control-electrode pair (G3 and G6), and the fourth control-electrode pair (G4 and G5).

When the charges are scheduled to be transported to the fifth charge read-out region FD5, the voltages to be applied to the quadruple control-electrode pairs are controlled so that the potential to be applied becomes higher sequentially from the first control-electrode pair (G8 and G1) having the shallowest potential valley to the fourth control-electrode pair (G4 and G5), which is disposed at the terminal side of the path. In this manner, the potential valley capable of transporting the signal charges to the fifth charge read-out region FD5 can be set by lateral static induction effect.

Although the illustration is omitted, in order to efficiently change the depletion potentials caused by lateral static induction effect, a part of the insulator 9, which is directly under the first field-control electrode G1, the second field-control electrode G2, the third field-control electrode G3, . . . , and the eighth field-control electrode G8, has a thickness smaller than the insulators allocated at other sites or areas, and functions as a so-called "gate insulator."

Figure 24:
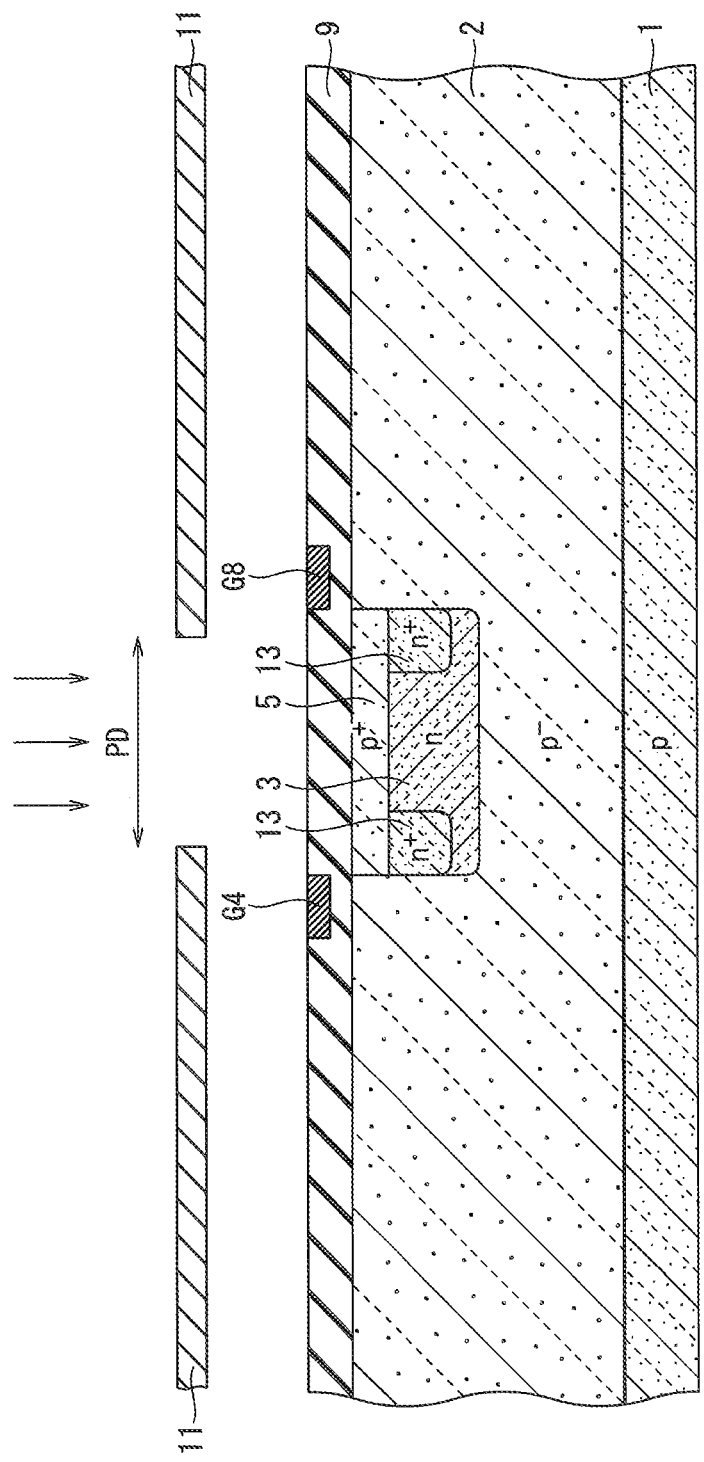
FIG. 24 is a schematic cross-sectional view illustrating an outline structure of a photoelectric element according to the second embodiment, taken from the I-I direction of FIG. 22.

In reality, as illustrated in FIG. 24, the first field-control electrode G1, the second field-control electrode G2, the third field-control electrode G3, . . . , the eighth field-control electrode G8 and the like are buried inside the insulator 9, and portions directly under the first field-control electrode G1, the second field-control electrode G2, the third field-control electrode G3, . . . , and the eighth field-control electrode G8 has a thickness smaller than those of the other sites or portions.

As illustrated in FIG. 2, in the image-capturing region (2, 3, 5 and 7) illustrated in FIG. 1, the p-type element-allocating layer 2, and the n-type surface buried region 3 buried in the upper portion of the element-allocating layer 2 implement a p-n junction photodiode, and the electrons, or the majority carriers generated in the surface buried region 3 by photoelectric conversion in the p-n junction photodiode are transported in the surface buried region 3 as signal charges. More specifically, in FIG. 1, a part of the p-type element-allocating layer 2, and a part of the n-type surface buried region 3, which are exposed in an aperture indicated with the broken line defined by the shielding plate 11, implement a buried photodiode. In FIG. 1, an inner contour, or an edge of the opening, which defines an aperture of the shielding plate 11, are indicated with the octagonal broken lines. The p-type pinning layer 5 is provided so as to be contacted with the surface of the surface buried region 3. As illustrated in FIG. 2, because the image-capturing region (2, 3, 5 and 7) having a triple-level structure is further laminated on a p-type semiconductor substrate 1, the photoelectric-conversion element according to the first embodiment exemplifies an actual case, in which a quadruple-level structure is established in the sectional structure.

In FIG. 2, a structure in which the element-allocating layer 2 is laminated on the p-type semiconductor substrate 1 by, for example, epitaxial growth is exemplified. However, the element-allocating layer 2 may be provided on an n-type semiconductor substrate 1. Further, a structure having quintuple or more levels, such that other level(s) are included between the element-allocating layer 2, and the semiconductor substrate 1, may be employed. In the pinning layer 5, concentration of holes, which are opposite conductivity type carriers to the signal charges, are changed by controlling the charge-transport path in the periphery of the light receiving region PD and the depletion potentials of the octuple charge-transfer channels R1, R2, R3, . . . , and R8 by a static induction effect caused by the voltages to be applied to the first field-control electrode G1, the second field-control electrode G2, the third field-control electrode G3, . . . , and the eighth field-control electrode G8.

Although the insulator 9 is not illustrated in the plan view of FIG. 1, it can be understood from FIG. 2 that the first field-control electrode G1, the second field-control electrode G2, the third field-control electrode G3, . . . , and the eighth field-control electrode G8 are arranged on the insulator 9. The octuple charge-transfer channels are defined in each of the gaps, which are allocated respectively in between the neighbouring pairs of the first field-control electrode G1, the second field-control electrode G2, the third field-control electrode G3, . . . , and the eighth field-control electrode G8.

The first field-control electrode G1, the second field-control electrode G2, the third field-control electrode G3, ..., and the eighth field-control electrode G8 sandwich the surface buried region 3, which serve as the octuple charge-transfer channels R1, R2, R3, ..., and R8 on a planar pattern. On the planar pattern, each of the neighbouring pairs of the field-control electrode G1, the second field-control electrode G2, the third field-control electrode G3, ..., and the eighth field-control electrode G8 implement a topology, in which the corresponding field-control electrode G1, G2, G3, ..., and G8 face each other along a direction perpendicular to the transport direction of the signal charges. However, in the cross-sectional view, the first field-control electrode G1, the second field-control electrode G2, the third field-control electrode G3, ..., and the eighth field-control electrode G8 are arranged on the image-capturing region (2, 3, 5 and 7) through intermediation of the insulator 9.

In FIG. 1, the first field-control electrode G1, the second field-control electrode G2, the third field-control electrode G3, ..., and the eighth field-control electrode G8 are arranged to surround a buried photodiode region, which serves as the light receiving region PD directly below the aperture of the shielding plate 11. As illustrated in FIG. 3, when the potentials to be applied to the first field-control electrode G1, the second field-control electrode G2, the third field-control electrode G3, ..., and the eighth field-control electrode G8 are changed, the depletion potentials of the surface buried region 3 implementing the light receiving region PD are controlled so as to establish the potential valleys, which facilitate the charge-transport paths, by lateral static induction effect. Further, the depletion potentials of the octuple charge-transfer channels R1, R2, R3, ..., and R8 can be controlled.

Although the illustration is omitted, a gate electrode of a first signal read-out transistor (amplification transistor) is connected to the first charge read-out region FD1 through a contact window provided in the insulator 9. A drain electrode of the first signal read-out transistor (amplification transistor) is connected to a power supply VDD, and a source electrode is connected to a drain electrode of a first switching transistor SEL1 for pixel selection. The source electrode of the first switching transistor SEL1 is connected to a vertical signal line, and a horizontal-line selection control signal SL(i) is transmitted from a vertical shift register 23 illustrated in FIG. 9 to the gate electrode.

By setting the selection control signal SL(i) to be a high(H)level, the first switching transistor SEL1 is energized, and a current corresponding to the potential of the first charge read-out region FD1, which is amplified by the first signal read-out transistor, flows to the vertical signal line. Further, a source electrode of a first reset transistor RT1 is connected to the first charge read-out region FD1. A drain electrode of the first reset transistor RT1 is connected to the power supply VDD, and a reset signal RT1(i) is transmitted from the vertical shift register 23 illustrated in FIG. 8 to the gate electrode of the first reset transistor RT1. By setting the reset signal RT1(i) to a high (H) level, the first reset transistor RT1 exhausts the charges accumulated in the first charge read-out region FD1, resetting the first charge read-out region FD1.

Meanwhile, similarly to the first charge read-out region FD1, a second signal read-out transistor, a third signal read-out transistor, a fourth signal read-out transistor, ..., and a seventh signal read-out transistor, which are equivalent to the first signal read-out transistor (amplification transistor), are connected to the second charge read-out region FD2, the third charge read-out region FD3, the fourth charge read-out region FD4, ..., and the seventh charge read-out region FD7, respectively. Further, a second switching transistor SEL2, a third switching transistor SEL3, a fourth switching transistor SEL4, ..., and a seventh switching transistor SEL7, which are equivalent to the first switching transistor SEL1, and a second reset transistor RT2, a third reset transistor RT3, a fourth reset transistor RT4, ..., and a seventh reset transistor RT7, which are equivalent to the first reset transistor RT1, are connected to the second charge read-out region FD2, the third charge read-out region FD3, the fourth charge read-out region FD4, ..., and the seventh charge read-out region FD7, respectively.

In order to freely control the transport of the electrons generated in the light receiving region PD by the voltages applied to the first field-control electrode G1, the second field-control electrode G2, the third field-control electrode G3, ..., and the eighth field-control electrode G8, the depletion potentials of the charge-transport path and the charge transfer channel, or the depletion potentials in the buried diode, which are sandwiched in between the facing field-control electrode-pair, shall be largely changed by the voltage applied to the control-electrode pair. For efficiently control the change of the depletion potentials, the impurity concentration of the substrate shall be set to be small, and furthermore, the impurity concentration of the pinning layer 5 for the hole-pinning of the surface shall be set to be relatively small. In principle, the explanation of the physical behavior including the change of carrier density by the field-control electrodes and the change of carrier density in the pinning layer of the photoelectric-conversion element is equivalent to the description given representatively with "the first field-control electrode-pair 41a and 41b", which is recited in PTL 2. Thus, the overlapping explanation of the physical behavior is omitted.

In a normal solid-state image sensor, the pinning layer is a layer for suppressing generation of the carriers, or alternatively, for suppressing capture of the signal carriers at the surface in a dark condition. Then, in the earlier technology, the pinning layer has been used as a preferable layer for reducing the dark current and for eliminating the capture of the signal carrier. However, in addition to such well-known functions, the pinning layer 5 in the photoelectric-conversion element according to the first embodiment is an important layer for largely changing the depletion potentials of the surface buried region 3 by the voltages applied to the first field-control electrode G1, the second field-control electrode G2, the third field-control electrode G3, ..., and the eighth field-control electrode G8.

By applying the gate voltages having different voltage levels to the quadruple control-electrode pairs illustrated in FIG. 5, a charge-modulation element and the like can be achieved. In such charge-modulation element and the like, the carriers (electrons) generated in the buried photodiode region are transported at a high speed, and are distributed to the desired charge-transfer channels in the octuple directions, each of the directions extends from the light receiving region PD, when the carriers are generated by the light entering through the opening (aperture) of the shielding plate 11.

That is, in the photoelectric-conversion element according to the first embodiment, as illustrated in FIG. 5, the first charge-accumulation region SD1, the second charge-accumulation region SD2, the third charge-accumulation region SD3, ..., and the seventh charge-accumulation region SD7 are provided to the ends of the septuple charge-transfer channels among the octuple charge-transfer channels R1, R2, R3, . . . , and R8. Each of the charge-transfer channels R1, R2, R3, . . . , and R8 has a center axis, which is mutually rotated by 45 degrees. By applying the gate voltages having the first to the fourth voltage levels different from each other to the first field-control electrode G1, the second field-control electrode G2, the third field-control electrode G3, . . . , and the eighth field-control electrode G8, a TOF range sensor can be achieved. In the TOF range sensor, the signal charges of the carriers (electrons) generated in the buried photodiode region, which is positioned on the starting point side of the septuple charge-transfer channels, are transported and distributed at a high speed by the field-control voltages applied to the first field-control electrode G1, the second field-control electrode G2, the third field-control electrode G3, . . . , and the eighth field-control electrode G8.

Further, as illustrated in FIG. 5, the charge-exhaust region SD8 is provided at an end of one charge-transfer channel, which is remaining from the septuple charge-transfer channels among the octuple charge-transfer channels R1, R2, R3, . . . , and R8. Thus, as illustrated in FIG. 3, by applying the gate voltages having the first to fourth potential levels different from each other to the first field-control electrode G1, the second field-control electrode G2, the third field-control electrode G3, . . . , and the eighth field-control electrode G8, the charges ascribable to background-light of the backlight caused in the buried photodiode region are transported at a high speed to the entrance of the remaining one charge-transfer channel, and the charges ascribable to background-light can be drawn out to the charge-exhaust region SD8.

The gate electrode of the first signal read-out transistor (amplification transistor) is connected to the first charge read-out region FD1. Thus, the output amplified by the first signal read-out transistor (amplification transistor) is fed to the outside through the first switching transistor SEL1 by the voltage corresponding to the charge amount, the charge amount has been transported to the first charge read-out region FD1. Similarly, the gate electrode of the second signal read-out transistor (amplification transistor) is connected to the second charge read-out region FD2. Thus, the output amplified by the second single read-out transistor (amplification transistor) is fed to the outside through the second switching resistor by the voltage corresponding to the charge amount, which has been transported to the second charge read-out region FD2.

For example, in the application to the TOF range sensor, light may be repeatedly emitted as pulse signals to a target from a light source provided to the TOF range sensor, and a delay time Td required for reciprocation of the light reflected by the target may be measured. That is, in the application to the TOF range sensor, as described above, the operation is synchronized with a repeating cycle of the optical pulse of the output light. In the operation, the field-control voltages different from each other generated in the shaping circuit from the first field-control pulse g1, the second field-control pulse g2, the third field-control pulse g3, . . . , and the eighth field-control pulse g8, which have phases different from each other as illustrated in FIG. 3, are sequentially applied to the first field-control electrode G1, the second field-control electrode G2, the third field-control electrode G3, . . . , and the eighth field-control electrode G8. The operation is cyclically repeated, and the delay time Td is measured. As for the measurement of the delay time Td, the principle substantially the same as the scheme of "the measurement of the delay time Td" in PTL 2 can be adopted.

The photoelectric-conversion element according to the first embodiment is operated through use of pulse light having a relatively short duty cycle. As illustrated in FIG. 3, during a period in which pulses of arrival light are received to accumulate charges modulated by the photoelectric-conversion element, the first field-control pulse g1, the second field-control pulse g2, the third field-control pulse g3, . . . , and the eighth field-control pulse g8 are shaped in the shaping circuit, and the octupul gate signals having the quadruple output levels including the first potential level L, the second potential level M, the third potential level H, and the fourth potential level V are generated and applied cyclically as illustrated in FIG. 3, thereby performing the operation.

Figure 4:
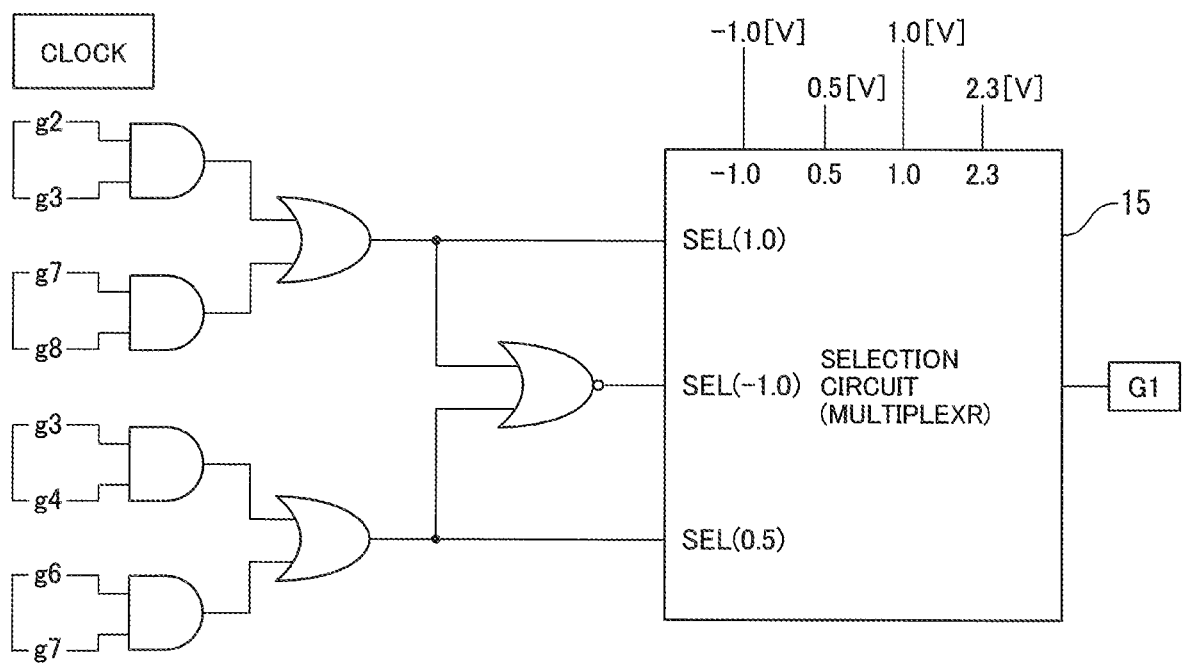
FIG. 4 is a timing view illustrating a circuit for shaping a gate signal of the photoelectric-conversion element according to the first embodiment of the present invention.

The signals having the quadruple output levels can be obtained by, for example, combining logic circuits illustrated in FIG. 4. In FIG. 4, among the first field-control pulse g1, the second field-control pulse g2, the third field-control pulse g3, . . . , and the eighth field-control pulse g8 from a clock, the second field-control pulse g2, and the third field-control pulse g3, the seventh field-control pulse g7 and the eighth field-control pulse g8, the third field-control pulse g3 and the fourth field-control pulse g4, and the sixth field-control pulse g6 and the seventh field-control pulse g7 are paired. The input from the respective pairs is applied to four double-input AND circuits. Further, as illustrated in FIG. 4, the output from the upper two double-input AND circuits is applied to a first double-input OR circuit arranged on the upper side, and the output from the lower two double-input AND circuits is applied to a second double-input OR circuit arranged on the lower side. Then, the output from the two double-input OR circuit is applied to a NOR circuit. Sequentially, the output from the two double-input OR circuit is directly provided to double 1.0-volt input terminals of a selection circuit 15 and the output from the NOR circuit is simultaneously transferred to a −1.0-volt input terminal of the selection circuit 15, thereby being subjected to waveform shaping. Through the selection circuit 15 illustrated in FIG. 4, the gate signals to be applied to the first field-control electrode G1 can be generated. The gate signals to be applied to the second field-control electrode G2, the third field-control electrode G3, the fourth field-control electrode G4, . . . , and the eighth field-control electrode G8, which are illustrated in FIG. 3, can be generated by a similar configuration of similar logic circuits.

As described above, as compared to the case where the MOS structure of the earlier technology is used to control the potential just under the gate electrodes in the vertical direction, the photoelectric-conversion element according to the first embodiment uses the scheme of the electric field control by the static induction effect, which occurs in the direction orthogonal to the charge-transfer channels. Thus, the electric field is maintained substantially constant over the long charge-transfer channels, and the signal charges are transported at a high speed while maintaining symmetry. Further, in the photoelectric-conversion element according to the first embodiment, the light receiving region PD having a substantially octagonal shape in a planar pattern is provided, and the octuple charge-transfer channels R1, R2, R3, . . . , and R8, which have the center axes extending radially from the center of the light receiving region PD, are delineated. The octuple charge-transfer channels R1, R2, R3, . . . , and R8 are defined to have the same shape in a symmetric manner. Thus, a total measurement time can be shortened. In addition, the eight-tap LEF-control photoelectric-conversion element capable of achieving both the large light receiving region PD and the high-speed transfer of the charges can be provided.

As the light receiving region PD can be increased in size as described above, sensitivity can be improved, and fluorescence lifetime can be measured at a high accuracy. Further, even in the case of the same fluorescence emission as the earlier technology, the measurement time can be shortened when the improved sensitivity contributes to reduce the cumulative number. Moreover, with the charge transfer at a higher speed, the time resolution of fluorescence lifetime can be improved, and hence the measurement of fluorescence lifetime can be performed at a higher speed and at a higher accuracy. That is, when the photoelectric-conversion element according to the first embodiment is applied to the TOF range sensor, the charge-transfer channels can be increased in length as compared to the CMOS-type TOF range image sensor including the earlier technology buried photodiode. Thus, a substantial opening ratio of the aperture is increased, thereby improving the sensitivity.

Further, in a configuration such that the MOS structure of the earlier technology is used to control the potentials just under the gate electrodes in the vertical direction against to the principal surface of the semiconductor chip, noise and dark current are caused by interface defects and interface states, at an interface between the gate silicon oxide layer and the silicon surface. However, in the photoelectric-conversion element according to the first embodiment, because the electric field is control by the lateral static induction effect, the problem of the noise and the dark current caused by the interface defects and the interface states in the interface between the gate silicon oxide layer and the silicon surface and the problem of reduction in transport speed can be avoided.

Further, in the photoelectric-conversion element according to the first embodiment, the signal charges are sequentially distributed and transported at a high speed to the first charge-accumulation region SD1, the second charge-accumulation region SD2, the third charge-accumulation region SD3, . . . , and the seventh charge-accumulation region SD7, which are positioned at the ends of the septuple charge-transfer channels among the octuple charge-transfer channels R1, R2, R3, . . . , and R8, each of which extends radially from the center position of the light receiving region PD, and the charges ascribable to background-light of the backlight can be exhausted to the charge-exhaust region positioned at the end of the one of the charge-transport paths, which is a remaining path from the eight paths. Thus, in addition to the application toward the TOF range sensor, the present invention can be applied to observation of a physical phenomenon repeated in an extremely short time period. For example, when the photoelectric-conversion element according to the first embodiment is applied to an element for measuring a lifetime of a fluorescent substance, the measurement can be performed at a higher accuracy because the signal charges are transported at a high speed, while the electric field is maintained substantially constant over the long charge-transfer channels.

Solid-State Image Sensor

The photoelectric-conversion element according to the first embodiment is applicable to a structure of a pixel $X_{ij}$, each of which is arrayed in a solid-state image sensor, or a TOF range image sensor, and the application to the pixel $X_{ij}$ of the solid-state image sensor enables the signal charges to be transferred in the respective pixels $X_{ij}$ at a high speed.

Figure 8:
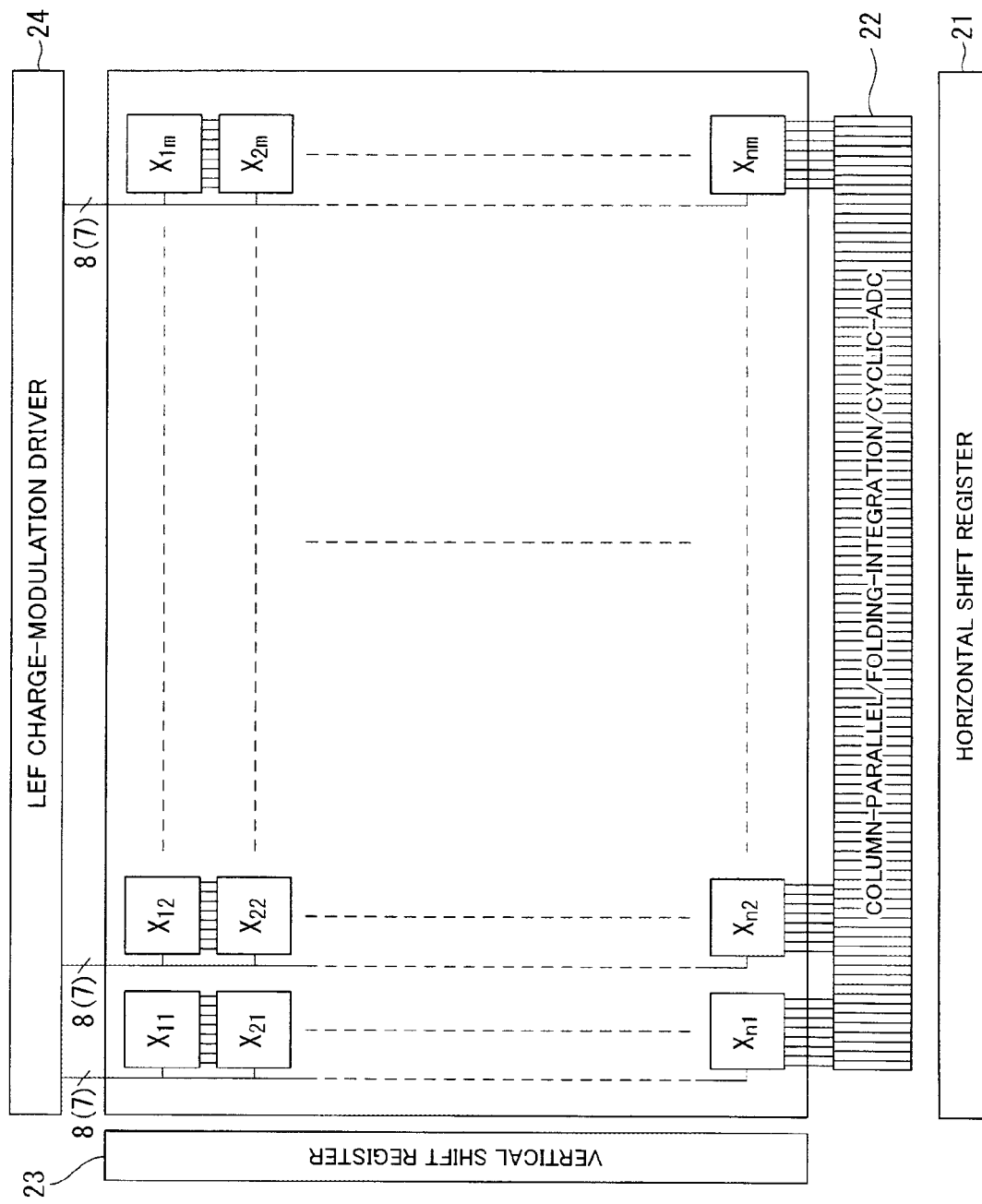
FIG. 8 is a schematic plan view illustrating an outlined of a layout on a semiconductor chip of a solid-state image sensor according the first embodiment of the present invention.

FIG. 8 is a configuration example of the solid-state image sensor in which the photoelectric-conversion element according to the first embodiment is applied to the pixel $X_{ij}$ and a plurality of pixels $X_{ij}$ are arrayed in a matrix.

In a septuple-output photoelectric-conversion element, through use of a buried photodiode structure, the different field-control voltages generated in the shaping circuit from the first field-control pulse g1, the second field-control pulse g2, the third field-control pulse g3, . . . , and the eighth field-control pulse g8, which are fed from a horizontal LEF charge-modulation driver 24, are sequentially applied to the first field-control electrode G1, the second field-control electrode G2, the third field-control electrode G3, . . . , and the eighth field-control electrode G8 in a different phase relationship. Accordingly, by a static induction effect in a LEF, the depletion potentials of the charge-transport paths and the octuple charge-transfer channels R1, R2, R3, . . . , and R8 are sequentially changed. Then, the signal charges can be transported through the selected charge-transfer channels and sequentially accumulated in the first charge-accumulation region SD1, the second charge-accumulation region SD2, the third charge-accumulation region SD3, . . . , and the seventh charge-accumulation region SD7, and the charges ascribable to background-light can be exhausted to the eighth charge-accumulation region SD8, which implements the charge-exhaust region.

Figure 9:
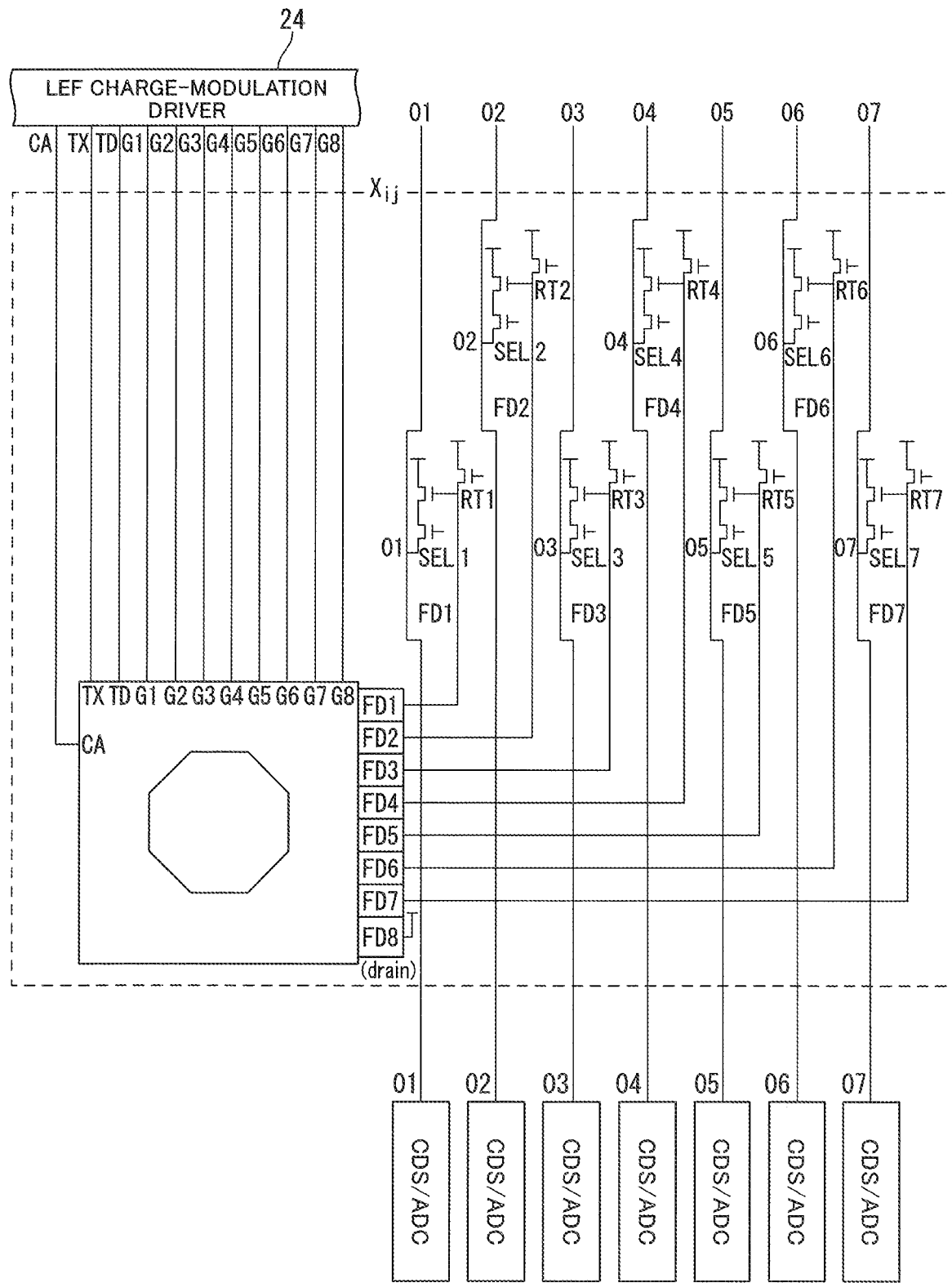
FIG. 9 is a schematic plan view illustrating an outline of an inner structure of a pixel included in the solid-state image sensor represented by FIG. 8.

As illustrated in FIG. 9, as the first charge read-out region FD1, the second charge read-out region FD2, the third charge read-out region FD3, . . . , and the seventh charge read-out region FD7 being output terminals of the septuple-output photoelectric-conversion element are connected to gates of a source follower amplifier in a pixel of the pixels $X_{ij}$, the signals are read out by an active pixel-type circuit, and the signals are read out to a peripheral read-out circuit.

Note that, as illustrated in FIG. 9, the first reset transistor RT1, the second reset transistor RT2, the third reset transistor RT3, . . . , and the seventh reset transistor RT7 are also connected to nodes of the first charge read-out region FD1, the second charge read-out region FD2, the third charge read-out region FD3, . . . , and the seventh charge read-out region FD7 of the septuple-output photoelectric-conversion element. After the read-out, the charges of the first charge read-out region FD1, the second charge read-out region FD2, the third charge read-out region FD3, . . . , and the seventh charge read-out region FD7 of the septuple-output photoelectric-conversion element are reset. The reset operations are used for noise cancellation.

For example, in a case where the solid-state image sensor according to the first embodiment is scheduled to be applied to a TOF range image sensor illustrated in FIG. 8, a structure in which a pixel array portion and a peripheral circuit portion (21, 22, 23, and 24) are arranged and integrated on a single semiconductor chip can be illustrated. For example, the pixel array portion can be defined as a square area, and the plurality of pixels $X_{ij}$ (i=1 to n, j=1 to m; n and m are integers) illustrated in FIG. 9 can be arrayed in a two-dimensional matrix in the pixel array portion. On a lower side of the pixel array portion, a column-parallel/folding-integration/cyclic-A/D converter 22, and a horizontal shift register 21 connected to the column-parallel/folding-integration/cyclic-A/D converter 22, are provided along a direction of pixel rows of X11, X12, . . . X1m, and X21, X22, . . . , X2m, . . . , and Xn1, Xn2, . . . , and Xnm, which are illustrated horizontally in FIG. 8. On a left side of the pixel array portion, the vertical shift register 23 is provided along a direction of pixel lines X11, X21, . . . , Xn1, and X12, X22, . . . , Xn2, . . . , and X1m, X2m, . . . , and Xnm, which are illustrated vertically in FIG. 8. A timing generation circuit (not shown) is connected to the vertical shift register 23 and the horizontal shift register 21. In the solid-state image sensor according to the first embodiment, the signals are read out in the column-parallel/folding-integration/cyclic-A/D converter 22 provided on the lower side of the pixel array portion, and are subjected to A/D conversion. Further, the signals are also subjected to noise cancellation. With the noise cancellation, the signal levels of the optical charges are extracted, and the signals from which fixed pattern noise and part of temporal random noise (reset noise) are cancelled are obtained.

As already described, in the solid-state image sensor according to the first embodiment, the photoelectric-conversion element explained in the first embodiment is used as the pixel $X_{ij}$. Further, the electric field is kept substantially constant over the long charge-transport paths in the septuple-output photoelectric-conversion element implementing the pixel $X_{ij}$ as compared to the case where the MOS structure of the earlier technology is used to implement a unit pixel for controlling the potential just under the gate electrodes in the vertical direction to the principal surface of the semiconductor chip. And therefore, because the pixel $X_{ij}$ uses the electric field control by the lateral static induction effect along the direction parallel to the principal surface of the semiconductor chip, and orthogonal to the charge-transfer direction in the solid-state image sensor according to the first embodiment, by operating the septuple-output photoelectric-conversion element in the pixel $X_{ij}$ at a timing as illustrated in the timing chart of FIG. 3, a total measurement time can be shortened, and the signal charges can be transferred at a high speed.

Further, in the configuration in which the MOS structure of the earlier technology is used to implement a unit pixel for controlling the potential just under the gate electrodes in the vertical direction, the noise and the dark current are caused by the interface defects and the interface states in the interface between the gate silicon oxide layer and the silicon surface. However, in the solid-state image sensor according to the first embodiment, because the septuple-output photoelectric-conversion element implementing the respective pixels $X_{ij}$ adopts the scheme of electric field control by the lateral static induction effect, in the septuple-output photoelectric-conversion element implementing the respective pixels $X_{ij}$, the problem of the noise and the dark current caused by the interface defects and the interface states in the interface between the gate silicon oxide layer and the silicon surface and the problem of the reduction in the transport speed can be avoided, and the solid-image capturing device with low noise, high resolution, and a high response speed can be achieved.

Further, in the solid-state image sensor according to the first embodiment, the signal charges can sequentially be transferred at a high speed to the first charge-accumulation region SD1, the second charge-accumulation region SD2, the third charge-accumulation region SD3, . . . , and the seventh charge-accumulation region SD7, which are positioned on the ends of the septuple charge-transfer channels among the octuple charge-transfer channels R1, R2, R3, . . . , and R8, each of which extends radially from the center position of the light receiving region PD of the septuple-output photoelectric-conversion element implementing the respective pixels $X_{ij}$. Thus, in addition to the two-dimensional TOF range sensor, the present invention is applied to observation of a physical phenomenon repeated in an extremely short time period so that a two-dimensional image can be captured in a short total measurement time.

Especially, when the solid-state image sensor according to the first embodiment is applied to an element for measuring a lifetime of a fluorescence substance, the signal charges are transferred at a high speed, while the electric field is maintained substantially constant over the long charge-transfer direction. Therefore, a measurement time of a lifetime of a fluorescence substance can be shortened, and a two-dimensional image can be captured at a high accuracy.

First Modification of First Embodiment

Figure 10:
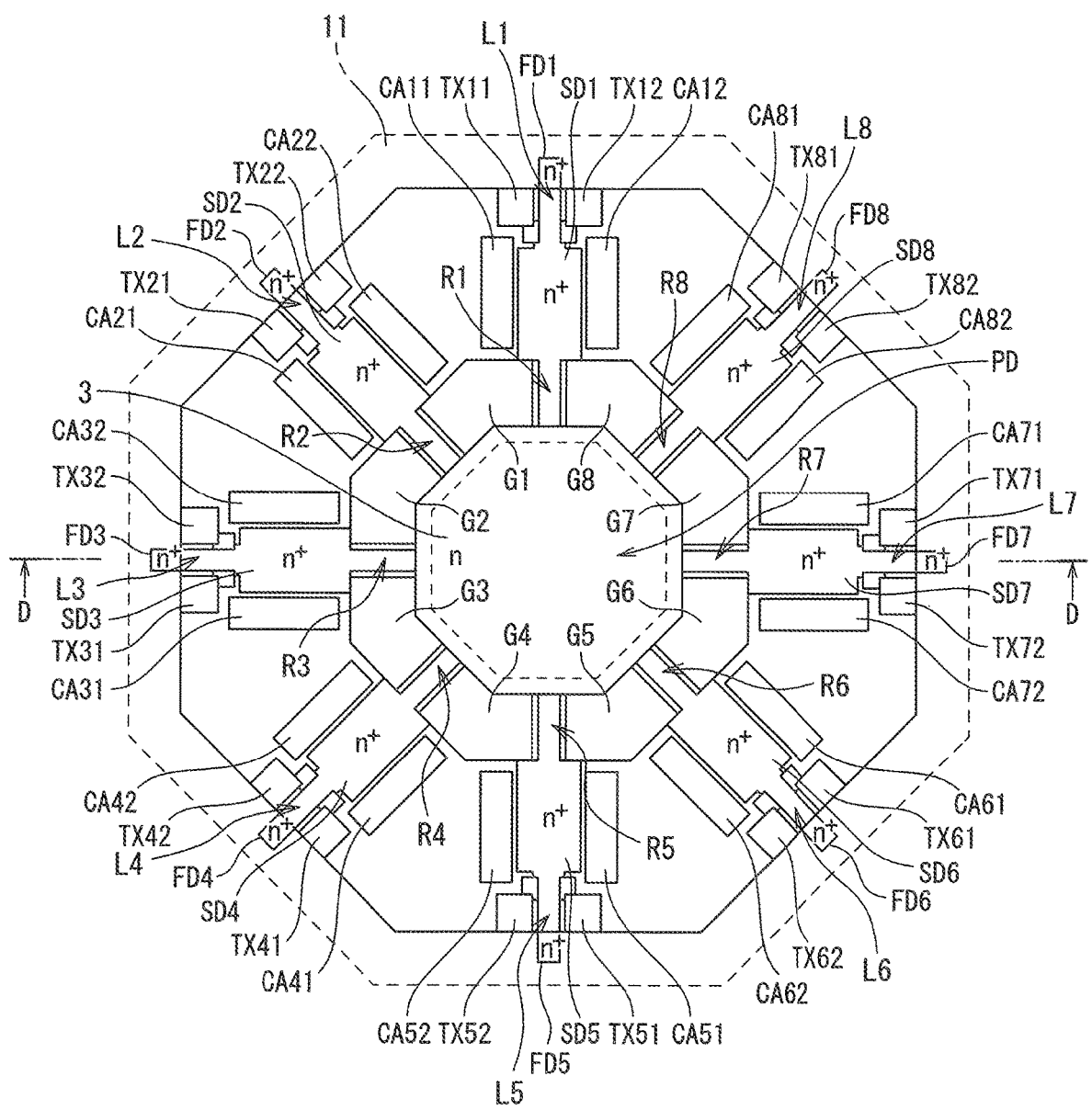
FIG. 10 is a schematic plan view (top view) for illustrating an outline of a photoelectric-conversion element according to a first modification of the first embodiment of the present invention.
Figure 11:
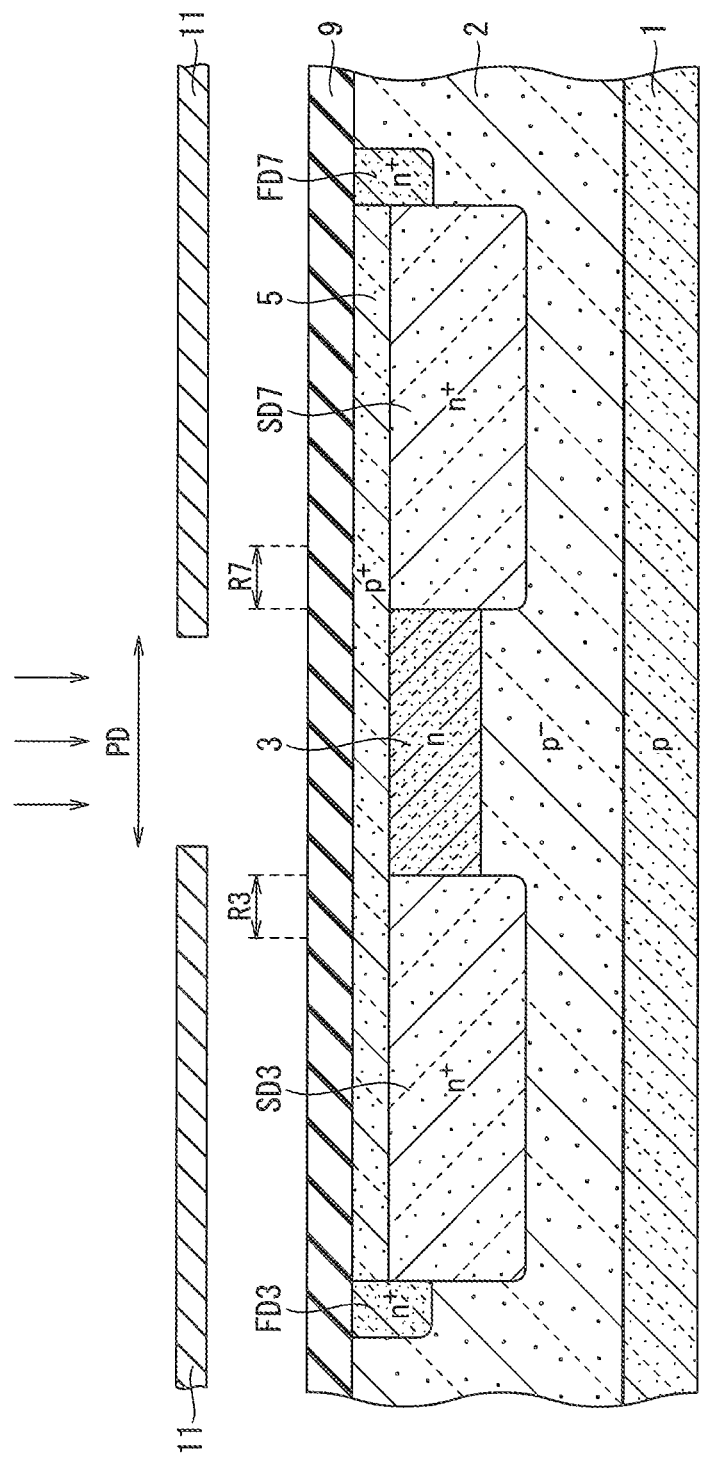
FIG. 11 is a schematic cross-sectional view illustrating an outline structure of the photoelectric-conversion element according to the first modification of the first embodiment, taken from the D-D direction of FIG. 10.

As illustrated in FIG. 10 and FIG. 11, by a first modification of the first embodiment, when the potential-hill creating-portion 7 made of a p$^+$ region is not provided on the inner side of the light receiving region PD like the photoelectric-conversion element according to the first embodiment, a photoelectric-conversion element can be achieved. Also, in the photoelectric-conversion element according to the first modification of the first embodiment, similarly to the case of the photoelectric-conversion element illustrated in FIG. 9, the quadruple control-electrode pairs are disposed along the center axes of the desired charge-transfer channels, and the gate signals having the quadruple output levels are applied to the respective control-electrode pairs cyclically, to thereby perform the operation. Also, with the photoelectric-conversion element according to the first modification of the first embodiment, similarly to the photoelectric-conversion element illustrated in FIG. 1 to FIG. 9, both the large light receiving region PD and the high-speed transfer can be achieved.

Figure 12:
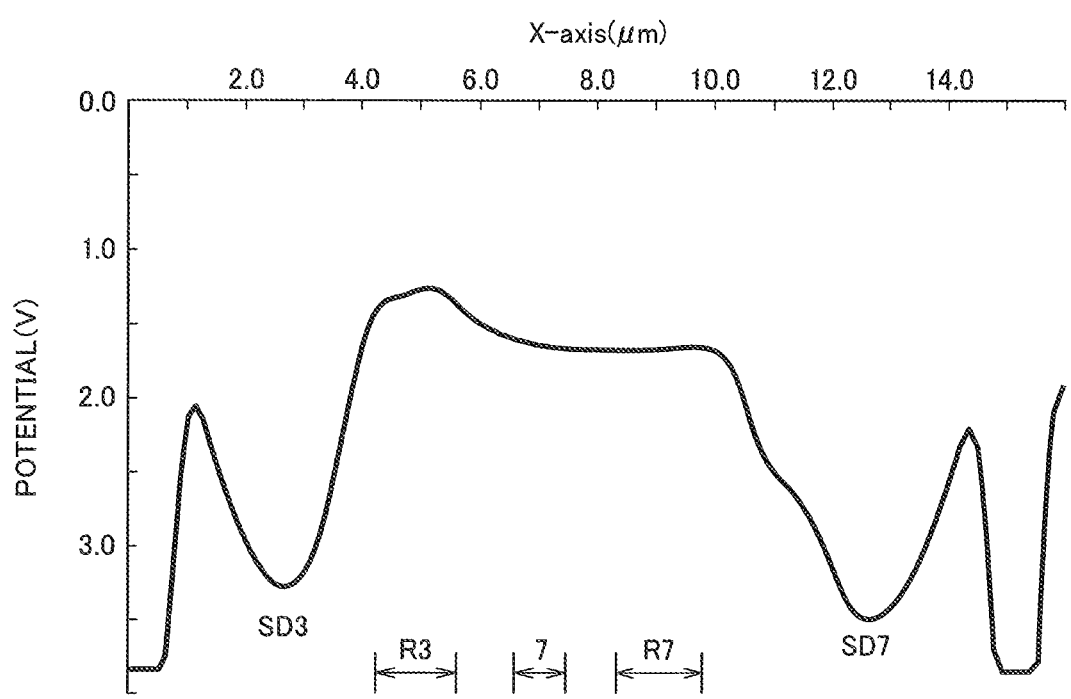
FIG. 12 is a view illustrating a potential profile of a band edge (bottom) of a conduction band of the photoelectric-conversion element according to the first modification of the first embodiment, taken from the D-D direction of FIG. 10.

However, in the case of the first modification, as in the case of the transfer of the charges to the seventh charge-accumulation region SD7, which illustrated in FIG. 12, there may be a case where a slightly flat potential regime is formed in a transition zone from the seventh charge-transfer channel R7 to the seventh charge-accumulation region SD7. Thus, the structure of the photoelectric-conversion element illustrated in FIG. 1 is more advantageous, because a flat potential regime is not established in a space between the charge-transport path for transporting the electrons and the charge-accumulation region in the photoelectric-conversion element illustrated in FIG. 1, as understood by the potential diagram illustrated in FIG. 6.

Second Modification in First Embodiment

In the case of the photoelectric-conversion element illustrated in FIG. 1, the octuple field-control electrodes implement the quadruple control-electrode pairs, and the transport of the electrons to the octuple charge-transfer channels is controlled by the quadruple control-electrode pairs. However, in a second modification of the first embodiment illustrated in FIG. 13, a plurality of field-control electrodes, which are more than the number of the charge-transfer channels, is provided to a photoelectric-conversion element for controlling the transport of the electrons.

Figure 13:
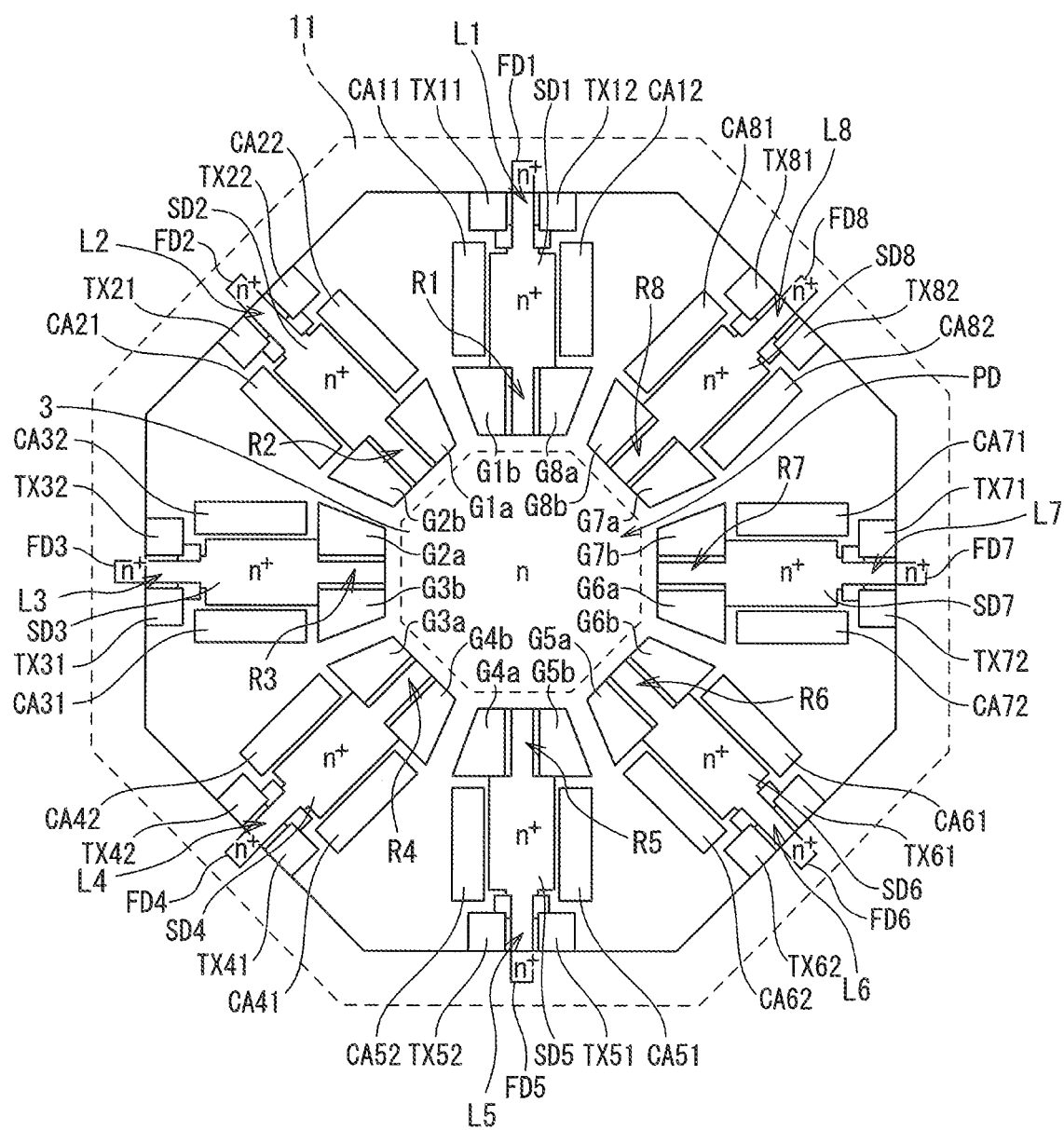
FIG. 13 is a schematic plan view (top view) illustrating an outline of a photoelectric-conversion element according to a second modification of the first embodiment of the present invention.

In FIG. 13, a case where sixteen field-control electrodes G1a, G2a, G3a, . . . , G8a, G1b, G2b, G3b, . . . , and G8b implement octuple control-electrode pairs is exemplified. Between the field-control electrode G8a and the field-control electrode G1b, the first charge-transfer channel R1 is defined. Further, between the field-control electrode G1a and the field-control electrode G2b, the second charge-transfer channel R2 is defined. Between the field-control electrode G2a, and the field-control electrode G3b, the third charge-transfer channel R3 is defined. Between the field-control electrode G3a and the field-control electrode G4b, the fourth charge-transfer channel R4 is defined. Further, between the field-control electrode G4a and the field-control electrode G5b, the fifth charge-transfer channel R5 is defined. Between the field-control electrode G5a and the field-control electrode G6b, the sixth charge-transfer channel R6 is defined. Between the field-control electrode G6a and the field-control electrode G7b, the seventh charge-transfer channel R7 is defined. Between the field-control electrode G7a and the field-control electrode G8b, the eighth charge-transfer channel R8 is defined. In the case of the photoelectric-conversion element according to the second modification of the first embodiment, similarly to the case of the photoelectric-conversion element illustrated in FIG. 9, the octuple control-electrode pairs are disposed along the center axes of the desired charge-transfer channels, and the adjacent field-control electrodes allocated in the octuple control-electrode pairs are caused to have the same potential. Sequentially, the gate signals having the quadruple output levels are applied to the respective control-electrode pairs cyclically at a timing as illustrated in the timing chart of FIG. 3. With the gate signals of the quadruple output levels, similarly to the photoelectric-conversion element illustrated in FIG. 1 to FIG. 9, the operation can be performed, and a total measurement time can be shortened. Further, the octuple independent control-electrode pairs are selected from the sixteen field-control electrodes G1a, G2a, G3a, . . . , G8a, G1b, G2b, G3b, . . . , and G8b, and the gate signals having the octuple output levels are applied cyclically at a timing obtained by extending the timing chart illustrated in FIG. 3. Accordingly, the potential profile of the charge-transport paths formed in the periphery of the light receiving region PD becomes smoother, and the transport of the signal charges in the light receiving region PD can be performed at a higher speed. Thus, through use of the gate signals having the octuple output levels, a total measurement time can further be shortened, and the larger light receiving region PD and the higher-speed transfer can be achieved as compared to the photoelectric-conversion element illustrated in FIG. 1 to FIG. 9.

Third Modification in First Embodiment

Figure 14:
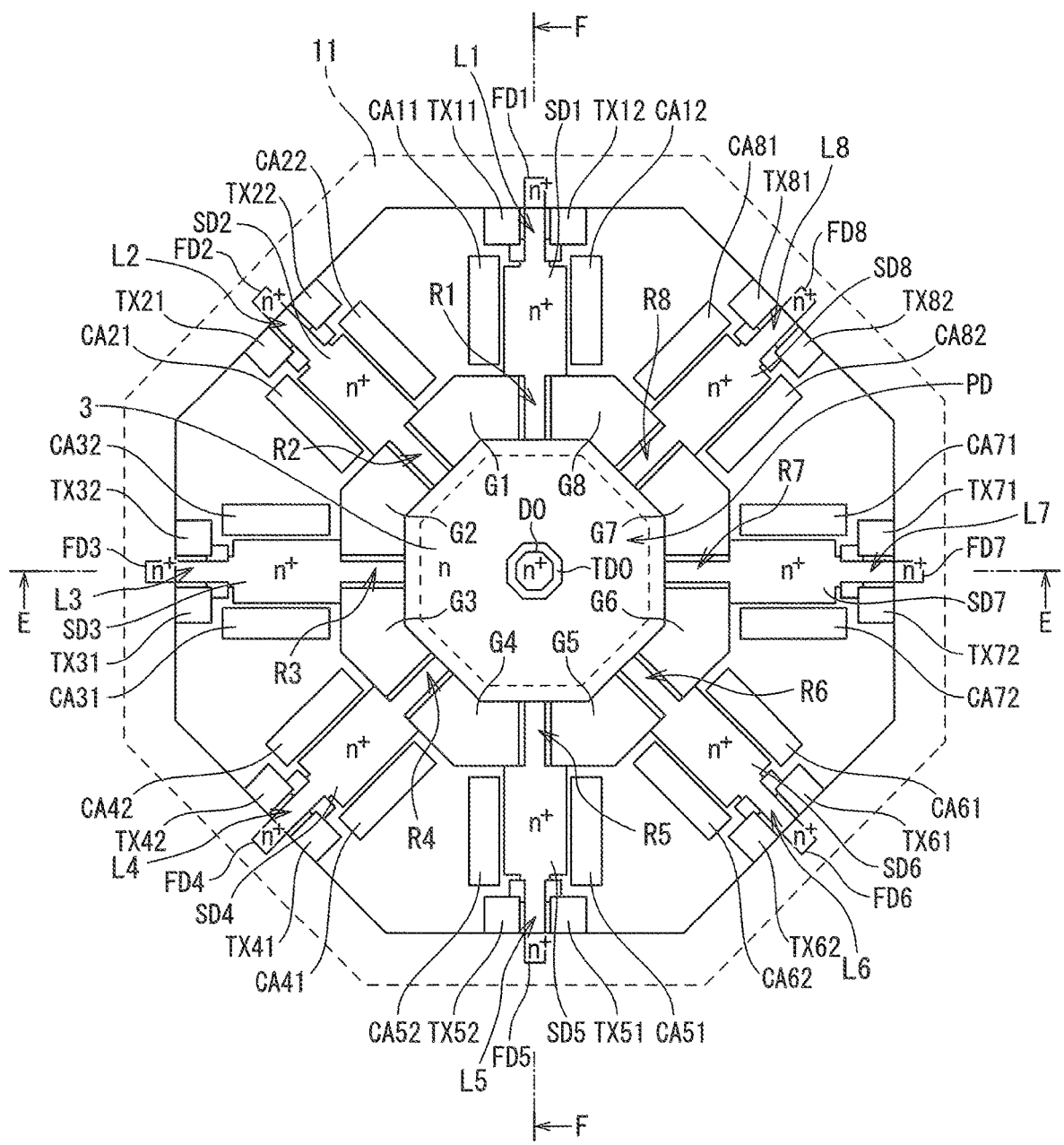
FIG. 14 is a schematic plan view (top view) illustrating an outline of a photoelectric element according to a third modification of the first embodiment of the present invention.

In a third modification of the first embodiment illustrated in FIG. 14, above the surface buried region 3, a charge-exhaust region (drain region) D0 is provided at a position away from the first charge-accumulation region SD1, the second charge-accumulation region SD2, the third charge-accumulation region SD3, . . . , and the eighth charge-accumulation region SD8. With the structure illustrated in FIG. 14, an octuple-output photoelectric-conversion element including all of the first charge-accumulation region SD1, the second charge-accumulation region SD2, the third charge-accumulation region SD3, . . . , and the eighth charge-accumulation region SD8 can be achieved.

Figure 15:
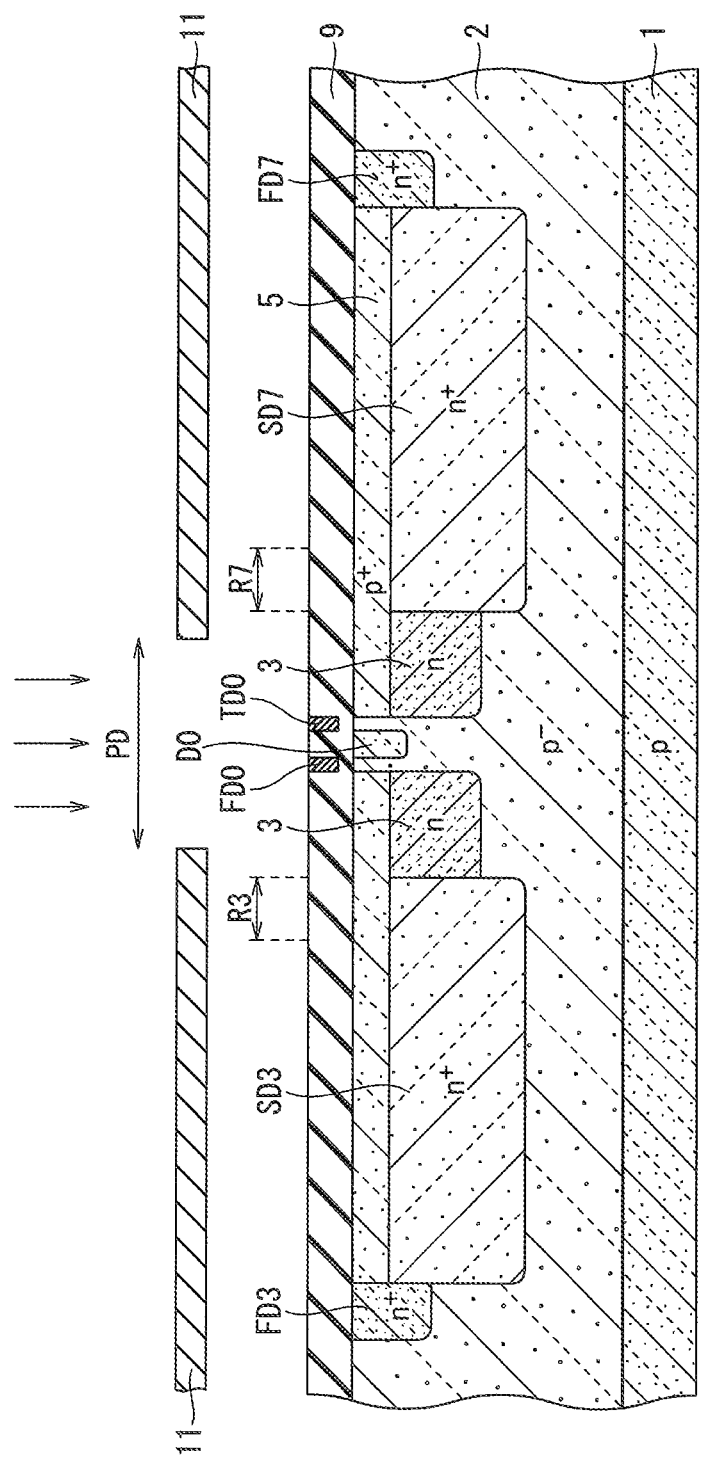
FIG. 15 is a schematic cross-sectional view illustrating an outline structure of the photoelectric element according to the third modification of the first embodiment, taken from the E-E direction of FIG. 14.

As illustrated in FIG. 15, the charge-exhaust region D0 is an n-type semiconductor region having high impurity concentration, which is provided in a site disposed at an upper portion of the element-allocating layer 2, the site is allocated in the center of the ring-shaped surface buried region 3, being slightly away from the surface buried region 3. A charge-exhaust electrode TD0 is an electrode having a ring shape in a planar pattern and an insulated-gate structure. Although, the charge-exhaust electrode TD0 is buried in the upper portion of the insulator 9, in the planar pattern, the charge-exhaust electrode TD0 is provided at a location between the charge-exhaust region D0 and the surface buried region 3, surrounding the charge-exhaust region D0.

Figure 16:
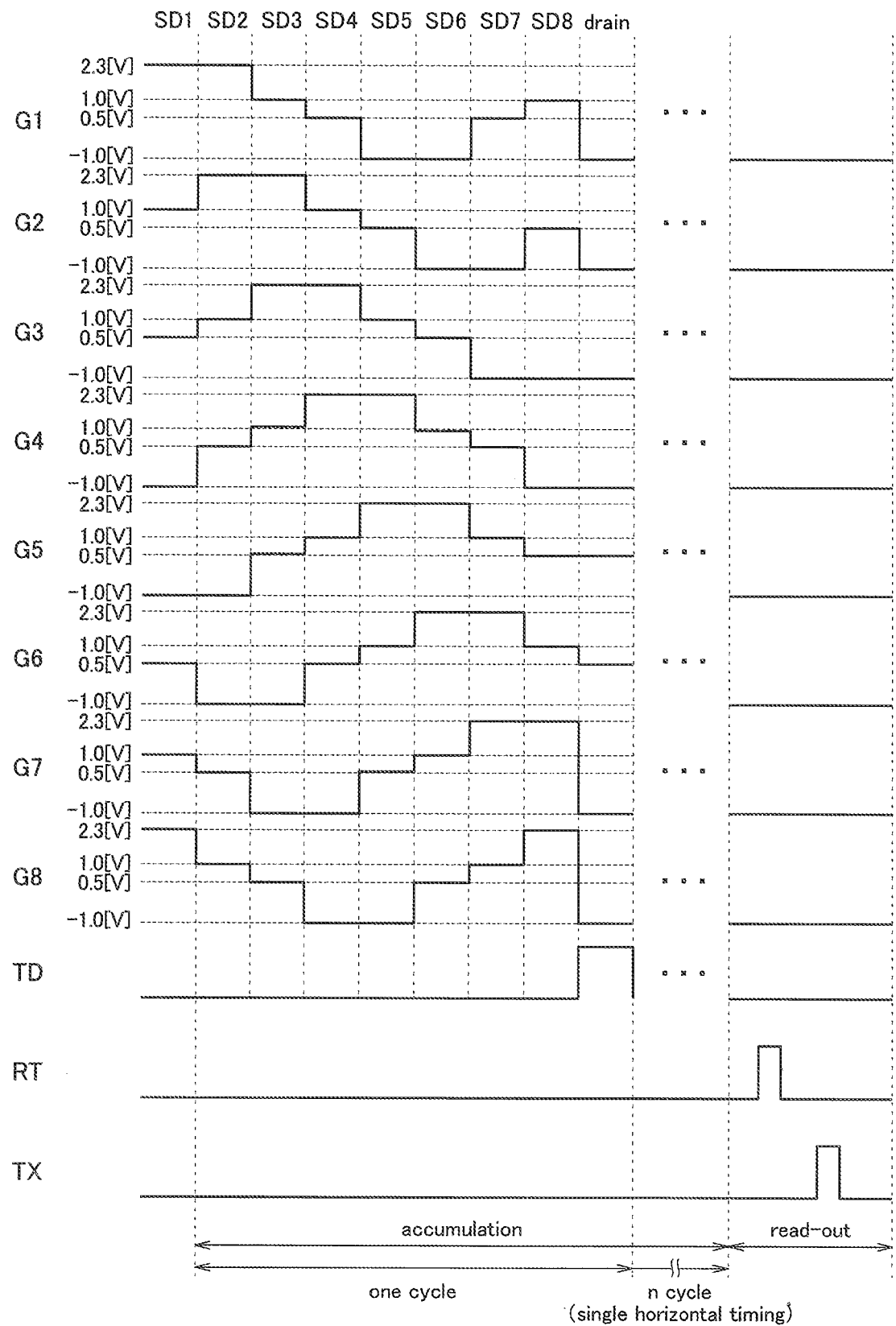
FIG. 16 is a timing view illustrating the operation of the photoelectric-conversion element according to the third modification of the first embodiment of the present invention.

As illustrated in FIG. 16, during accumulation, the signals having the quadruple output levels are sequentially applied to the first charge-accumulation region SD1, the second charge-accumulation region SD2, the third charge-accumulation region SD3, . . . , and the eighth charge-accumulation region SD8 similarly to the case illustrated in FIG. 3. During a drain period after the fourth potential level V (2.3 volts) is applied to the seventh charge-accumulation region SD7 and the eighth charge-accumulation region SD8 and before the fourth potential level V (2.3 volts) is applied to the eighth charge-accumulation region SD8 and the first charge-accumulation region SD1, the charge-exhaust electrode TD0 is turned on.

Figure 17A:
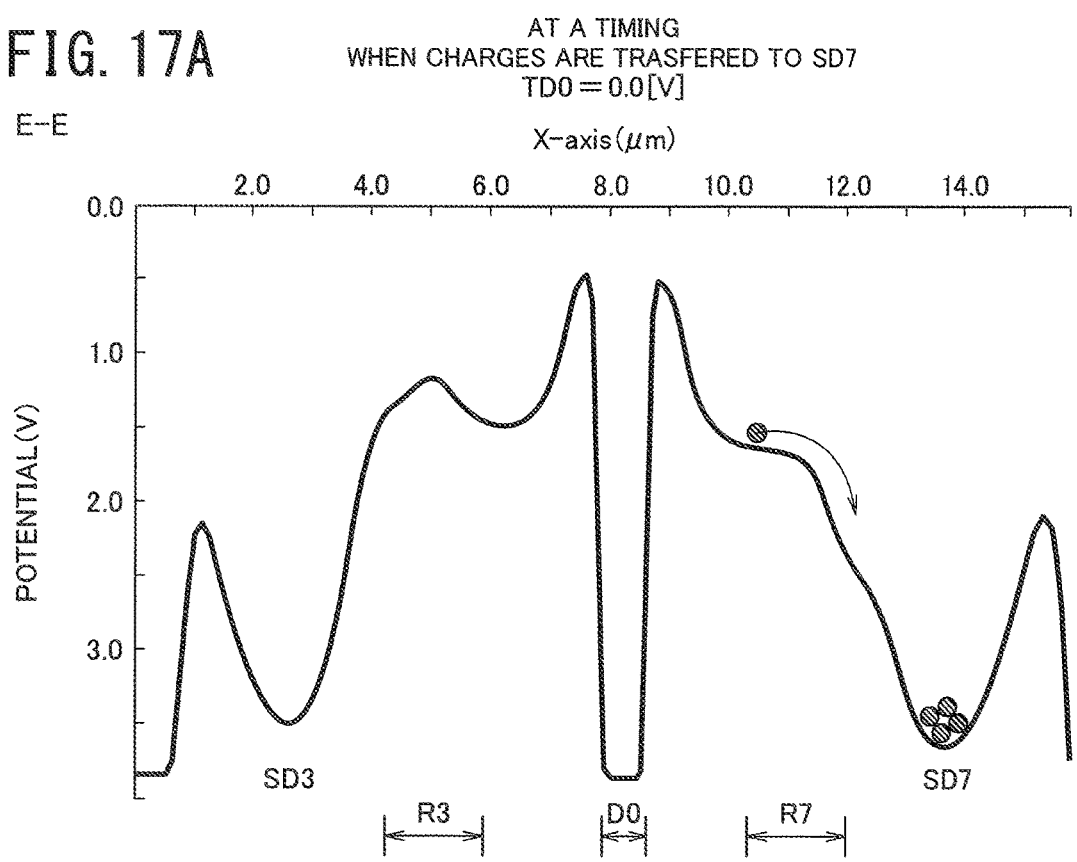
FIG. 17A is a view illustrating a potential profile of a band edge (bottom) of a conduction band of the photoelectric-conversion element according to the third modification of the first embodiment at the time of charge transfer, X-axis is taken from the E-E direction of FIG. 14.
Figure 17B:
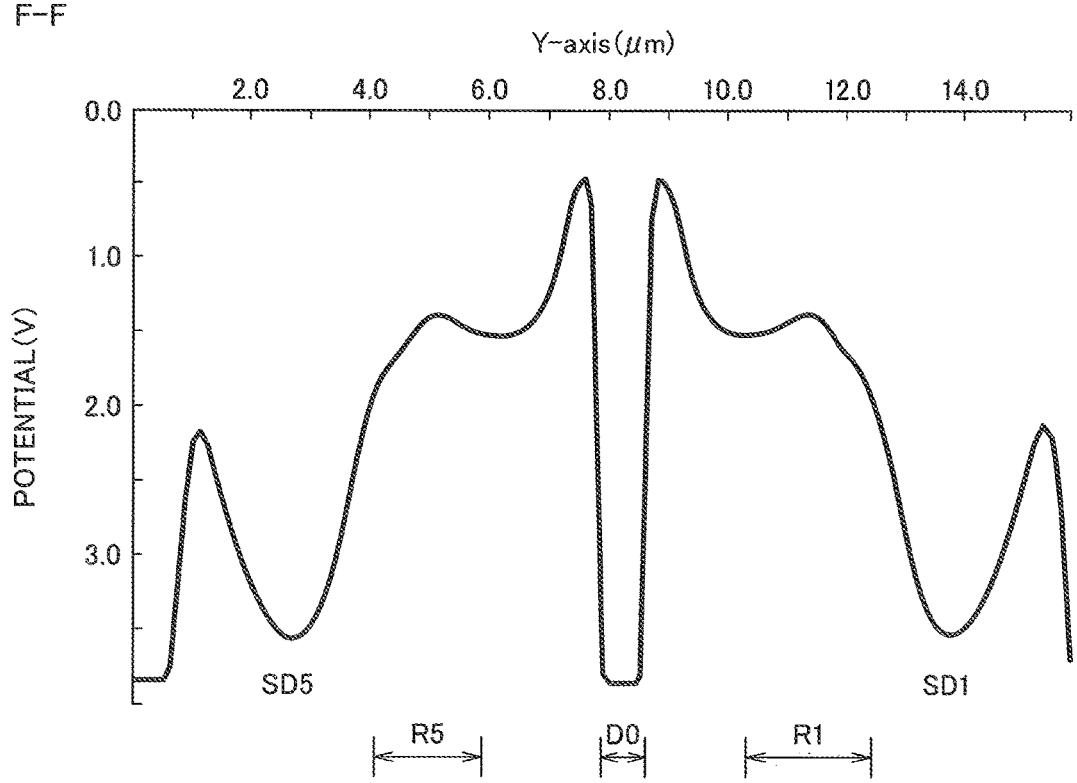
FIG. 17B is a view illustrating a potential profile of the band edge (bottom) of the conduction band of the photoelectric-conversion element according to the third modification of the first embodiment, Y-axis is taken from the F-F direction of FIG. 14.

In FIG. 17, the potentials in the case of the transfer of the charges to the seventh charge-accumulation region SD7 are illustrated. That is, when the charge-exhaust electrode TD0 is in an OFF state, as illustrated in FIG. 17A, the gate of the seventh charge-transfer channel R7 is opened, and the charges are transported to the seventh charge-accumulation region SD7. Meanwhile, the gates of the other charge transfer channels such as the fifth charge-transfer channel R5 and the first charge-transfer channel R1 illustrated in FIG. 17B are closed, and the transport of the charges to the respective charge accumulation regions is blocked, and the charges are transported to the seventh charge-accumulation region SD7.

In contrast, in FIG. 18, the potential profiles at the time of exhausting the charges ascribable to background-light, that is, in the case where the charge-exhaust electrode TD0 is tuned on are illustrated. As illustrated in FIG. 18A and FIG. 18B, the gates of all the charge-transfer channels including the first charge-transfer channel R1, the second charge-transfer channel R2, the third charge-transfer channel R3, . . . , and the eighth charge-transfer channel R8 are closed, and the transport of the charges to the respective charge-accumulation regions is blocked. The charges are transported only to the charge-exhaust region D0.

Figure 19:
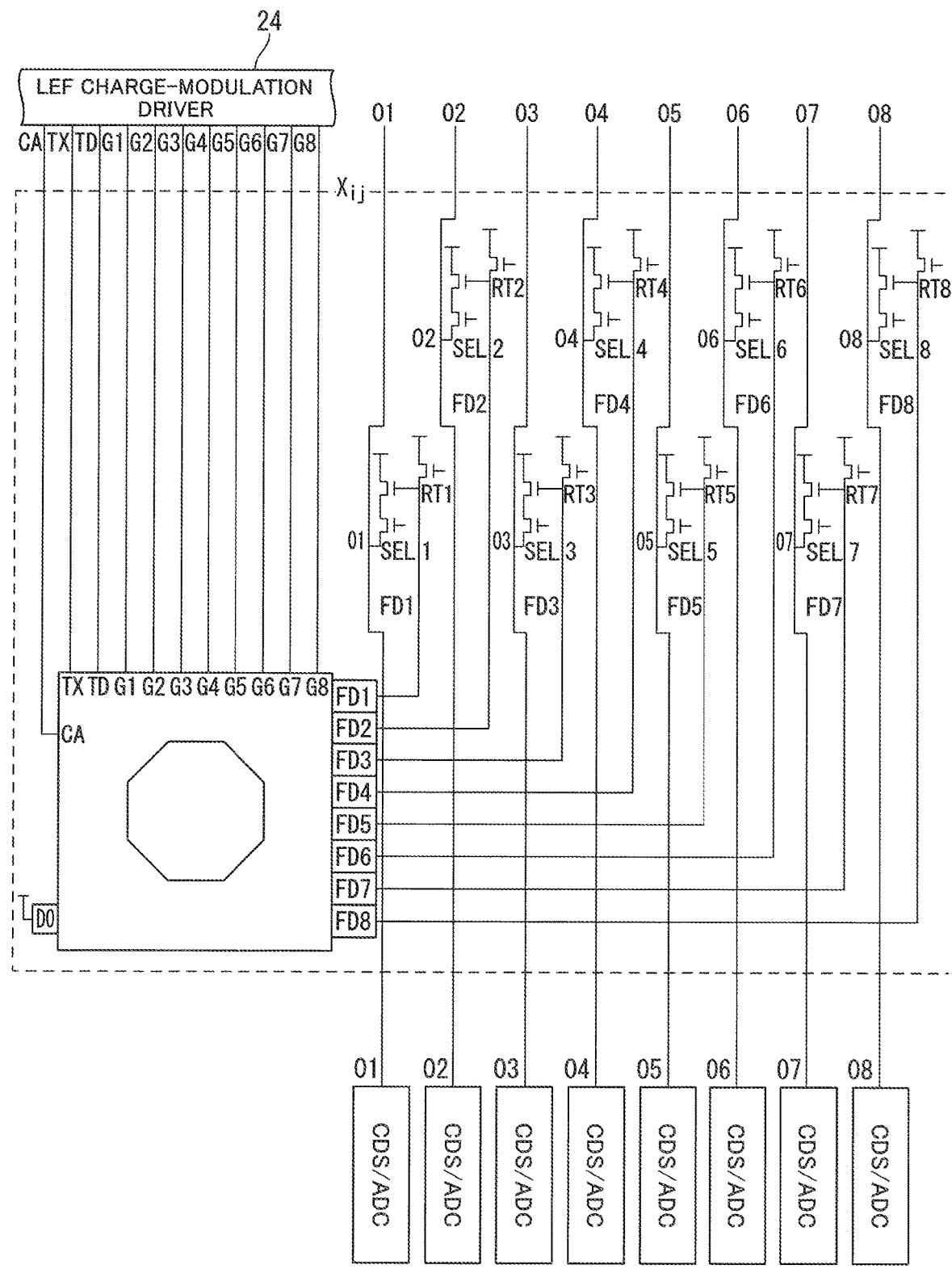
FIG. 19 is a schematic plan view illustrating an outline of an inner structure of a pixel included in a solid-state image sensor according to the third modification of the first embodiment of the present invention according to the first embodiment of the present invention.

In FIG. 19, an internal structure of the solid-state image sensor including the photoelectric-conversion element according to the third modification of the first embodiment is illustrated. The solid-state image sensor in the third modification differs from the solid-state image sensor illustrated in FIG. 4 in that the signals are independently applied from the charge-modulation driver 24 to the eighth field-control electrode G8 and the charge-exhaust electrode TD0, and that one output terminal of the photoelectric-conversion element is incremented by the eighth charge-accumulation region SD8.

Substantially the same as the first charge-accumulation region SD1, the second charge-accumulation region SD2, the third charge-accumulation region SD3, . . . , and the seventh charge-accumulation region SD7, an eighth amplification transistor, an eighth switching transistor, and an eighth reset transistor are connected to the eighth charge-accumulation region SD8, thereby achieving the octuple-output photoelectric-conversion element. Substantially the same as the photoelectric-conversion element illustrated in FIG. 1 to FIG. 9, the photoelectric-conversion element in the third modification of the first embodiment also achieves both effectiveness of the large light receiving region PD and the high-speed transfer.

Fourth Modification in First Embodiment

Figure 20:
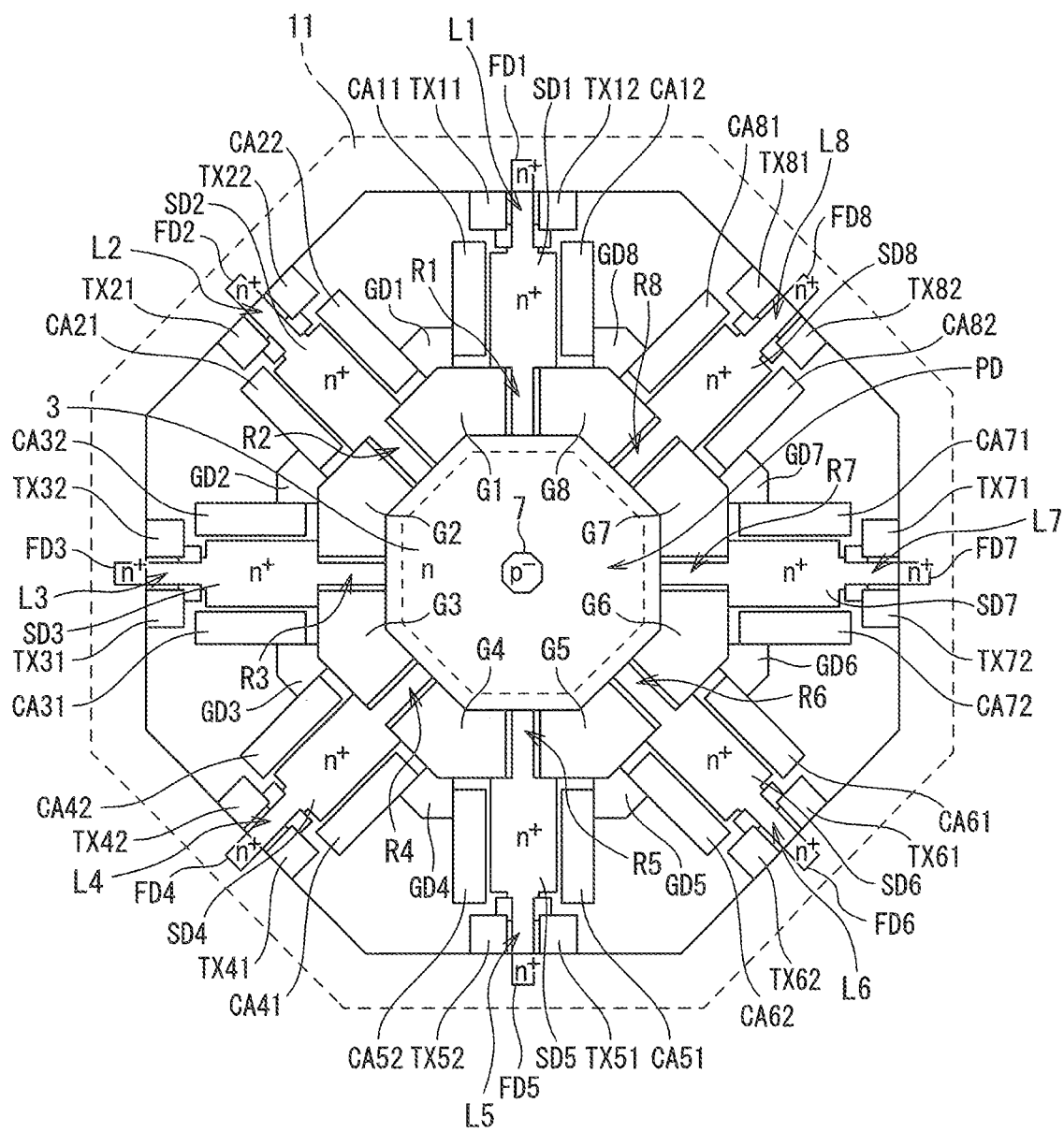
FIG. 20 is a schematic plan view (top view) for illustrating an outline of a photoelectric element according to a fourth modification of the first embodiment of the present invention.
Figure 21:
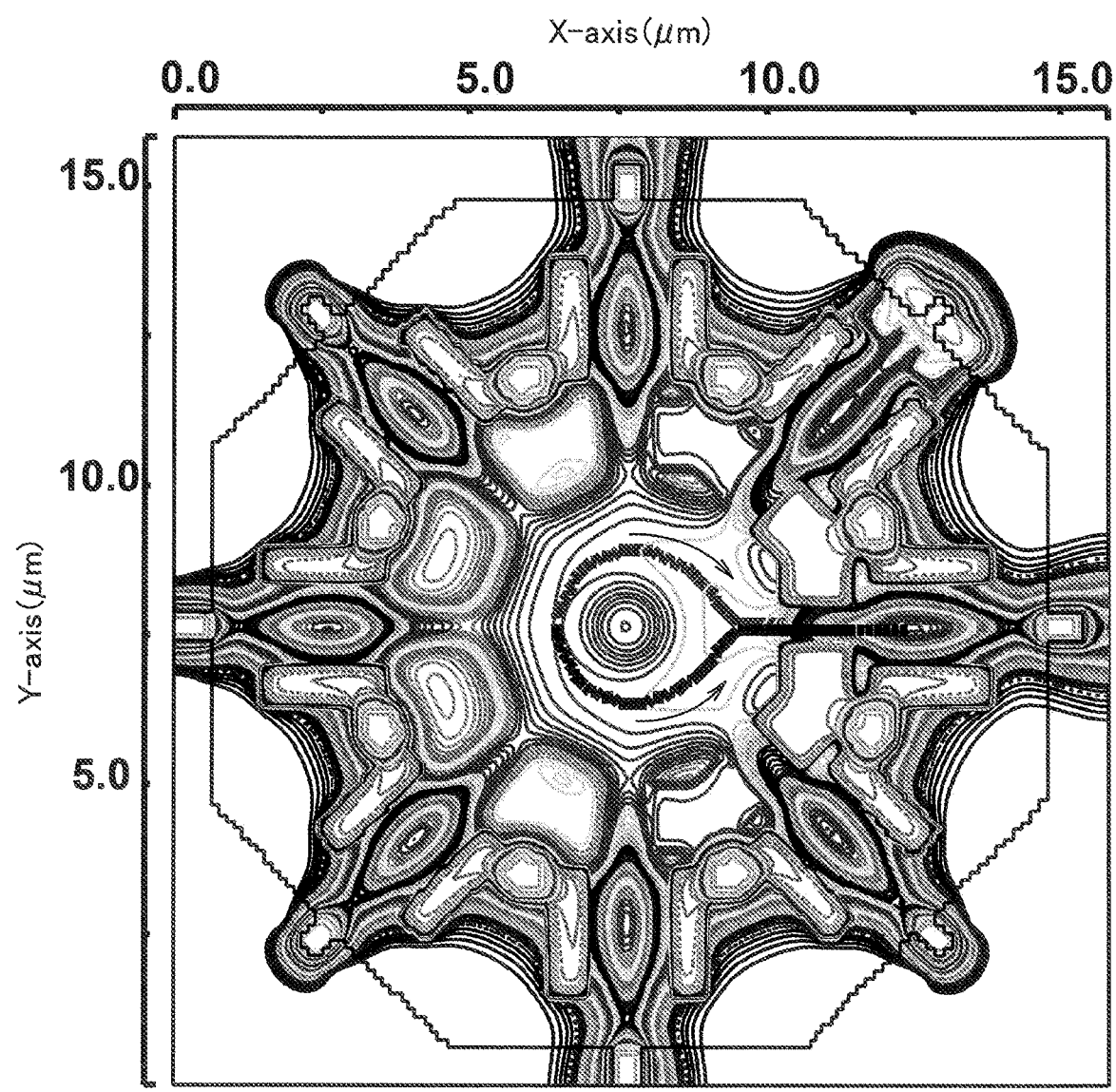
FIG. 21 is a view illustrating an equipotential line in an X-Y plane viewed from above an image-capturing region of the photoelectron conversion element according to the fourth modification of the first embodiment and a charge-transport path of electrons, which is set by a potential profile of the equipotential line.

As illustrated in FIG. 20, in a fourth modification of the first embodiment, octuple subjacent-gate charge-exhaust regions GD1, GD2, GD3, . . . , and GD8 are provide on the outer sides of the respective field-control electrodes between the adjacent charge-transfer channels above the surface buried region 3. Even with the structure illustrated in FIG. 20, the octuple-output photoelectric-conversion element can be achieved. Each of the subjacent-gate charge-exhaust regions GD1, GD2, GD3, . . . , and GD8 is a charge-exhaust region for exhausting charges leaking under the gate structure at the time of transferring the charges through the charge-transfer channel. In FIG. 21, a result of a simulation obtained by using the layout topology of the octuple-output photoelectric-conversion element illustrated in FIG. 20 is illustrated.

In FIG. 21, the bold broken line indicates a charge-transport path for the electrons that are transported from the upper side and the lower side of a plan view, around the potential-hill creating-portion 7, in the case where the charges are transferred to the seventh charge-accumulation region SD7. Based on the equipotential line illustrated in FIG. 21, it can be understood that the potential change of the potential valley being the charge-transport path for the electrons, which is set around the potential-hill creating-portion 7 is smooth and that the charges can be transferred efficiently to the seventh charge-accumulation region SD7. Substantially the same as the photoelectric-conversion element illustrated in FIG. 1 to FIG. 9, the photoelectric-conversion element according to the fourth modification of the first embodiment also achieves an effectiveness of smoothing the potential change of the potential valley, shortening a total measurement time, and achieving both the large light receiving region PD and the high-speed transfer.

Second Embodiment

Configuration of Photoelectric-Conversion Element

Figure 22:
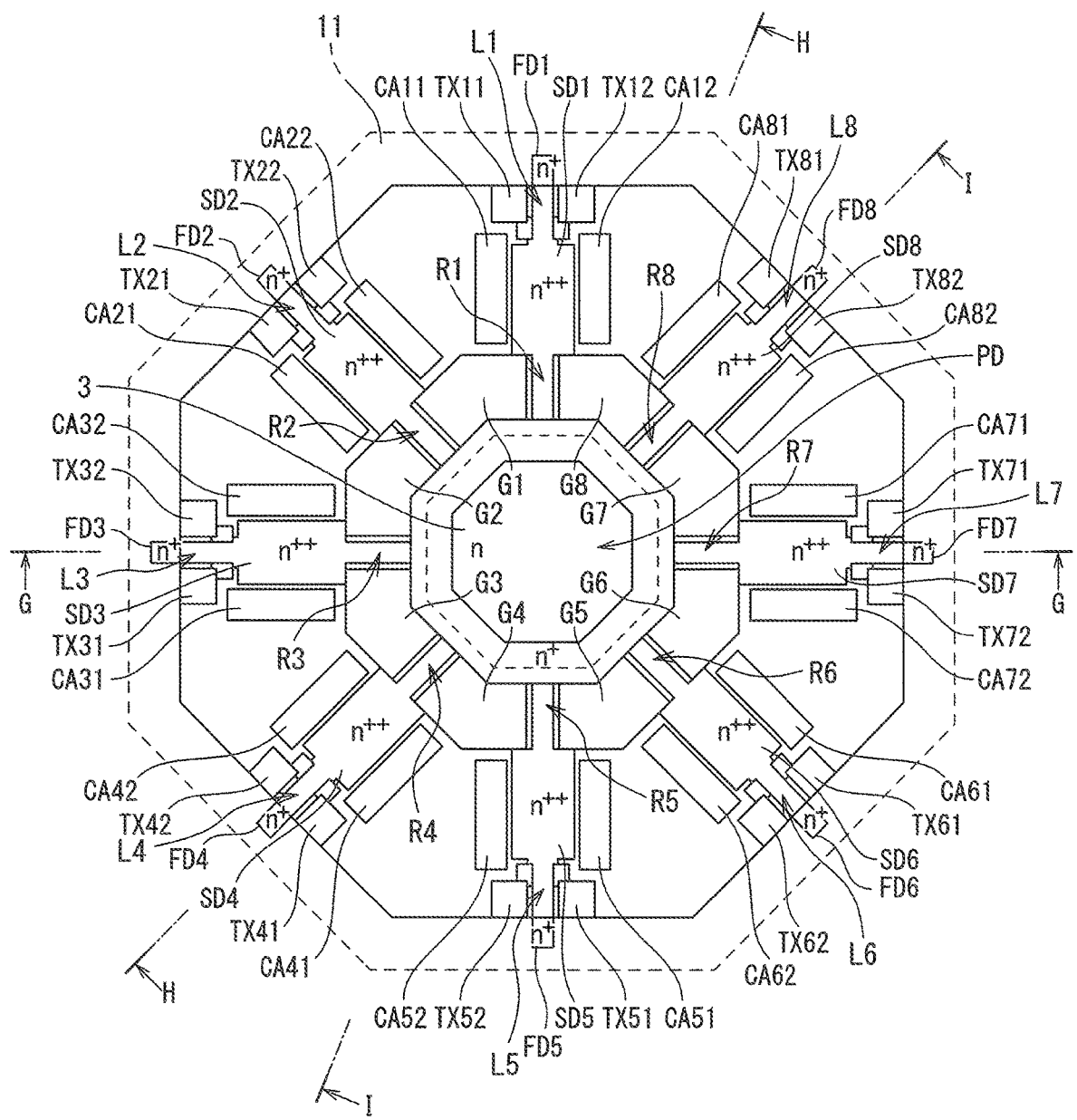
FIG. 22 is a schematic plan view (top view) for illustrating an outline of a photoelectric element according to a second embodiment of the present invention.
Figure 23:
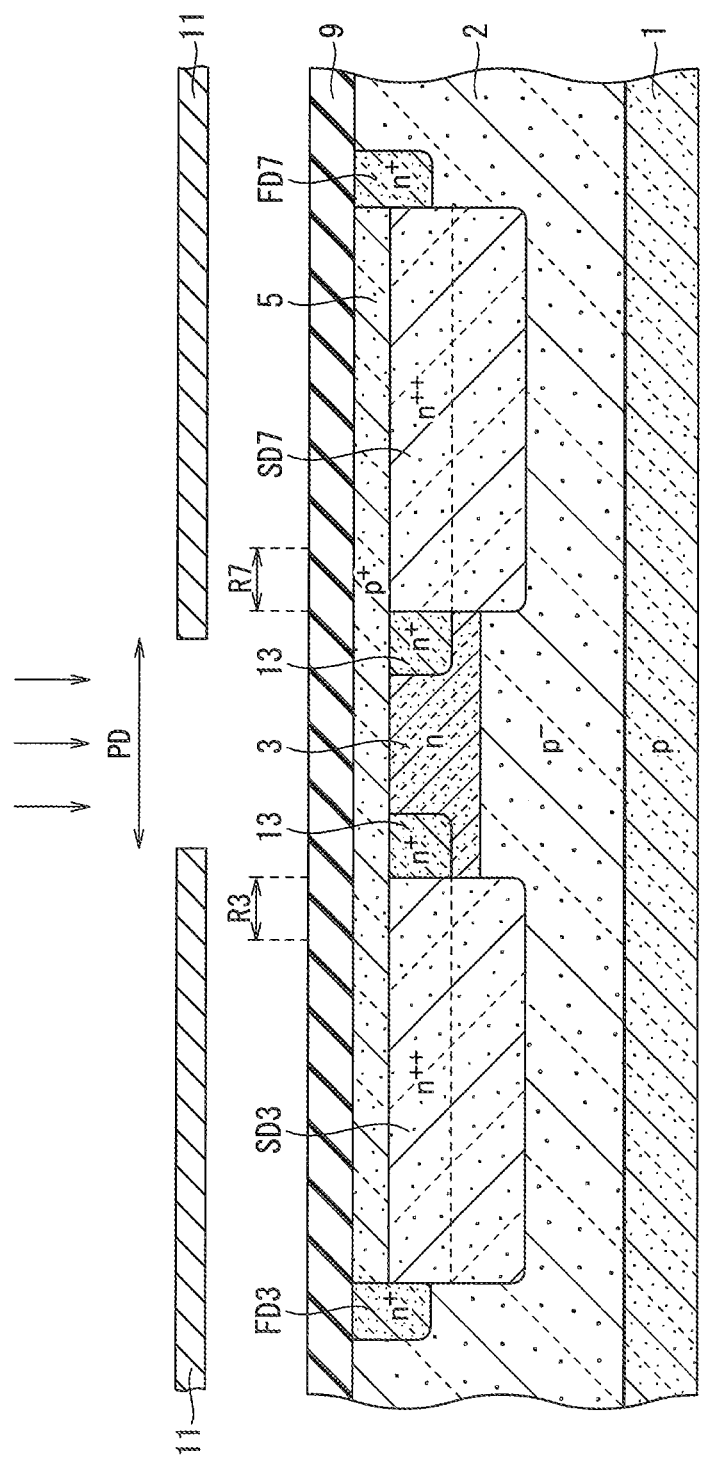
FIG. 23 is a schematic cross-sectional view illustrating an outline structure of a photoelectric element according to the second embodiment, taken from the G-G direction of FIG. 22.

As illustrated in the plan view of FIG. 22, and the cross-sectional views of FIG. 23 and FIG. 24, a photoelectric-conversion element according to a second embodiment of the present invention includes the image-capturing region (2, 3, 5 and 7), the insulator 9 provided on the image-capturing region (2, 3, 5 and 7), the first charge-accumulation region SD1, the second charge-accumulation region SD2, the third charge-accumulation region SD3, . . . , and the eighth charge-accumulation region SD8. The image-capturing region (2, 3, 5 and 7) includes the p-type element-allocating layer 2, the n-type surface buried region 3 buried in the upper portion of the element-allocating layer 2, an n-type guide region 13 having a doughnut-like shape in a planar pattern and impurity concentration higher than that of the surface buried region 3, which is provided in the periphery of the surface buried region 3, and the p-type pinning layer 5 provided so as to be contacted with the surface of the surface buried region 3. The first charge-accumulation region SD1, the second charge-accumulation region SD2, the third charge-accumulation region SD3, . . . , and the eighth charge-accumulation region SD8, which are n-type and have impurity concentration higher than the element-allocating layer, are provided away from one another so as to surround the light receiving region PD defined in the center of the image-capturing region (2, 3, 5 and 7), the first charge-accumulation region SD1, the second charge-accumulation region SD2, the third charge-accumulation region SD3, . . . , and the eighth charge-accumulation region SD8 are provided at octagonal positions symmetric with respect to the center position of the light receiving region PD. Further, the first field-control electrode G1, the second field-control electrode G2, the third field-control electrode G3, . . . , and the eighth field-control electrode G8 are arranged at the positions surrounding the light receiving region PD on the insulator 9 so as to be paired on both the sides of the octuple charge-transfer channels R1, R2, R3, . . . , and R8 extending from the center position of the light receiving region PD to the first charge-accumulation region SD1, the second charge-accumulation region SD2, the third charge-accumulation region SD3, . . . , and the eighth charge-accumulation region SD8, respectively.

The photoelectric-conversion element according to the second embodiment does not include the potential-hill creating-portion 7 in the photoelectric-conversion element explained in the first embodiment. Instead, the guide region 13 having a doughnut-like shape (ring shape) is provided in the periphery of the light receiving region PD. That is, the light receiving region PD of the photoelectric-conversion element according to the second embodiment includes the surface buried region 3 having a regular octagonal shape on the inner side and the guide region 13 having a doughnut-like shape (ring shape) on the outer side. Accordingly, the impurity concentration is changed in two stages. Although, as to the two-stage profile of the impurity concentration in the light receiving region PD, the photoelectric-conversion element according to the second embodiment differs from the photoelectric-conversion element explained in the first embodiment, the other configurations of the photoelectric-conversion element according to the second embodiment are equivalent to the constituent elements having the same nomenclatures in the first embodiment. Thus, the overlapping description of other configurations having the same nomenclatures are omitted.

Figure 25A:
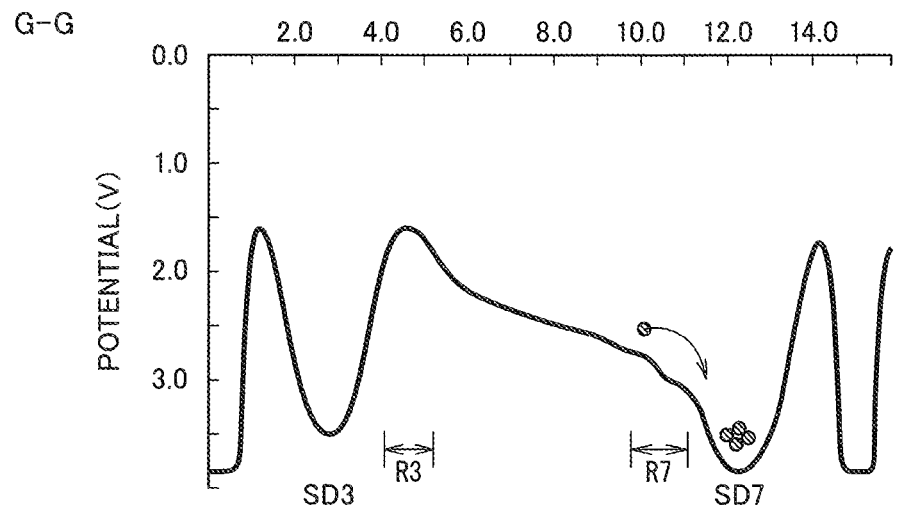
FIG. 25A is a view illustrating a potential profile of a band edge (bottom) of a conduction band of the photoelectric-conversion element according to the second embodiment, taken from the G-G direction of FIG. 22.
Figure 25B:
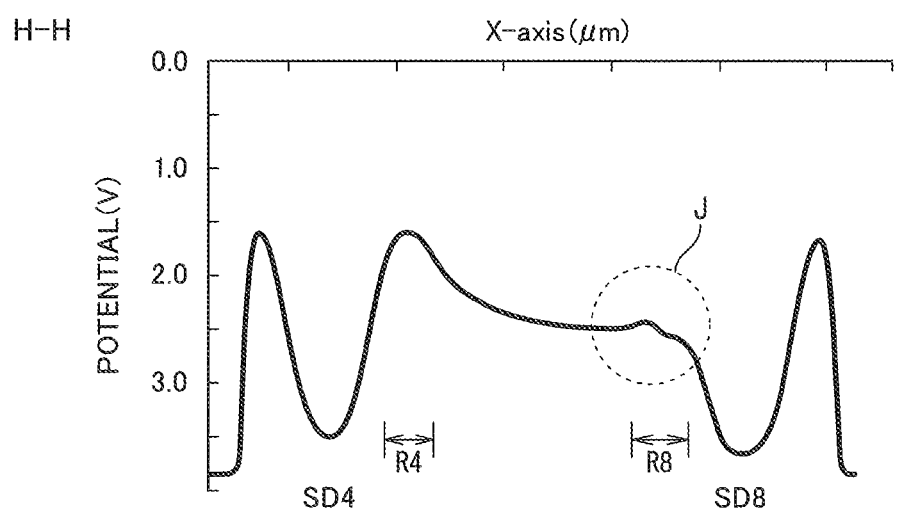
FIG. 25B is a view illustrating a potential profile of the band edge (bottom) of the conduction band of the photoelectric-conversion element according to the second embodiment, taken from the H-H direction of FIG. 22.
Figure 25C:
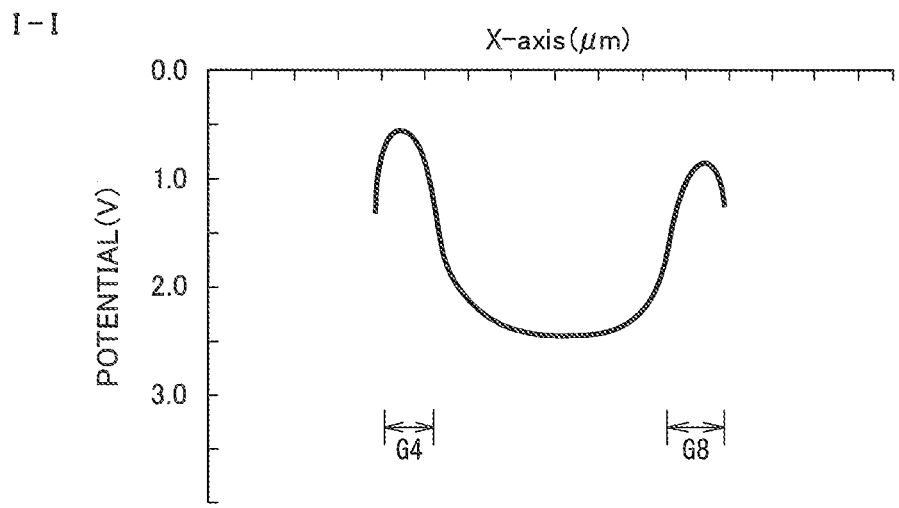
FIG. 25C is a view illustrating a potential profile of the band edge (bottom) of the conduction band of the photoelectric-conversion element according to the second embodiment, taken from the I-I direction of FIG. 22.

In FIG. 25, there are illustrated the potentials at the time of the transfer of the charges to the seventh charge-accumulation region SD7 when L=−1.0 volt, M=0.0 volt, H=1.5 volts, and V=2.3 volts are satisfied for the first potential level L, the second potential level M, the third potential level H, and the fourth potential level V. As illustrated in FIG. 25A, the gate of the seventh charge-transfer channel R7 is opened, and the charges are transferred to the seventh charge-accumulation region SD7. The transfer time in this case is 0.26 nanosecond. Further, as illustrated in FIG. 25B, at the position of the eighth charge-transfer channel R8, a barrier for blocking the transfer of the charges is constructed. In the broken-line circle denoted with the symbol "J," a portion slightly protruding upward is illustrated as the barrier. Further, in FIG. 25C, the potential under the fourth field-control electrode G4 and the eighth field-control electrode G8 are illustrated.

As compared to the case where the MOS structure of the earlier technology is used to control the potential just under the gate electrodes in the vertical direction, the photoelectric-conversion element explained in the first embodiment uses the scheme of the electric field control by the static induction effect, which occurs in the direction orthogonal to the charge-transfer channels. Thus, the electric field is maintained substantially constant over the long charge-transfer channels, and the signal charges are transported at a high speed while maintaining symmetry. Further, in the photoelectric-conversion element according to the second embodiment, the light receiving region PD having a substantially octagonal shape in a planar pattern is provided, and the octuple charge-transfer channels, which have the center axes extending radially from the center of the light receiving region PD, are delineated. Substantially the same as the first embodiment, the octuple charge-transfer channels are delineated to have the same shape in a symmetric manner. Thus, a total measurement time can be shortened. In addition, the eight-tap LEF-control photoelectric-conversion element capable of achieving both the large light receiving region PD and the high-speed transfer of the charges can be provided. The other technical advantages that can be achieved by the photoelectric-conversion element according to the second embodiment are substantially the same as those of the photoelectric-conversion element explained in the first embodiment. Further, similarly to the case of the photoelectric-conversion element explained in the first embodiment, the solid-state image sensor can be built through use of the photoelectric-conversion element according to the second embodiment.

First Modification in Second Embodiment

Figure 26:
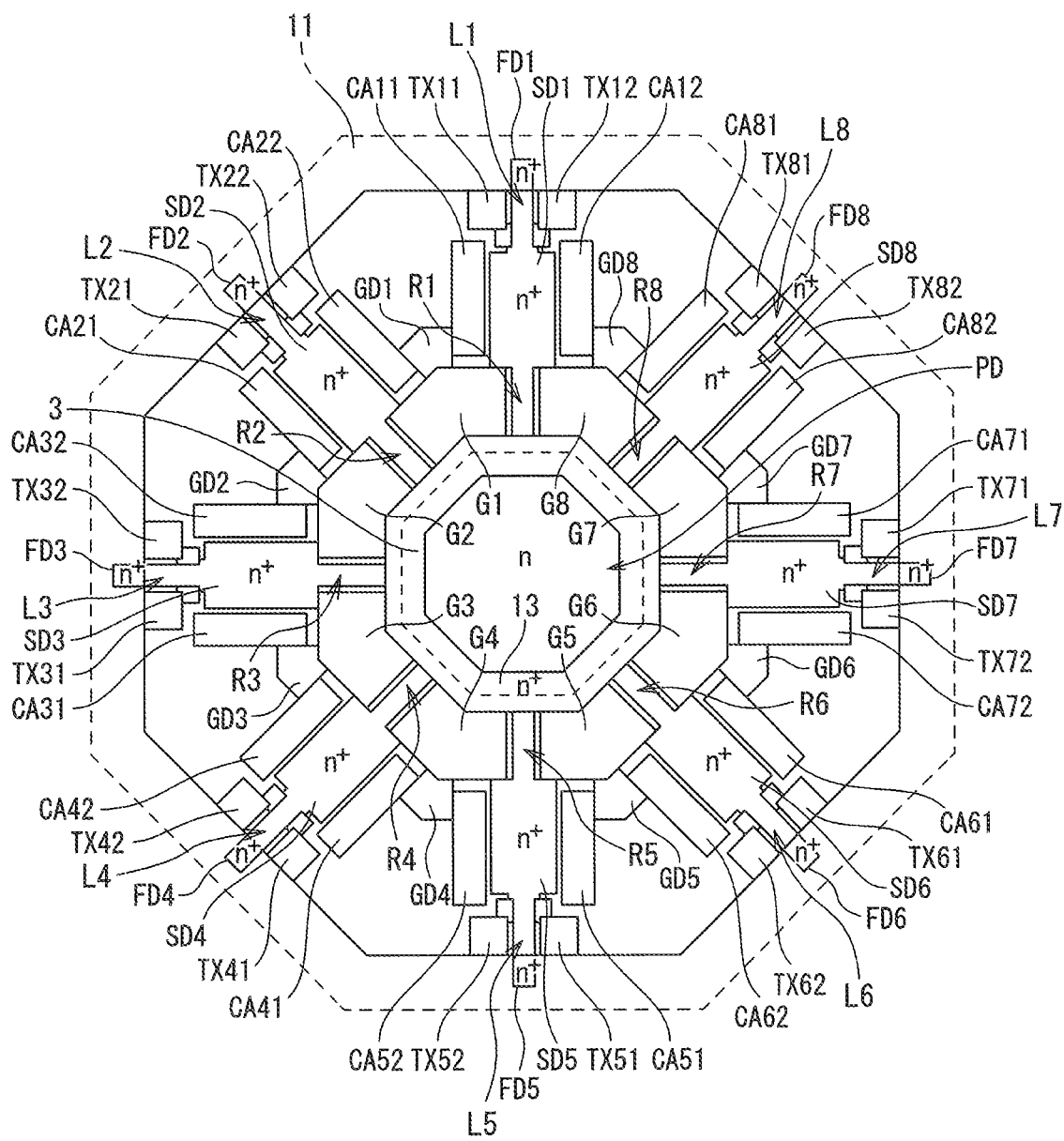
FIG. 26 is a schematic plan view (top view) for illustrating an outline of a photoelectric element according to a first modification of the second embodiment of the present invention.
Figure 27:
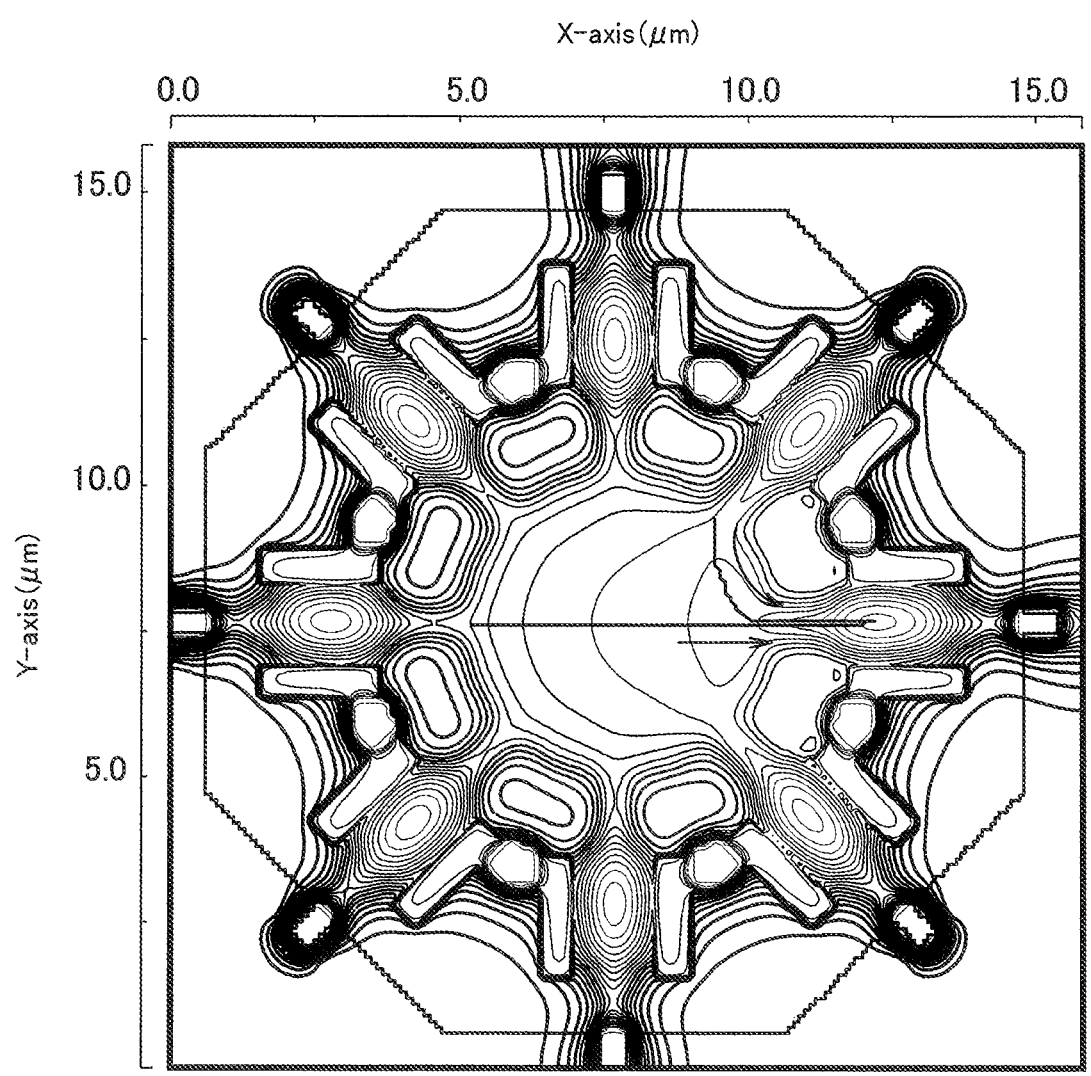
FIG. 27 is a view illustrating an equipotential line in an X-Y plane viewed from above an image-capturing region of the photoelectron conversion element according to the first modification of the second embodiment and a charge-transport path of electrons, which is set by a potential profile of the equipotential line.

As illustrated in FIG. 26, in the photoelectric-conversion element according to the first modification of the second embodiment, the light receiving region PD includes the surface buried region 3 on the inner side and the guide region 13 having a doughnut-like shape on the outer side of the surface buried region 3, and the subjacent-gate charge-exhaust regions GD1, GD2, GD3, . . . , and GD8 are included on the radially outer side of the first field-control electrode G1, the second field-control electrode G2, the third field-control electrode G3, . . . , and the eighth field-control electrode G8. That is, the photoelectric-conversion element according to the first modification of the second embodiment corresponds to a configuration obtained by combining the structure, in which the photoelectric-conversion element includes the n-type guide region 13 having high impurity concentration as illustrated in FIG. 22, and the structure, in which the octuple subjacent-gate charge-exhaust regions GD1, GD2, GD3, . . . , and GD8 are provide on the outer sides of the first field-control electrode G1, the second field-control electrode G2, the third field-control electrode G3, . . . , and the eighth field-control electrode G8 as illustrated in FIG. 20. Substantially the same as the planar layout illustrated in FIG. 20, the subjacent-gate charge-exhaust regions GD1, GD2, GD3, . . . , and GD8 includes the octuple charge-transfer channels R1, R2, R3, . . . , and R8, each of which extends radially, and are provided at the positions being sandwiched by the adjacent charge-transfer channels in the vertical direction. In FIG. 27, there is illustrated an equipotential line in the entire X-Y plane obtained by performing a simulation of transferring the charges to the seventh charge-accumulation region SD7 by adopting the layout topology of the octuple-output photoelectric-conversion element.

Figure 28:
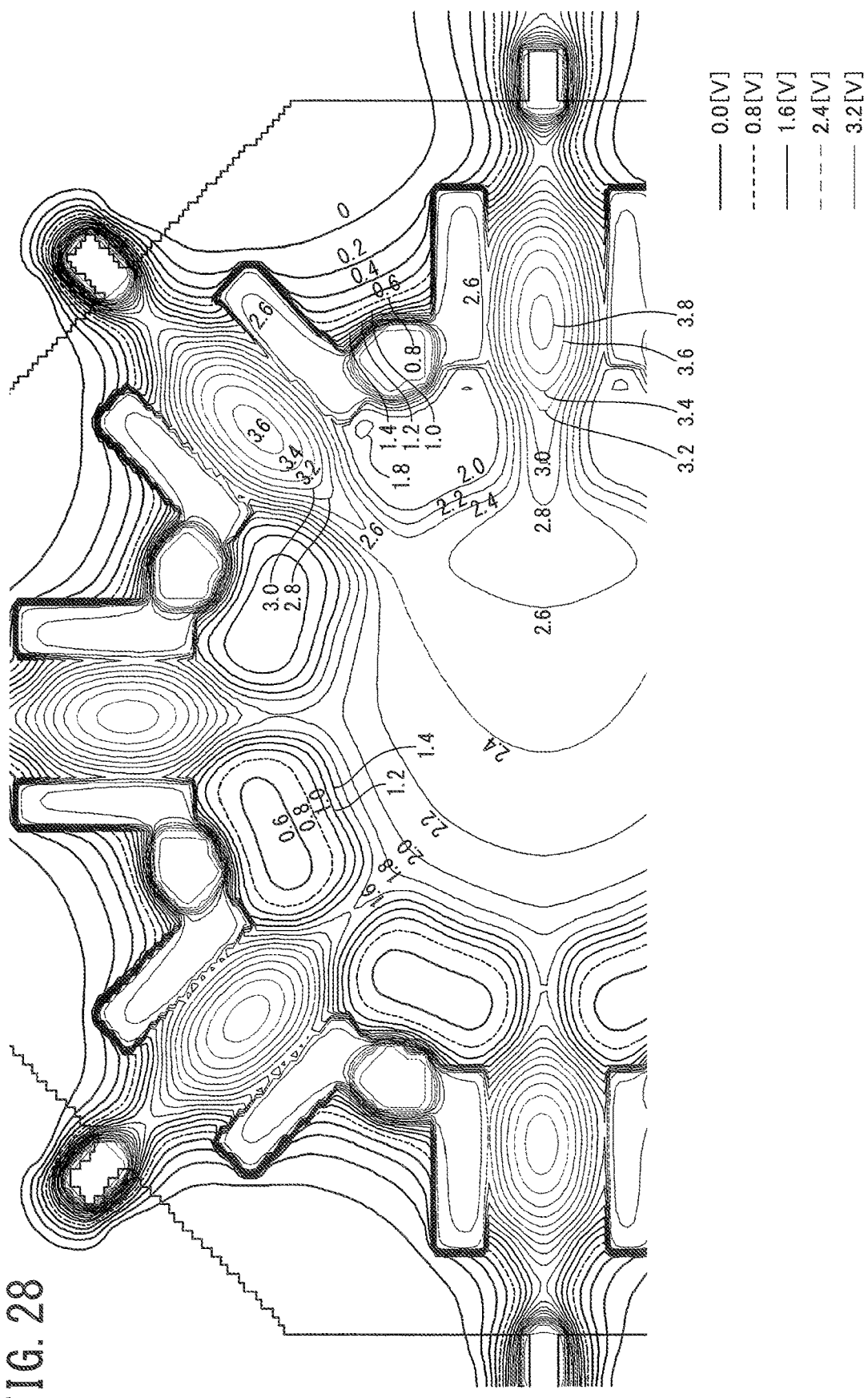
FIG. 28 is a view illustrating a part of the equipotential line of FIG. 27 in an enlarged manner.

In FIG. 27, there are schematically illustrated a trajectory in which the signal charges generated at a position near the third charge-transfer channel R3 in the light receiving region PD by photoelectric conversion are transferred to the seventh charge-accumulation region SD7 in a right direction in a substantially horizontal manner, and another trajectory in which the signal charges generated at a position near the eighth charge-transfer channel R8 are transferred obliquely downward to the seventh charge-accumulation region SD7 in an arc shape. Further, FIG. 28 is an enlarged view of the area on the upper side of the equipotential line illustrated in FIG. 27. That is, in FIG. 28, the left side is a potential profile including the third charge-accumulation region SD3 of the third charge-transfer channel R3, and the right side is a potential profile including the seventh charge-accumulation region SD7 of the seventh charge-transfer channel R7. Further, in the planar pattern, the upper side of the center of FIG. 28 is a potential profile of the first charge-transfer channel R1.

Figure 29:
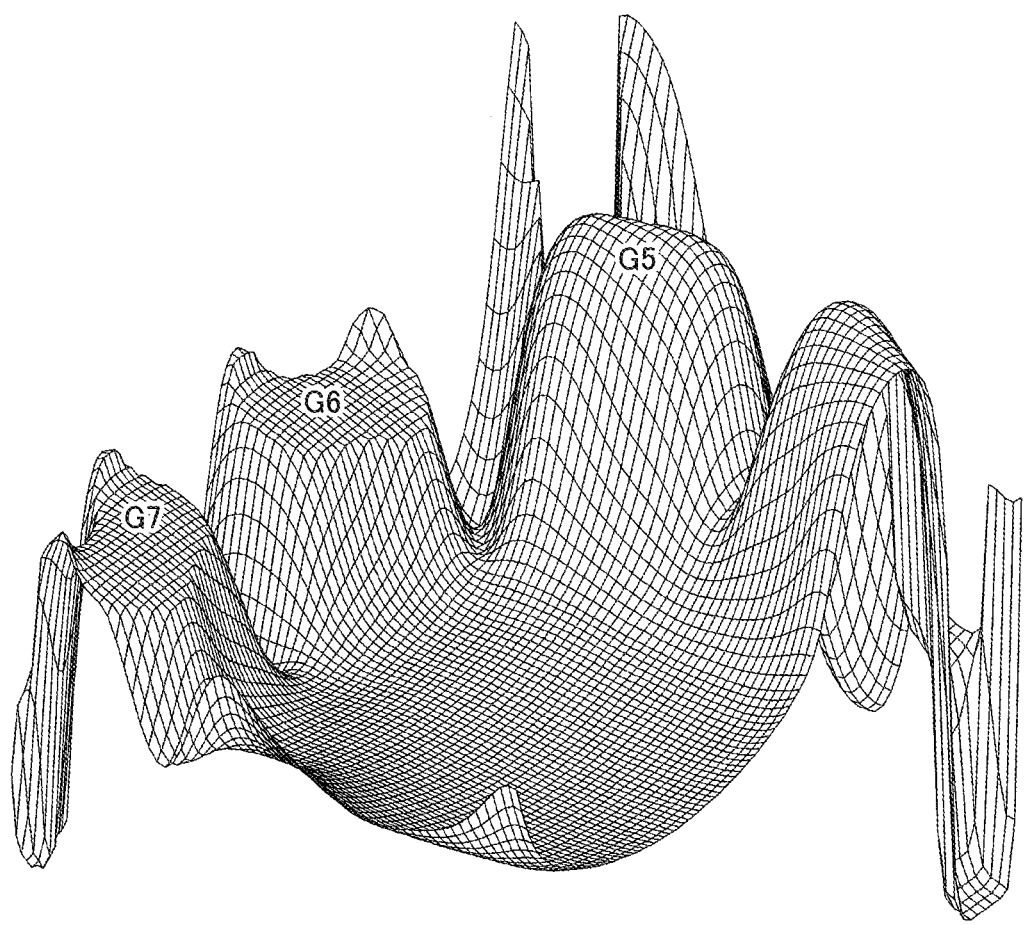
FIG. 29 is a view illustrating, in a three-dimensional mesh structure, a potential profile of the band edge (bottom) of the conduction band of the photoelectric-conversion element according to the first modification of the second embodiment.

As illustrated in FIG. 28, in a whole area, the deepest potential is generated in the seventh charge-accumulation region SD7. Furthermore, the potential states in the periphery of the fifth field-control electrode G5, the sixth field-control electrode G6, and the seventh field-control electrode G7, which are arranged on the lower-right side in FIG. 26 and FIG. 27 are schematically illustrated in FIG. 29. As illustrated in the potential profile in the three-dimensional mesh structure of FIG. 29, the valley region between the sixth field-control electrode G6 and the seventh field-control electrode G7, which define the seventh charge-transfer channel R7, has the deepest potential in the whole area. Substantially the same as the photoelectric-conversion element illustrated in FIG. 22 to FIG. 25, the photoelectric-conversion element according to the first modification of the second embodiment also achieves an effectiveness of shortening a total measurement time, and achieves both the large light receiving region PD and the high-speed transfer.

Second Modification in Second Embodiment

Figure 30:
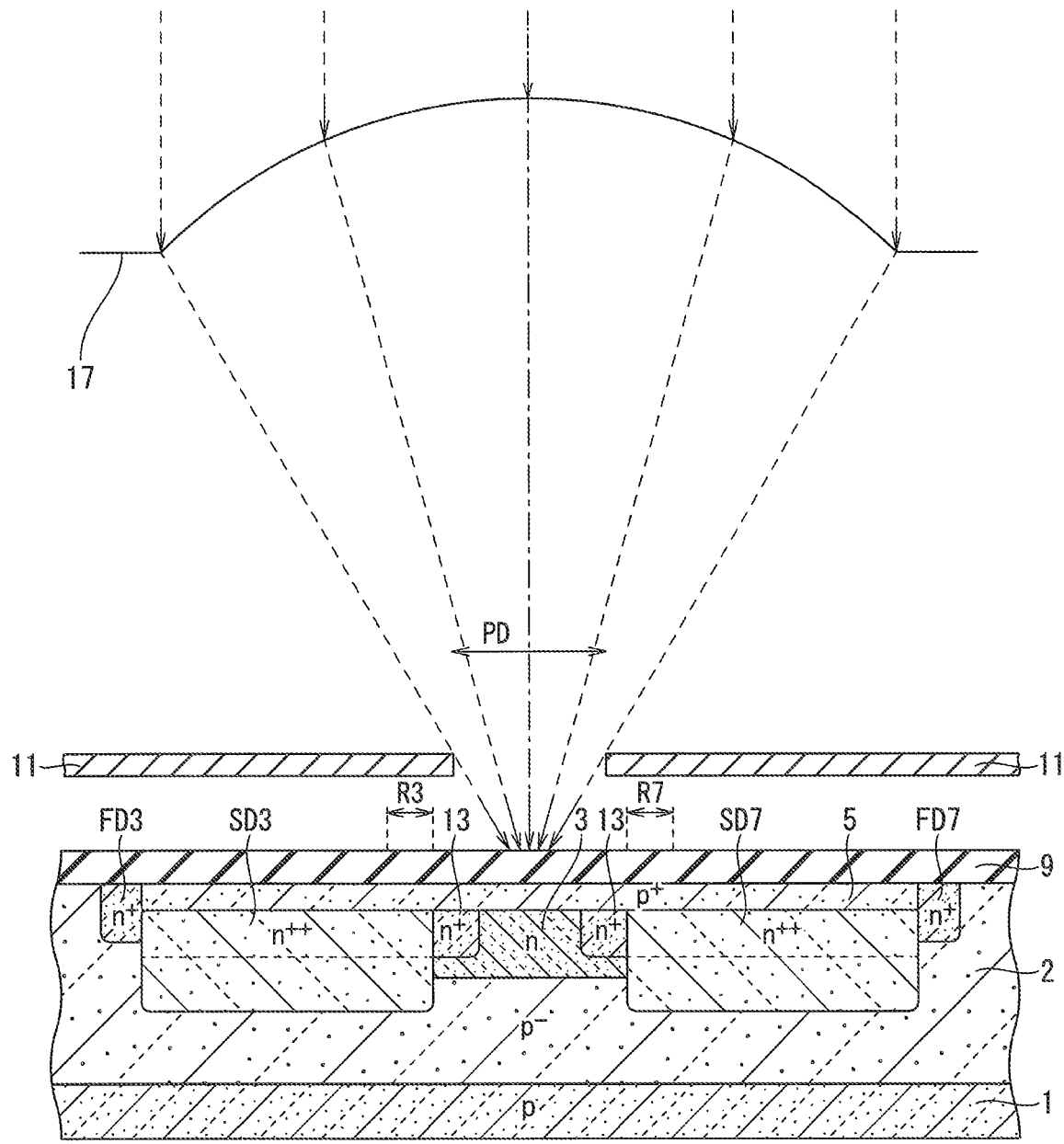
FIG. 30 is a schematic cross-sectional view illustrating an outline structure of a photoelectric element according to a second modification of the second embodiment of the present invention.

In the solid-state image sensor including the photoelectric-conversion element according to the second embodiment, a microlens 17 may be provided above the shielding plate 11 as illustrated in FIG. 30. The microlens 17 converges light from a target to cause the light to enter the light receiving region PD. By causing the light to enter through the microlens 17, the opening ratio can be improved. Accordingly, the sensitivity of the solid-state image sensor can be improved.

Substantially the same as the photoelectric-conversion element illustrated in FIG. 22 to FIG. 25, the photoelectric-conversion element according to the second modification of the second embodiment also achieves an effectiveness of shortening a total measurement time, and achieves both the large light receiving region PD and the high-speed transfer. Note that, the microlens is not limited to a single layer structure illustrated in FIG. 30 and may have a complex structure having double or more layers and be combined with the photoelectric-conversion element. With complex structure of the microlens, a finer and finer miniaturization of the photoelectric-conversion element with minute patterns can be achieved.

Third Modification in Second Embodiment

Figure 31:
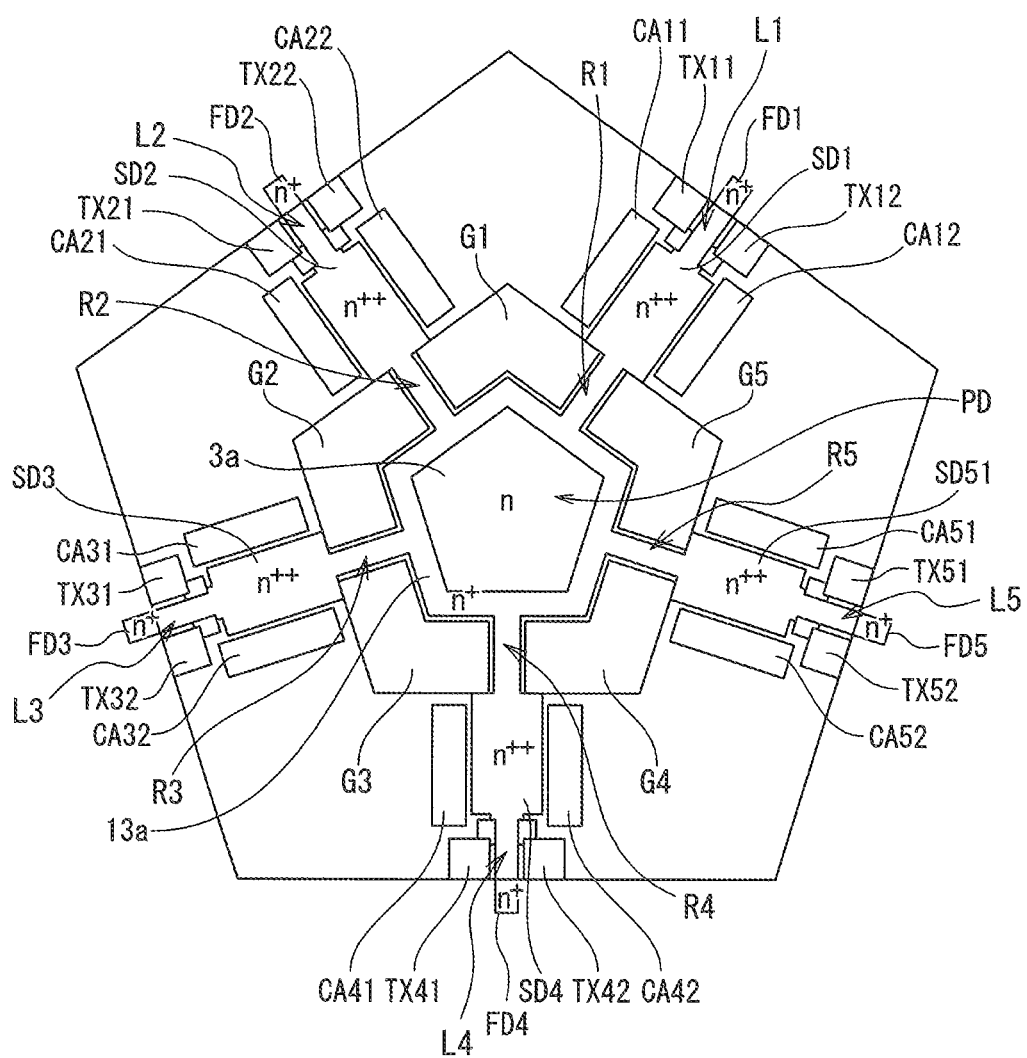
FIG. 31 is a schematic plan view (top view) for illustrating an outline of a photoelectric element according to a third modification of the second embodiment of the present invention.

In FIG. 1 to FIG. 30, the eight-tap LEF-control photoelectric-conversion element is illustrated. However, the present invention is not limited to the eight-tap LEF-control photoelectric-conversion element, and the charge transfer channels can be provided at quintuple or more positions away from the light receiving region PD. In FIG. 31, there is illustrated a five-tap the LEF-control photoelectric-conversion element in a third modification of the second embodiment, the five-tap the LEF-control photoelectric-conversion element includes the surface buried region 3a having a regular pentagonal shape in a planar pattern on the inner side and a guide region 13a having an outer contour of a substantially regular octagonal doughnut-like shape, which is provided on the outer side of the surface buried region 3a.

Substantially the same as the case of the photoelectric-conversion element described with reference to FIG. 1 to FIG. 30, also in the photoelectric-conversion element in the third modification of the second embodiment, one charge-accumulation region among the first charge-accumulation region SD1, the second charge-accumulation region SD2, the third charge-accumulation region SD3, . . . , and the fifth charge-accumulation region SD5 is used as a charge-exhaust region. In this manner, a quadruple-output photoelectric-conversion element can be achieved. Substantially the same as the photoelectric-conversion element illustrated in FIG. 22 to FIG. 25, the photoelectric-conversion element according to the third modification of the second embodiment also achieves an effectiveness of shortening a total measurement time, and achieves both the large light receiving region PD and the high-speed transfer.

Fourth Modification in Second Embodiment

Figure 32:
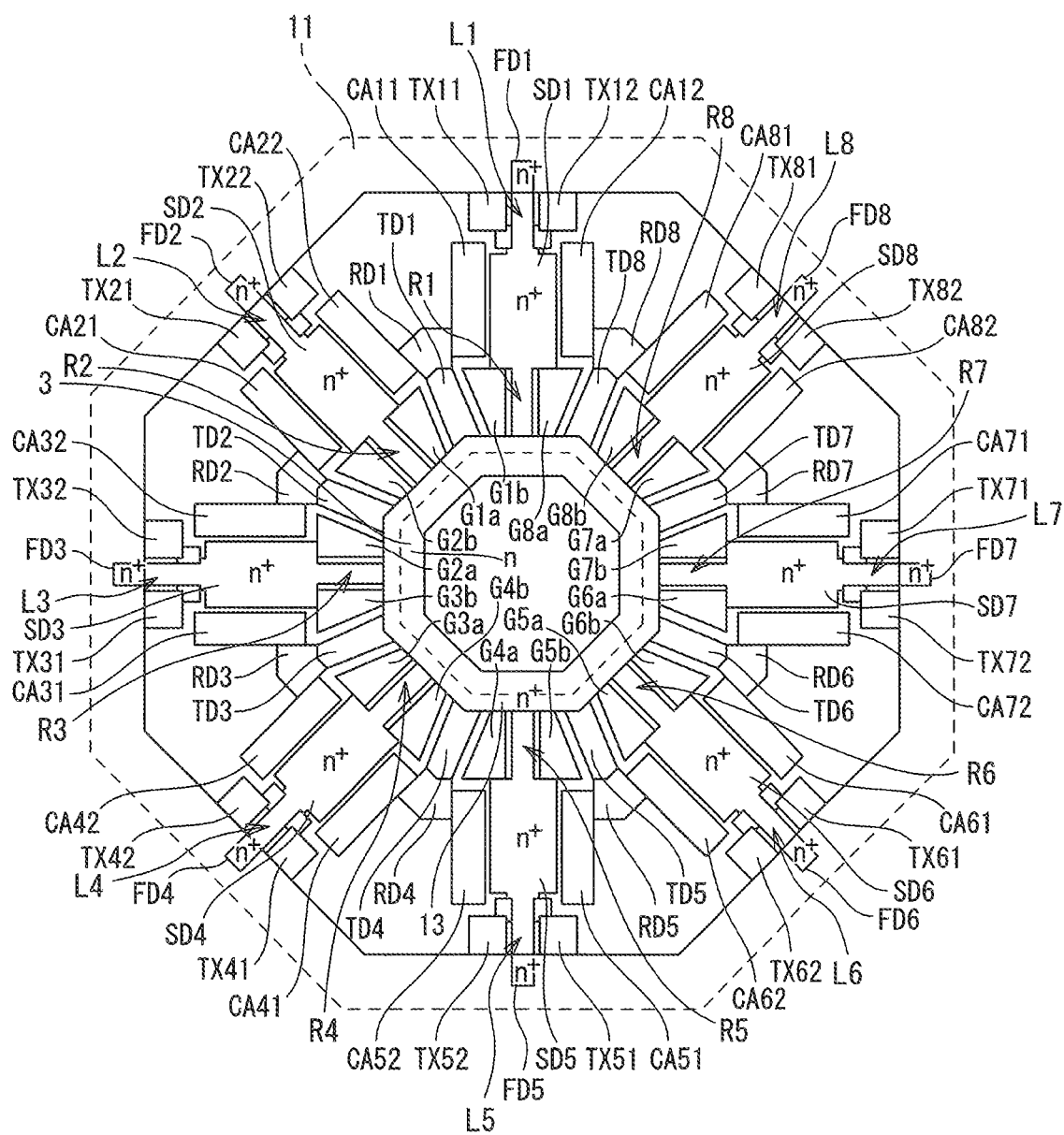
FIG. 32 is a schematic plan view (top view) for illustrating an outline of a photoelectric element according to a fourth modification of the second embodiment of the present invention.

As illustrated in FIG. 32, a photoelectric-conversion element according to a fourth modification of the second embodiment includes sixteen field-control electrodes G1$a$, G2$a$, G3$a$, . . . , G8$a$, G1$b$, G2$b$, G3$b$, . . . , and G8$b$ on the outer side of the light receiving region PD, substantially the same as the configuration illustrated in FIG. 20. Between the field-control electrode G8$a$ and the field-control electrode G1$b$, the first charge-transfer channel R1 is defined. Further, between the field-control electrode G1$a$ and the field-control electrode G2$b$, the second charge-transfer channel R2 is defined. Between the field-control electrode G2$a$, and the field-control electrode G3$b$, the third charge-transfer channel R3 is defined. Between the field-control electrode G3$a$ and the field-control electrode G4$b$, the fourth charge-transfer channel R4 is defined. Further, the field-control electrode G4$a$ and the field-control electrode G5$b$, the fifth charge-transfer channel R5 is defined. Between the field-control electrode G5$a$ and the field-control electrode G6$b$, the sixth charge-transfer channel R6 is defined. Between the field-control electrode G6$a$ and the field-control electrode G7$b$, the seventh charge-transfer channel R7 is defined. Between the field-control electrode G7$a$ and the field-control electrode G8$b$, the eighth charge-transfer channel R8 is defined. As illustrated in FIG. 32, in the photoelectric-conversion element according to the fourth modification of the second embodiment, a first charge-exhaust electrode TD1 is arranged between the field-control electrode G1$b$ and the field-control electrode G1$a$, which are adjacent to each other, with a gap from each other. Further, a second charge-exhaust electrode TD2 is arranged between the field-control electrode G2$b$ and the field-control electrode G2$a$, which are adjacent to each other, with a gap from each other. A third charge-exhaust electrode TD3 is arranged between the field-control electrode G3$b$ and the field-control electrode G3$a$, which are adjacent to each other. A fourth charge-exhaust electrode TD4 is arranged between the field-control electrode G4$b$ and the field-control electrode G4$a$, which are adjacent to each other. Further, a fifth charge-exhaust electrode TD5 is arranged between the field-control electrode G5$b$ and the field-control electrode G5$a$, which are adjacent to each other. A sixth charge-exhaust electrode TD6 is arranged between the field-control electrode G6$b$ and the field-control electrode G6$a$, which are adjacent to each other. A seventh charge-exhaust electrode TD7 is arranged between the field-control electrode G7$b$ and the field-control electrode G7$a$, which are adjacent to each other. An eighth charge-exhaust electrode TD8 is arranged between the field-control electrode G8$b$ and the field-control electrode G8$a$, which are adjacent to each other.

A first charge-exhaust region RD1 is arranged on a radially outer end of the first charge-exhaust electrode TD1 between radially extending directions of the field-control electrode G1$b$ and the field-control electrode G1$a$, which are adjacent to each other. Further, a second charge-exhaust region RD2 is arranged on a radially outer end of the second charge-exhaust electrode TD2 between radially extending directions of the field-control electrode G2$b$ and the field-control electrode G2$a$, which are adjacent to each other. A third charge-exhaust region RD3 is arranged on a radially outer end of the third charge-exhaust electrode TD3 between radially extending directions of the field-control electrode G3$b$ and the field-control electrode G3$a$, which are adjacent to each other. A fourth charge-exhaust region RD4 is arranged on a radially outer end of the fourth charge-exhaust electrode TD4 between radially extending directions of the field-control electrode G4$b$ and the field-control electrode G4$a$, which are adjacent to each other. Further, A fifth charge-exhaust region RD5 is arranged on a radially outer end of the fifth charge-exhaust electrode TD5 between radially extending directions of the field-control electrode G5$b$ and the field-control electrode G5$a$, which are adjacent to each other. A sixth charge-exhaust region RD6 is arranged on a radially outer end of the sixth charge-exhaust electrode TD6 between radially extending directions of the field-control electrode G6$b$ and the field-control electrode G6$a$, which are adjacent to each other. A seventh charge-exhaust region RD7 is arranged on a radially outer end of the seventh charge-exhaust electrode TD7 between radially extending directions of the field-control electrode G7$b$ and the field-control electrode G7$a$, which are adjacent to each other. An eighth charge-exhaust region RD8 is arranged on a radially outer end of the eighth charge-exhaust electrode TD8 between radially extending directions of the field-control electrode G8$b$ and the field-control electrode G8$a$, which are adjacent to each other.

By applying the voltage to the sixteen field-control electrodes G1$a$, G2$a$, G3$a$, . . . , G8$a$, G1$b$, G2$b$, G3$b$, . . . , and G8$b$, the gates of the octuple charge-transfer channels R1, R2, R3, . . . , and R8 are controlled to be opened or closed. That is, similarly to the photoelectric-conversion element according to the second modification of the first embodiment, which is illustrated in FIG. 13, the photoelectric element according to the fourth example of the second embodiment includes the sixteen field-control electrodes G1$a$, G2$a$, G3$a$, . . . , G8$a$, G1$b$, G2$b$, G3$b$, . . . , and G8$b$. Thus, the octuple control-electrode pairs can be selected, and the charge-transfer channels R1, R2, R3, . . . , and R8 can be selected. At the same time, the charges ascribable to background-light can be exhausted at a desired timing by the eight charge-exhaust electrodes TD1, TD2, TD3, . . . , and TD8 for controlling the exhaust of the charges ascribable to background-light, separately. Substantially the same as the photoelectric-conversion element illustrated in FIG. 22 to FIG. 25, the photoelectric-conversion element according to the fourth modification of the second embodiment also achieves an effectiveness of shortening a total measurement time, and achieves both the large light receiving region PD and the high-speed transfer.

Note that, as already described, in FIG. 1 to FIG. 32, it is illustratively described that the photoelectric-conversion element includes the auxiliary electrodes CA11, CA21, CA31, . . . , CA81, CA12, CA22, CA32, . . . , and CA82. However, it should be noted that the configuration illustrated in FIG. 1 to FIG. 32 may be optional for the present invention depending on, for example, purposes of the application of the photoelectric-conversion element. Further, in FIG. 1 to FIG. 32, the case where the photoelectric-conversion element includes the charge-accumulation regions SD1 to SD8, but the charge-accumulation regions are optional. Without using the charge-accumulation regions, the present invention can be carried out by using the field-control electrodes so as to control the charge-transfer channels and distribute the charges directly to the respective charge read-out regions. Further, the partial structures of the photoelectric-conversion element illustrated in FIG. 1 to FIG. 32 may be combined with each other.

Charge-Accumulation Element

In the description in the first and second embodiments, the photoelectric-conversion element includes the quintuple or more charge-accumulation elements for sending the charges to the charge read-out regions via the charge-transfer channels. Now, more specific description is made of a structure of a charge-accumulation element applicable to the photoelectric-conversion element according to the first and second embodiments. First, attention is focused on the charge-accumulation element, which is poisoned on the right side of the photoelectric-conversion element explained in the first embodiment illustrated in FIG. 1 and includes a path extending from the charge-transfer channel R7 to the charge read-out region FD7.

Figure 33:
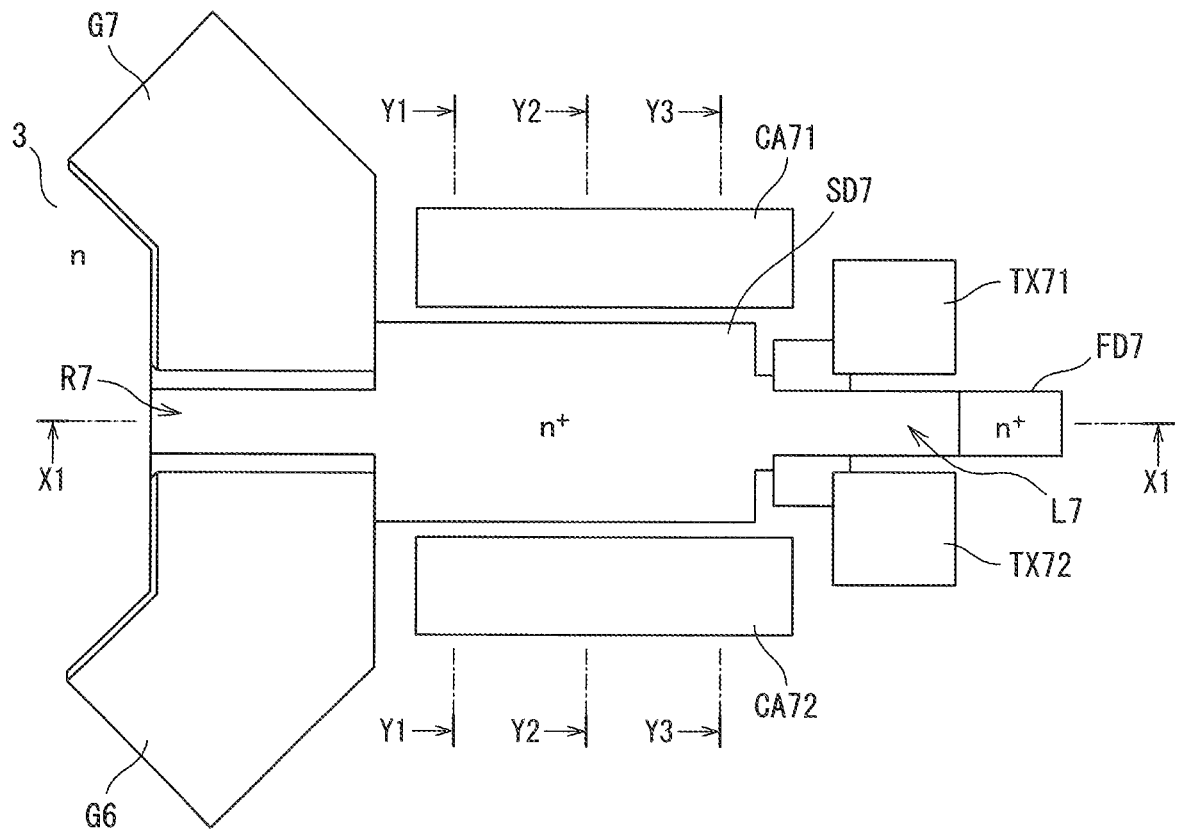
FIG. 33 is a schematic plan view (top view) for illustrating a charge-accumulation element included in the photoelectric-conversion element according to the first and second embodiments.

As illustrated in the plan view of FIG. 33, the cross-sectional view of FIG. 2 and the like, the charge-accumulation element includes the first conductivity type (p-type) element-allocating layer 2, the second conductivity type (n-type) surface buried region 3, the n-type charge-accumulation region SD7, the n-type charge read-out region FD7, the field-control electrodes G6 and G7, and the auxiliary electrodes CA71 and CA72. The surface buried region 3 is provided in the upper portion of the element-allocating layer 2, and implements a charge-supply region. The charge-accumulation region SD7 has an input side connected to the surface buried region 3 and impurity concentration higher than that of the surface buried region 3. The charge read-out region FD7 is connected to the output side of the charge-accumulation region. SD7, and has impurity concentration higher than that of the charge-accumulation region SD7. The field-control electrodes G6 and G7 are opposingly arranged to be paired on both the sides of the charge-transfer channel R7 defined on the input side of the charge-accumulation region SD7, and controls the depletion potentials of the charge-transfer channel R7 by lateral static induction effect, which introduce the signal charges from the surface buried region 3 to the charge-accumulation region SD7. The auxiliary electrodes CA71 and CA72 are adjacent to the field-control electrodes G6 and G7 and positioned on the output side with respect to the charge-transfer channel R7. The auxiliary electrodes CA71 and CA72 are opposingly arranged to be paired on both sides of the charge-accumulation region SD7, and controls the depletion potentials of the charge-accumulation region SD7 by lateral static induction effect. With the potentials to be applied to the auxiliary electrodes CA71 and CA72, the amount of the signal charges to be accumulated in the charge-accumulation region SD7 is expanded. The charge-accumulation element includes the transfer electrodes TX71 and TX72, which are provided on the output side of the charge-accumulation region SD7 and transfer the signal charges accumulated in the charge-accumulation region SD7 to the charge read-out region FD7. The charge read-out region serves as a destination region to which the charges are transferred. The field-control electrode serves as an input control electrode, being a region for controlling the potential on the input side. The transfer electrode serves as an output control electrode, being a region for controlling the potential on the output side.

The charge-accumulation element includes a couple of charge-augmentation electrode pair (CA71 and CA72) being capacitance-enlarging electrodes for enlarging the capacitance. Each of the auxiliary electrodes CA71 and CA72 implementing the couple of charge-augmentation electrode pair (CA71 and CA72) is a substantially rectangular shape in a planar pattern as illustrated in FIG. 33. The auxiliary electrodes CA71 and CA72 extend to the seventh charge read-out region FD7 side in parallel to the rectangular seventh charge-accumulation region SD7 with a slight gap from the seventh charge-accumulation region SD7. Further, the auxiliary electrodes CA71 and CA72 are arranged with a slight gap from the sixth field-control electrode G6 and the seventh field-control electrode G7. That is, the couple of charge-augmentation electrode pair (CA71 and CA72) is arrayed in a direction orthogonal to the charge moving direction.

The seventh charge-accumulation region. SD7 implementing the charge-accumulation element is a stepped-shape polygon including a first rectangular region and a second rectangular region. The first rectangular region is continuous from the seventh charge-transfer channel R7. The second rectangular region extends from the first rectangular region to the seventh charge read-out region FD7, and has a width smaller than that of the first rectangular region. A length of a long side of the auxiliary electrodes CA71 and CA72 is substantially the same as a length of a long side of the first rectangular region of the seventh charge-accumulation region SD7.

A couple of output-electrode pair (TX71 and TX72) are provided on both the sides of the second rectangular region of the seventh charge-accumulation region SD7 so as to be away from the seventh charge-accumulation region SD7 and the auxiliary electrodes CA71 and CA72. The auxiliary electrodes CA71 and CA72, and the transfer electrodes TX71 and TX72, are provided above the insulator 9. By applying the set control voltage, the couple of charge-augmentation electrode pair (CA71 and CA72) increases the accumulated-charge capacitance in the seventh charge-accumulation region SD7, which is defined along the charge-transport path (accumulation transfer path) sandwiched in between the couple of charge-augmentation electrode pair (CA71 and CA72).

Figure 34:
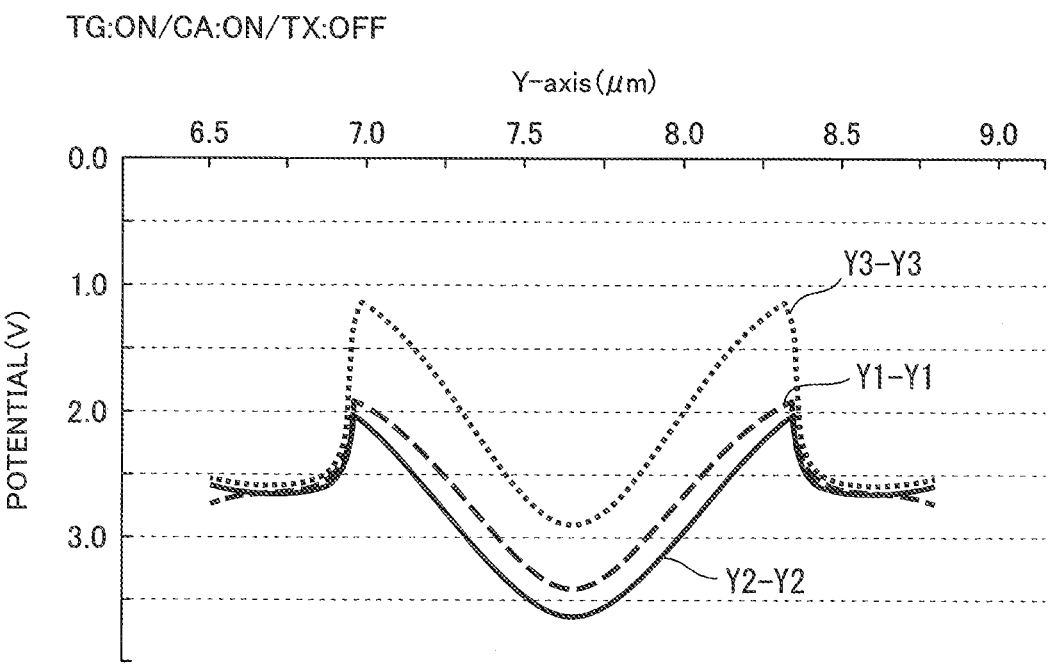
FIG. 34 is a view illustrating potential profiles of electrons of a band edge (bottom) of a conduction band of the charge-accumulation element, Y-axes are taken along cross sections in the Y1-Y1 direction, the Y2-Y2 direction, and the Y3-Y3 direction of FIG. 33.
Figure 35:
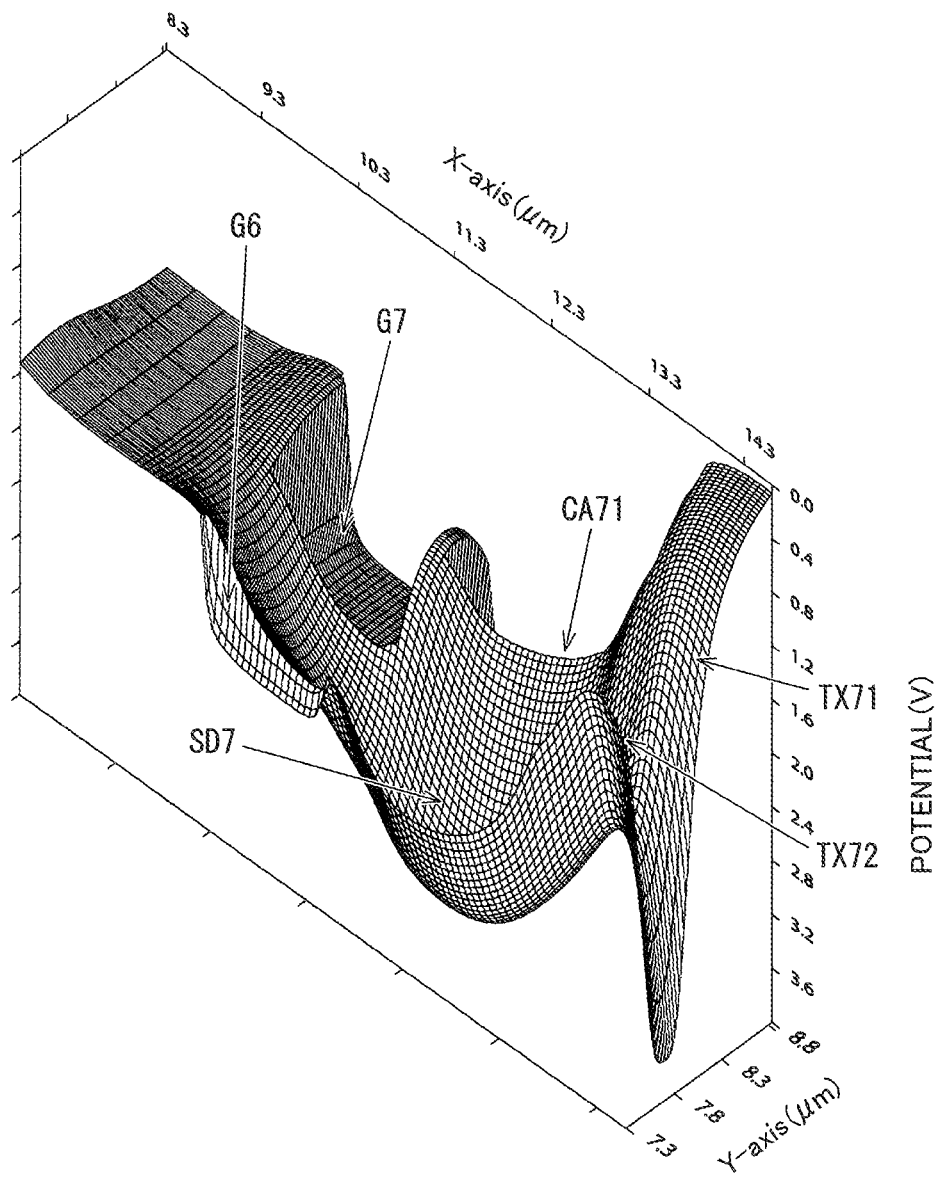
FIG. 35 is a view illustrating, in a three-dimensional mesh structure, a potential profile of electrons of the band edge (bottom) of the conduction band of the charge-accumulation element in the state of FIG. 34.

As illustrated in FIG. 34 and FIG. 35, in a case where couple of the field-control electrode-pair (G6 and G7) is in the ON state, the couple of charge-augmentation electrode pair (CA71 and CA72) is in the ON state, and the couple of the output-electrode pair (TX71 and TX72) is in the OFF state, in the whole area, the potential of the electrons is the deepest at the position in the cross section, taken from the Y2-Y2 direction in the horizontal center of the FIG. 33, along the charge-transport path. The potential is the second deepest at the position in the cross section viewed from the Y1-Y1 direction on the couple of the field-control electrode-pair (G6 and G7) side in FIG. 33 in the charge-transport path. The potential is the shallowest at the position in the cross section viewed from the Y3-Y3 direction on the couple of the output-electrode pair (TX71 and TX72) side in FIG. 33 in the charge-transport path.

Figure 36:
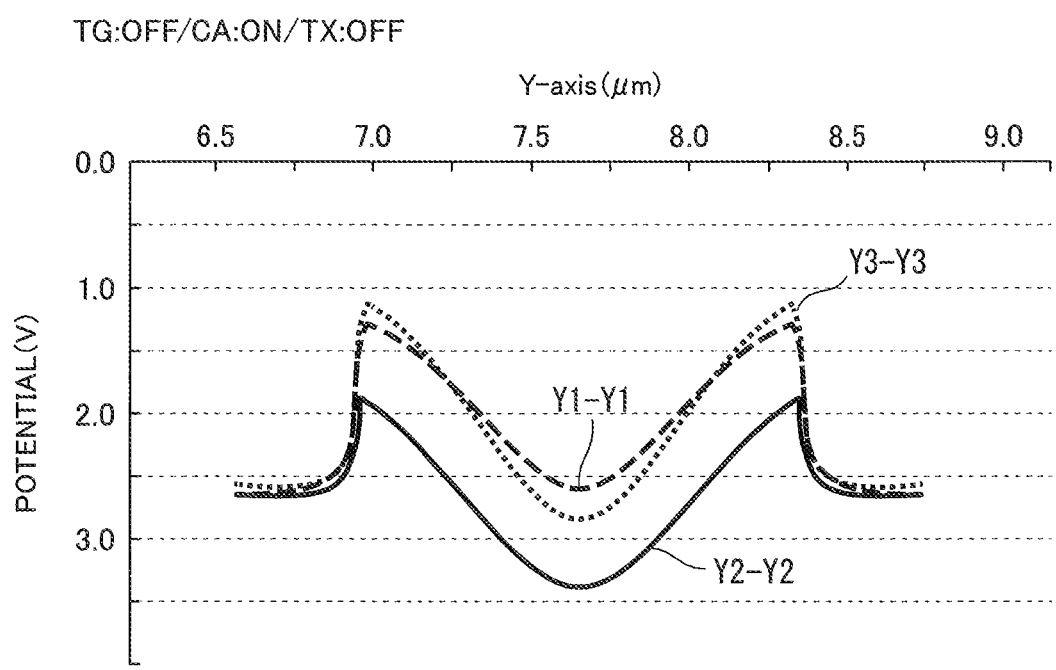
FIG. 36 is a view illustrating potential profiles of electrons of the band edge (bottom) of the conduction band of the charge-accumulation element, Y-axes are taken along cross sections in the Y1-Y1 direction, the Y2-Y2 direction, and the Y3-Y3 direction of FIG. 33.
Figure 37:
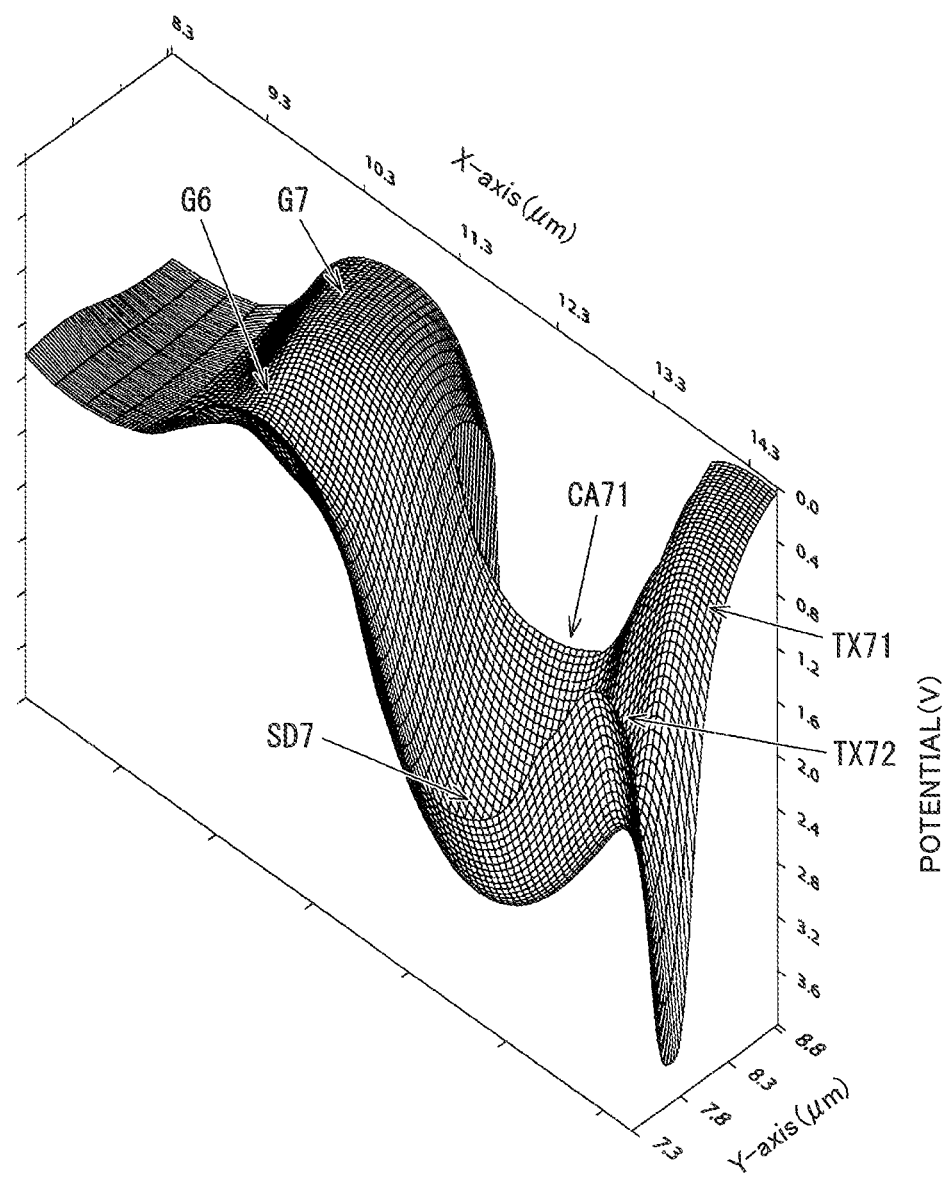
FIG. 37 is a view illustrating, in a three-dimensional mesh structure, a potential profile of electrons of the band edge (bottom) of the conduction band of the charge-accumulation element in the state of FIG. 36.

Further, as illustrated in FIG. 36 and FIG. 37, in a case where the couple of the field-control electrode-pair (G6 and G7) is in the OFF state, the couple of charge-augmentation electrode pair (CA71 and CA72) is in the ON state, and the couple of the output-electrode pair (TX71 and TX72) is in the OFF state, in the whole area, the potential of the electrons is the deepest at the position in the cross section viewed from the Y2-Y2 direction in the center of FIG. 33. The potential at the position in the cross section viewed from the Y3-Y3 direction of FIG. 33 is the second deepest in the center position in the Y direction, but is shallower at the positions on both the ends in the Y direction as compared to the potential at the position in the cross section viewed from the Y1-Y1 direction of FIG. 33.

Figure 38:
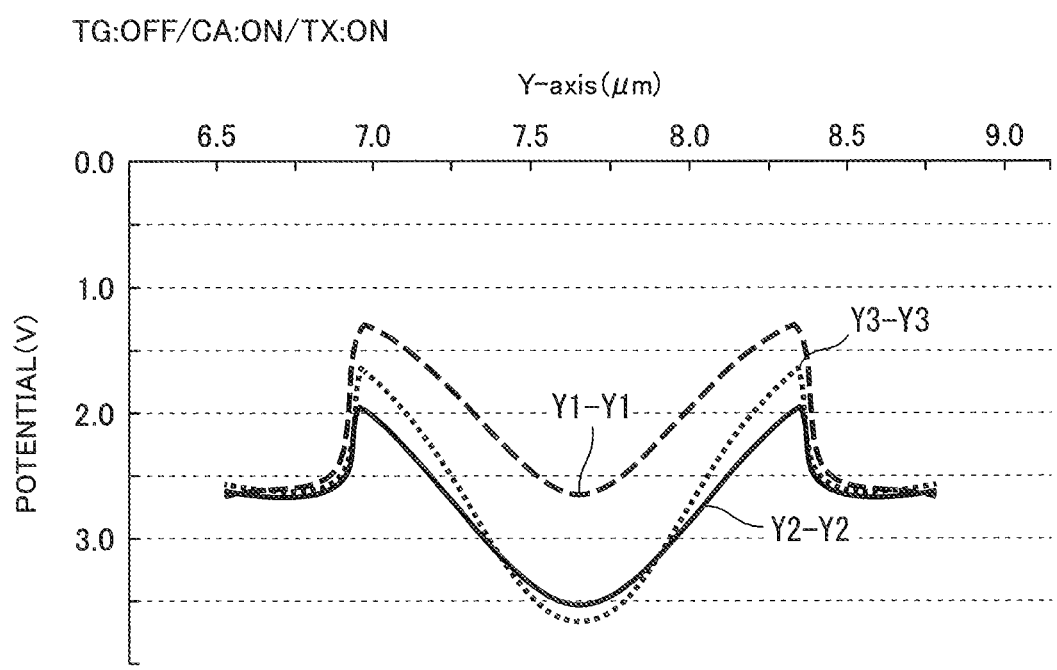
FIG. 38 is a view illustrating potential profiles of electrons of the band edge (bottom) of the conduction band of the charge-accumulation element, Y-axes are taken along cross sections in the Y1-Y1 direction, the Y2-Y2 direction, and the Y3-Y3 direction of FIG. 33.
Figure 39:
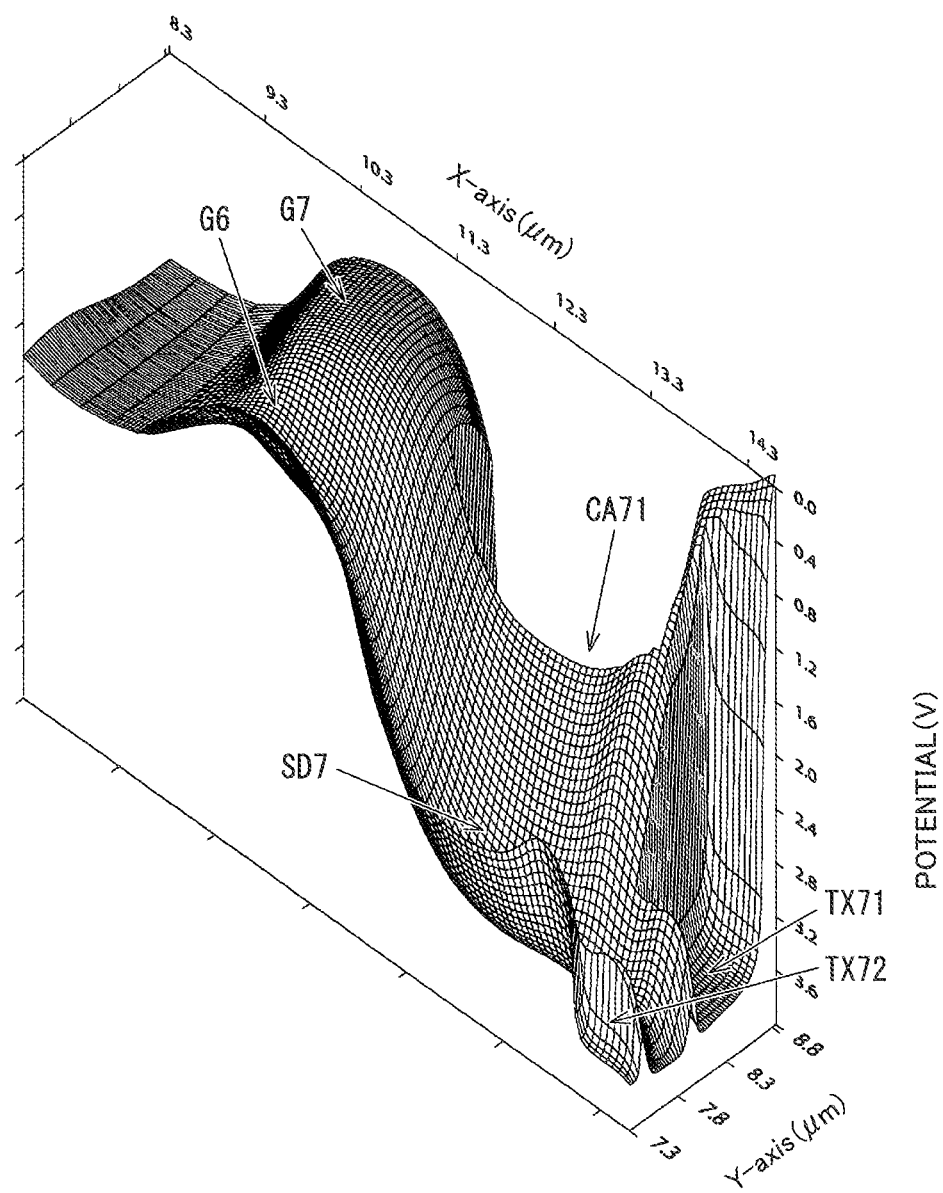
FIG. 39 is a view illustrating, in a three-dimensional mesh structure, a potential profile of electrons of the band edge (bottom) of the conduction band of the charge-accumulation element in the state of FIG. 38.

Further, as illustrated in FIG. 38 and FIG. 39, in a case where the couple of the field-control electrode-pair (G6 and G7) is in the OFF state, the couple of charge-augmentation electrode pair (CA71 and CA72) is in the ON state, and the couple of the output-electrode pair (TX71 and TX72) is in the ON state, in the whole area, the potential of the electrons is the shallowest at the position in the cross section viewed from the Y1-Y1 direction of FIG. 33. The potential at the position in the cross section viewed from the Y3-Y3 direction of FIG. 33 is the deepest at the center position in the Y direction, but is shallower at the position on both the ends in the Y direction as compared to the potential at the position in the cross section viewed from the Y2-Y2 direction of FIG. 33.

Figure 40:
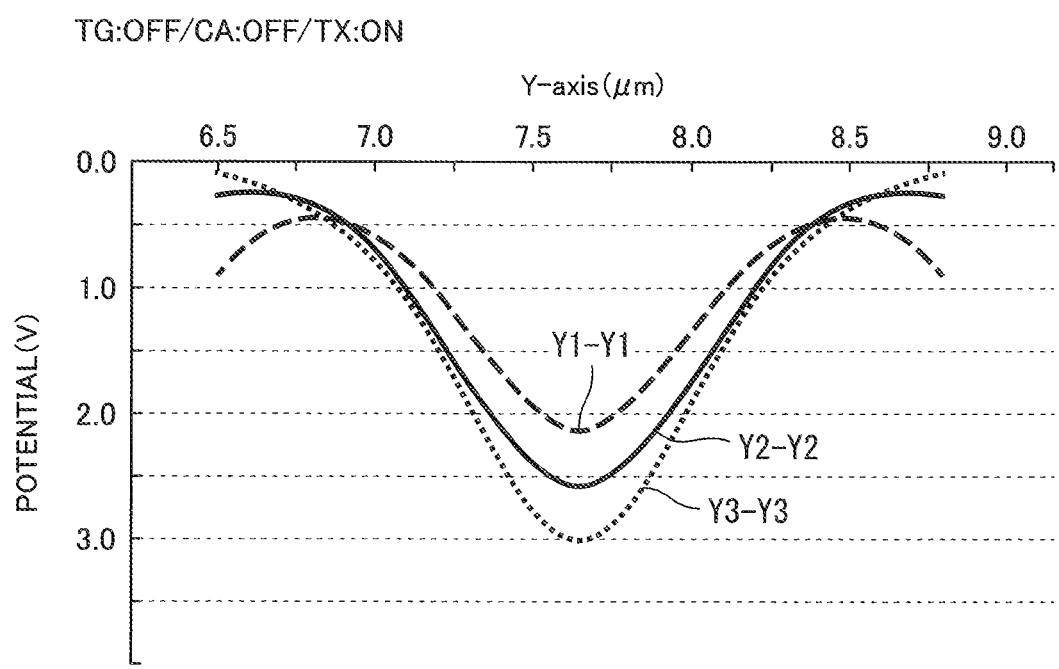
FIG. 40 is a view illustrating potential profiles of electrons of the band edge (bottom) of the conduction band of the charge-accumulation element, Y-axes are taken along cross sections in the Y1-Y1 direction, the Y2-Y2 direction, and the Y3-Y3 direction of FIG. 33.
Figure 41:
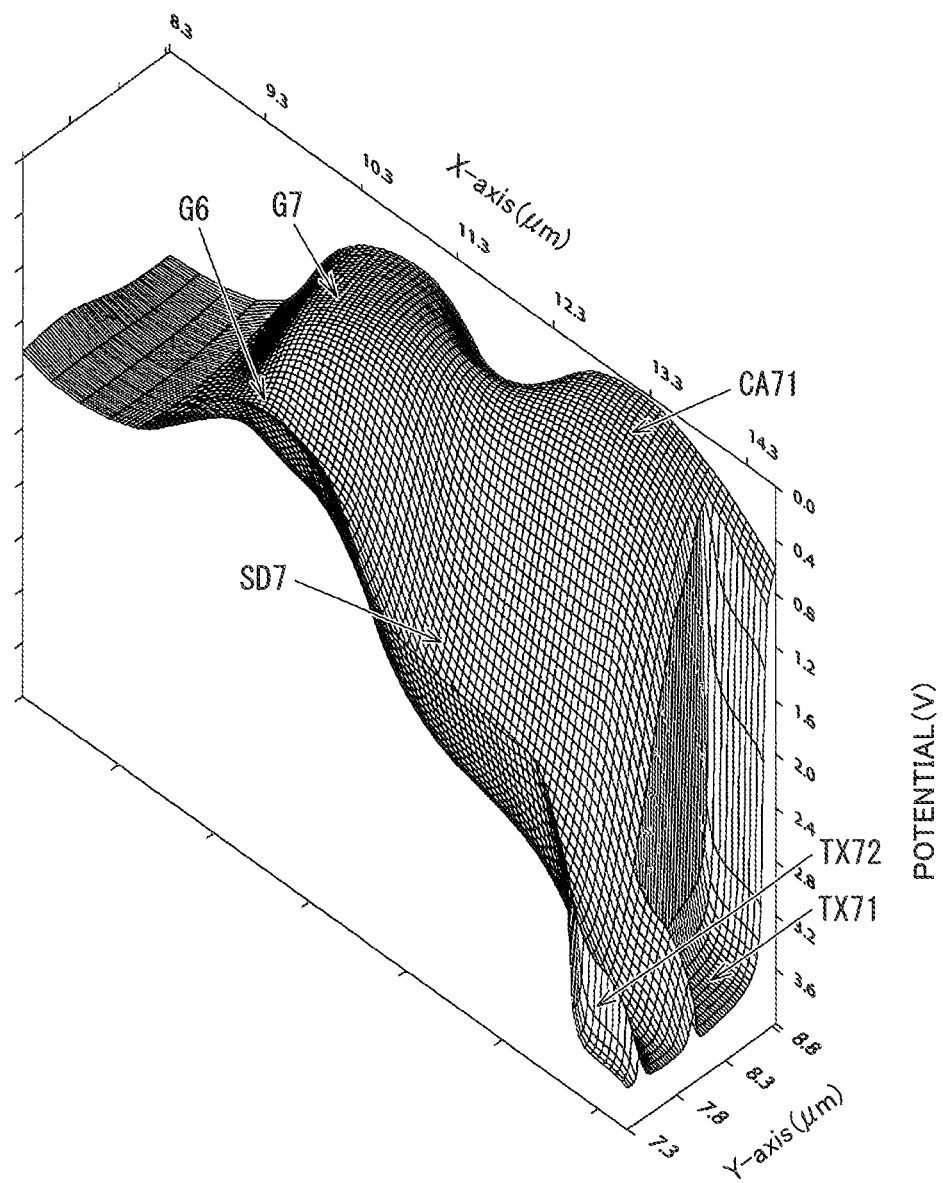
FIG. 41 is a view illustrating, in a three-dimensional mesh structure, a potential profile of electrons of the band edge (bottom) of the conduction band of the charge-accumulation element in the state of FIG. 40.

Further, as illustrated in FIG. 40 and FIG. 41, in a case where the couple of the field-control electrode-pair (G6 and G7) is in the OFF state, the couple of charge-augmentation electrode pair (CA71 and CA72) is in the OFF state, and the couple of the output-electrode pair (TX71 and TX72) is in the ON state, in the whole area, the potential of the electrons are the deepest at the position in the cross section viewed from the Y3-Y3 direction at the center position in the Y direction of FIG. 33. Sequentially, the potential is the second deepest at the position in the cross section viewed from the Y2-Y2 direction of FIG. 33. Lastly, the potential is the third deepest at the position in the cross section viewed from the Y1-Y1 direction of FIG. 33. Meanwhile, the potential at both the end positions in the Y direction of FIG. 33 is the deepest, but the potential becomes deeper in the order of the position in the cross section viewed from the Y1-Y1 direction of FIG. 33, the position in the cross section viewed from the Y2-Y2 direction of FIG. 33, and the position in the cross section viewed from the Y3-Y3 direction of FIG. 33.

Note that, the shape of the auxiliary electrode is not limited to the rectangular shape illustrated in FIG. 33, and may be other shapes such as an oval shape and a polygonal shape, as far as the auxiliary electrode includes a region extending along the seventh charge-accumulation region SD7 and increases the accumulated-charge capacitance in the sandwiched region. The other auxiliary electrodes have the structure equivalent to the structure of the auxiliary electrodes CA71 and CA72.

Operation of Charge-Accumulation Element

Figure 42:
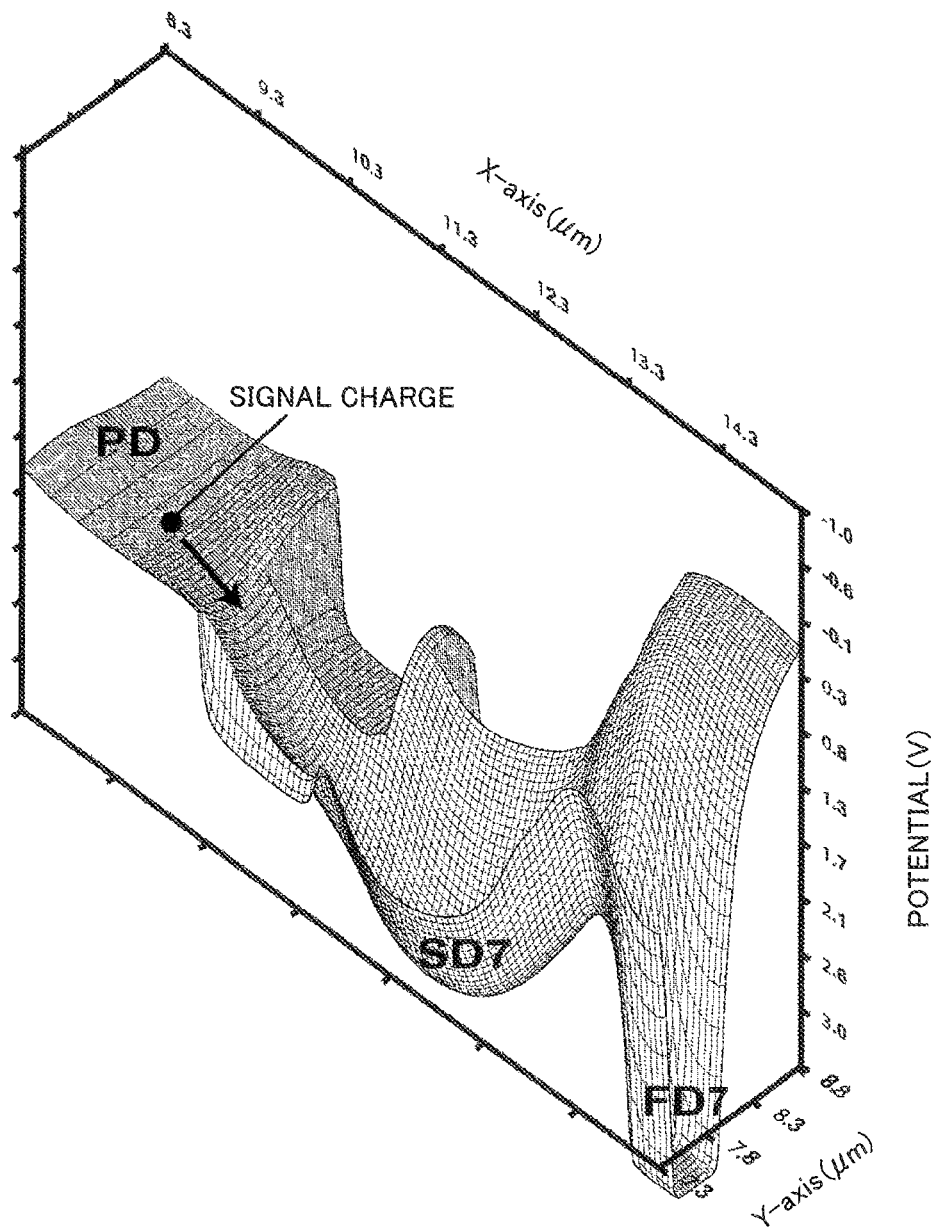
FIG. 42 is a view illustrating, in a three-dimensional mesh structure, a potential profile of electrons of the band edge (bottom) of the conduction band of the charge-accumulation element.
Figure 43:
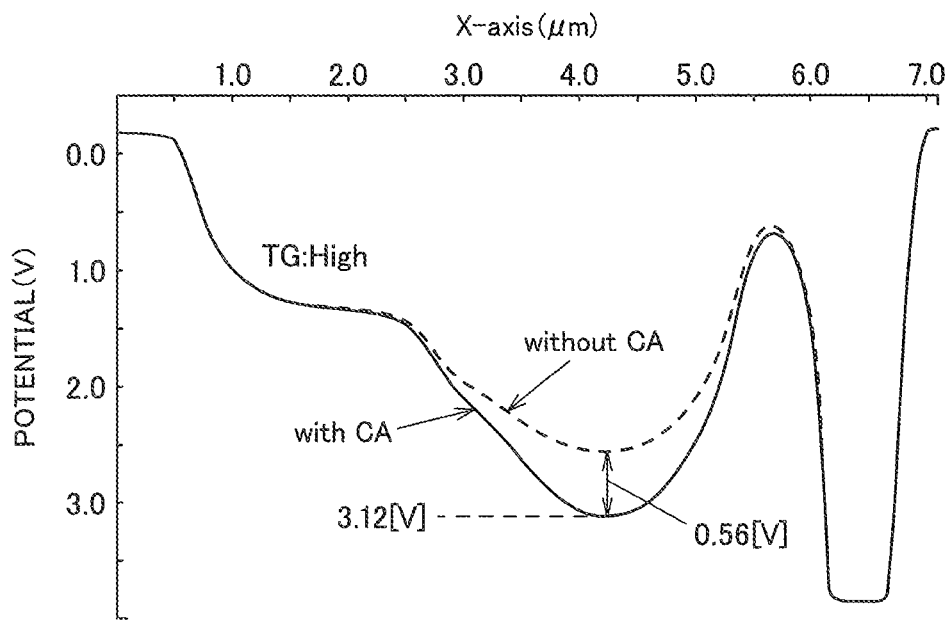
FIG. 43 is a view illustrating potential profiles of electrons of the band edge (bottom) of the conduction band of the charge-accumulation element, taken from the X1-X1 direction of FIG. 33, in a case where auxiliary electrodes are included, and in a case where the auxiliary electrodes are not included.

As already illustratively described with reference to FIG. 5, in the operation of the photoelectric-conversion element, the signal charges are transported around the periphery of the potential-hill creating-portion 7, and finally transported to the seventh charge-accumulation region SD7 implementing the charge-accumulation element via the seventh charge-transfer channel R7 between the fourth control-electrode pair (G7 and G6). When the signal charges are transported to the seventh charge-accumulation region SD7, the potential of the electrons of the third charge-transfer channel R3 is shallow, and the potential of the electrons of the seventh charge-transfer channel R7 is deep. Thus, as illustrated in FIG. 42, the potential-gradient decreases from the seventh charge-transfer channel R7 to the seventh charge-accumulation region SD7 and further continuously to the seventh charge read-out region FD7. That is, the gate portion to the seventh charge-accumulation region SD7 is opened, but all of the other gate portions besides the path toward the seventh charge-accumulation region SD7 are closed. All of the potentials of the electrons of the charge-transfer channels other than the path toward the seventh charge-accumulation region SD7 are shallow, and the potential-gradients for blocking the transport of the charges are created.

As illustrated n FIG. 5, the charges transported to the desired charge-transfer channels by the control voltages applied to the first field-control electrode G1, the second field-control electrode G2, the third field-control electrode G3, . . . , and the eighth field-control electrode G8 are accumulated to the first charge-accumulation region SD1, the second charge-accumulation region SD2, the third charge-accumulation region SD3, . . . , and the eighth charge-accumulation region SD8 by the control voltages applied to the auxiliary electrodes CA11, CA21, CA31, . . . , CA81, CA12, CA22, CA32, . . . , and CA82, respectively. Further, when the potentials having a high level are applied to the charge-augmentation electrode pairs formed of the auxiliary electrodes CA11, CA21, CA31, . . . , CA81, CA12, CA22, CA32, . . . , and CA82, which are provided on both the sides of the respective charge-accumulation regions, built-in potentials (expansion potentials) or potentials depending on the LEF are generated. Further, as indicated with the solid-line trajectory in FIG. 42, the potentials of the electrons of the desired charge-accumulation regions SD1, SD2, SD3, . . . , and SD8 can be deep. When the potentials of the electrons of the charge-accumulation regions SD1, SD2, SD3, . . . , and SD8 are made deep, the number of electrons that can be accumulated in each of the charge-accumulation regions SD1, SD2, SD3, . . . , and SD8, each of which has a predetermined certain capacitance, is 1,912, based on calculation in a simulation.

In contrast, in a case of the charge-accumulation element without the couple of charge-augmentation electrode pair, the potentials of the electrons of the charge-accumulation regions SD1, SD2, SD3, . . . , and SD8 do not become deep, and, as indicated with the broken-line trajectory in FIG. 42, become shallower by 0.56 volt at maximum as compared to the case of the photoelectric-conversion element including the charge-accumulation element. Further, the number of electrons that can be accumulated in each of the charge-accumulation regions SD1, SD2, SD3, . . . , and SD8 having the same capacitance as the embodiment of the present invention is 820 based on calculation in a simulation. That is, in the case of the charge-accumulation element including the auxiliary electrodes CA11, CA21, CA31, . . . , CA81, CA12, CA22, CA32, . . . , and CA82, more electrons can be accumulated by 1,092.

Figure 44:
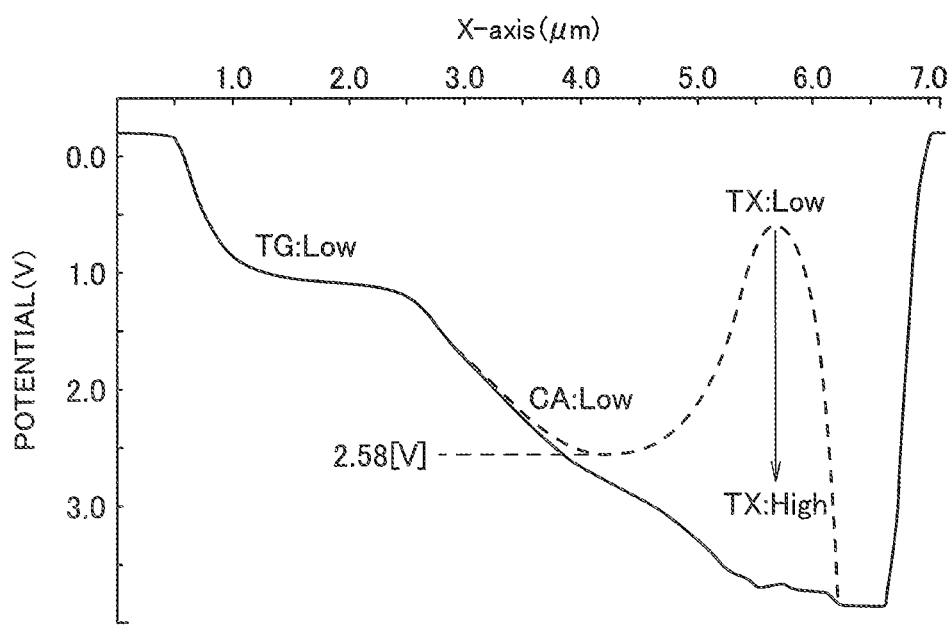
FIG. 44 is a view illustrating potential profiles of electrons of the band edge (bottom) of the conduction band of the charge-accumulation element, taken from the X1-X1 direction of FIG. 33, in a case where control voltage to be applied to transfer electrodes is high, and in a case where the control voltage is low.

Further, as illustrated in FIG. 44, the voltages applied to the field-control electrode G1, G2, G3, . . . , G8 has a low level, and the voltages applied to the auxiliary electrodes CA11, CA21, CA31, . . . , CA81, CA12, CA22, CA32, . . . , and CA82, are a low level of, for example, substantially 2.58 volts. In this state, when the voltages of the transfer electrodes TX11, TX21, TX31, . . . , TX81, TX12, TX22, TX32, . . . , and TX82, are changed from a low level to a high level, the potential-gradients of the electrons can be changed steeply from the charge-accumulation regions SD1, SD2, SD3, . . . , and SD8 to the charge read-out regions. As described above, the potential-gradients of the electrons from the charge-accumulation regions SD1, SD2, SD3, . . . , and SD8 to the charge read-out regions the charge read-out regions FD1, FD2, FD3, . . . , and FD8 become steep. Accordingly, the transfer of the charges to the charge read-out regions FD1, FD2, FD3, . . . , and FD8 can be assisted and promoted.

Further, as illustrated in FIG. 1 and FIG. 22, in the photoelectric-conversion element according to the first and second embodiments, the auxiliary electrodes CA11, CA21, CA31, . . . , CA81, CA12, CA22, CA32, . . . , and CA82 for assisting the transfer of the charges are provided in the vicinity of the charge-accumulation regions SD1, SD2, SD3, . . . , and SD8. Further, by applying the potentials having a high level to the auxiliary electrodes CA11, CA21, CA31, . . . , CA81, CA12, CA22, CA32, . . . , and CA82, the built-in potentials (expansion potentials) or the potentials depending on the LEF are obtained, thereby increasing the number of electrons that can be accumulated. Thus, by enlarging the accumulated-charge capacitance in the charge-transport path, the sufficient accumulated-charge capacitance can be achieved for each of the charge-accumulation regions SD1, SD2, SD3, . . . , and SD8.

Further, in the photoelectric-conversion element according to the first and second embodiments, when the charges are transferred from the charge-accumulation regions SD1, SD2, SD3, . . . , and SD8 to the charge read-out regions FD1, FD2, FD3, . . . , and FD8, the auxiliary electrodes CA11, CA21, CA31, . . . , CA81, CA12, CA22, CA32, . . . , and CA82 have the low-level potentials. Accordingly, the gradients toward the charge read-out regions FD1, FD2, FD3, . . . , and FD8 become steep, and the transfer of the charges to the charge read-out regions FD1, FD2, FD3, . . . , and FD8 can also be assisted.

First Modification of Charge-Accumulation Element

Figure 45:
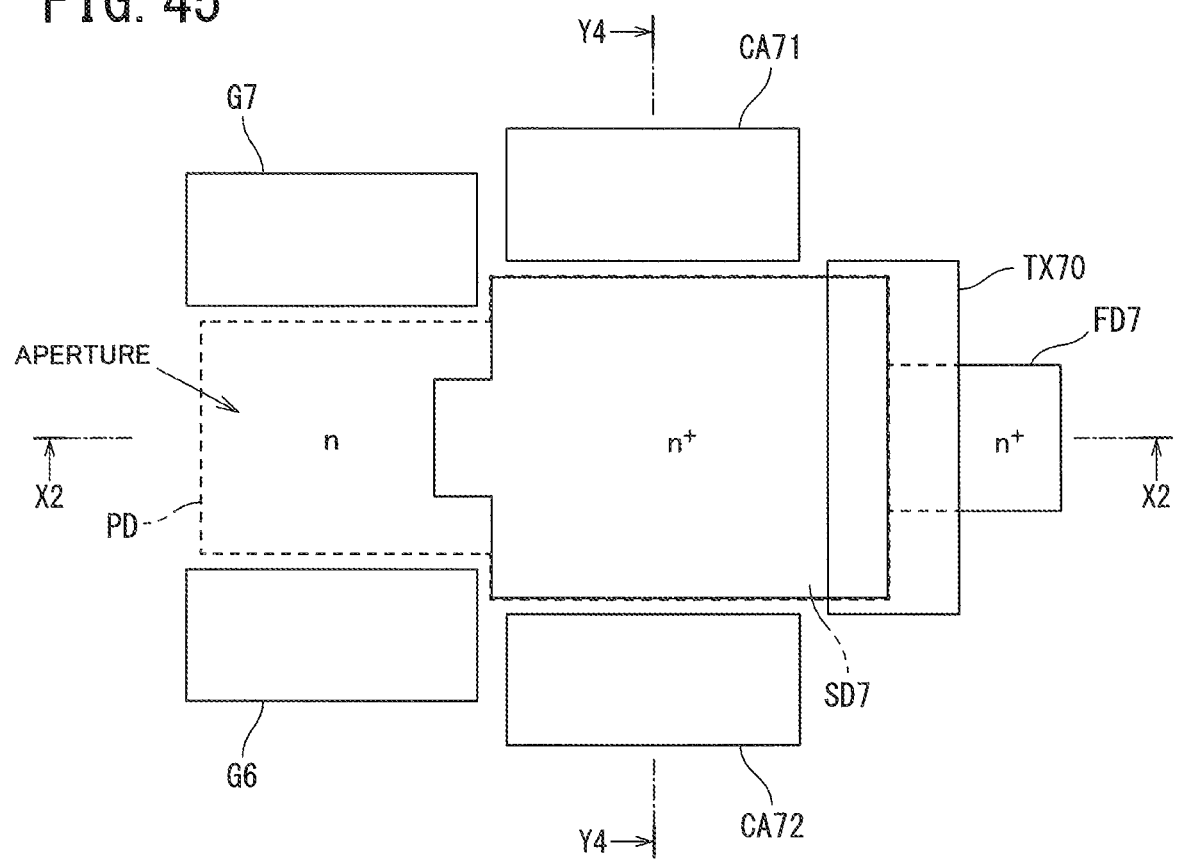
FIG. 45 is a schematic plan view (top view) of a charge-accumulation element according to a first modification of the photoelectric-conversion element pertaining to the first and second embodiments.

The transfer electrodes TX71 and TX72 of the charge-accumulation element, which are illustrated in FIG. 33 to FIG. 44, are provided to be paired and sandwich the second rectangular region of charge-accumulation region SD7. However, as illustrated in the enlarged view mainly focusing on the seventh charge-accumulation region SD7 of FIG. 45, a transfer electrode TX70 having a normal single-layered insulated-gate structure may be used so as to simultaneously overlap with the first rectangular region of the seventh charge-accumulation region SD7 and the second rectangular region having a small width, which is continuous to the charge read-out region FD7 of the first rectangular region.

Figure 46:
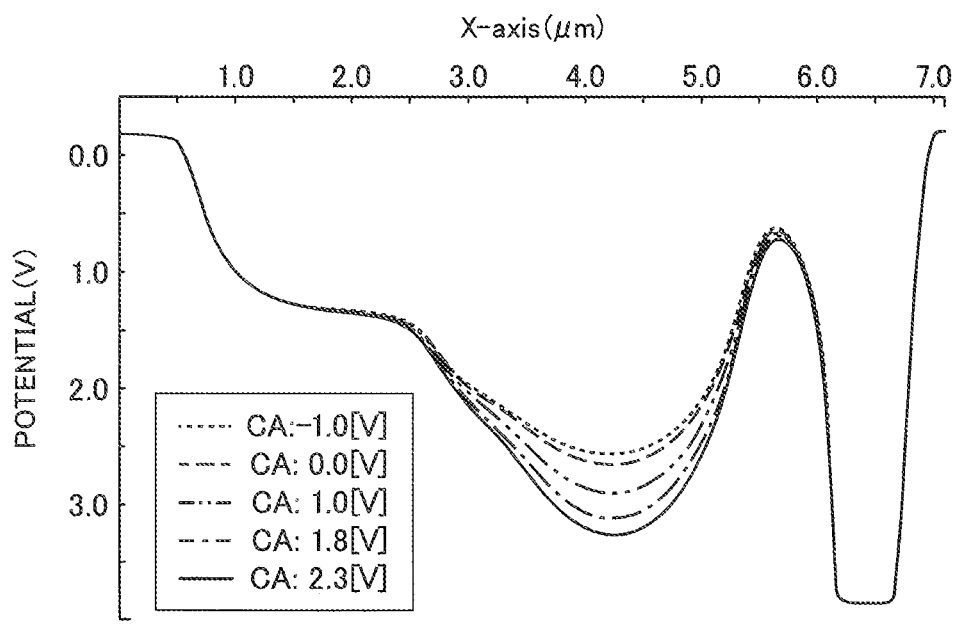
FIG. 46 is a view illustrating potential profiles of electrons of a band edge (bottom) of a conduction band in the first modification of the charge-accumulation element, taken from the X2-X2 direction of FIG. 44, depending on a magnitude of the control voltage to be applied to the auxiliary electrodes.
Figure 47:
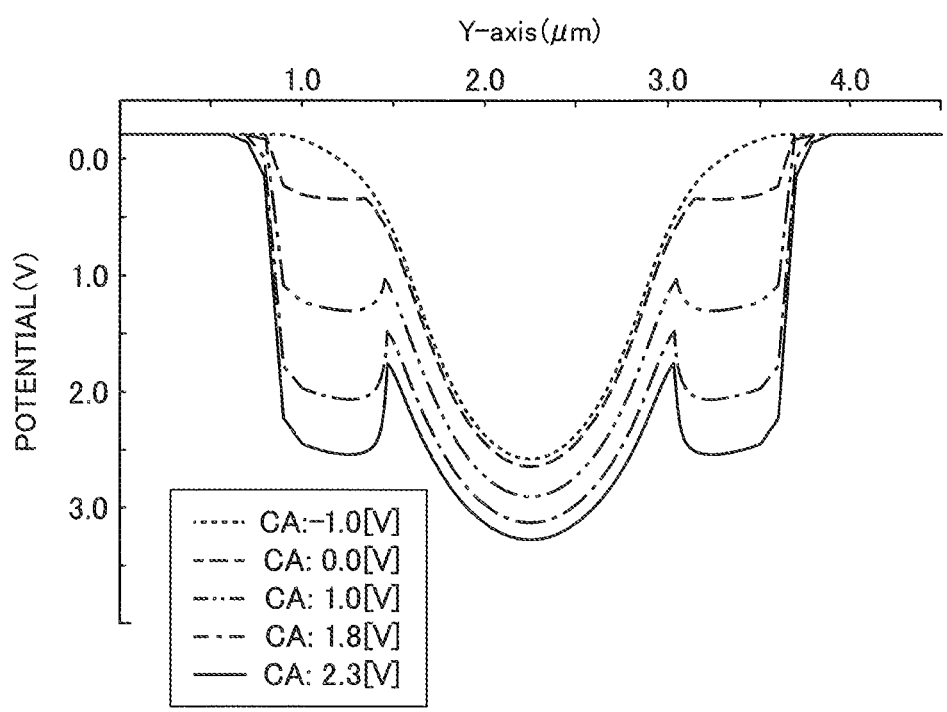
FIG. 47 is a view illustrating potential profiles of electrons of the band edge (bottom) of the conduction band in the first modification of the charge-accumulation element, taken from the Y4-Y4 direction of FIG. 45, depending on a magnitude of the control voltage to be applied to the auxiliary electrodes.

As illustrated in FIG. 46 and FIG. 47, the potential profile of the electrons, which is obtained by changing the voltage applied to the couple of charge-augmentation electrode pair (CA71 and CA72), changes substantially from −1.0 volt to 2.3 volts under a condition in which the voltage of −1 volt is applied to the sixth field-control electrode G6 and the seventh field-control electrode G7, and the voltage of −1 volt is applied to the transfer electrode TX70 having a normal insulated-gate structure. The potential profiles are illustrated with regard to the position in the cross section viewed from the X2-X2 direction and the position in the cross section viewed from the X4-X4 direction of FIG. 45. As illustrated in FIG. 46 and FIG. 47, as the voltage applied to the couple of potential profile (CA71 and CA72) becomes larger, the deepest part of the potential of the electrons becomes deeper. As apparent from FIG. 46 and FIG. 47, when the voltage applied to the couple of charge-augmentation electrode pair (CA71 and CA72) is changed substantially from −1.0 volt to 2.3 volts, a modulation effect of substantially 2.58 volts to 3.12 volts can be obtained in the potential profile.

As described above, the first modification of the charge-accumulation element includes the transfer electrode TX70 having a single layer, similarly to the charge-accumulation element illustrated in FIG. 33 to FIG. 44, the accumulated-charge capacitance in the charge-transfer path can be enlarged, and the transfer of the charges to the charge read-out regions FD1, FD2, FD3, . . . , and FD8 can be assisted.

Second Modification of Charge-Accumulation Element

Figure 48:
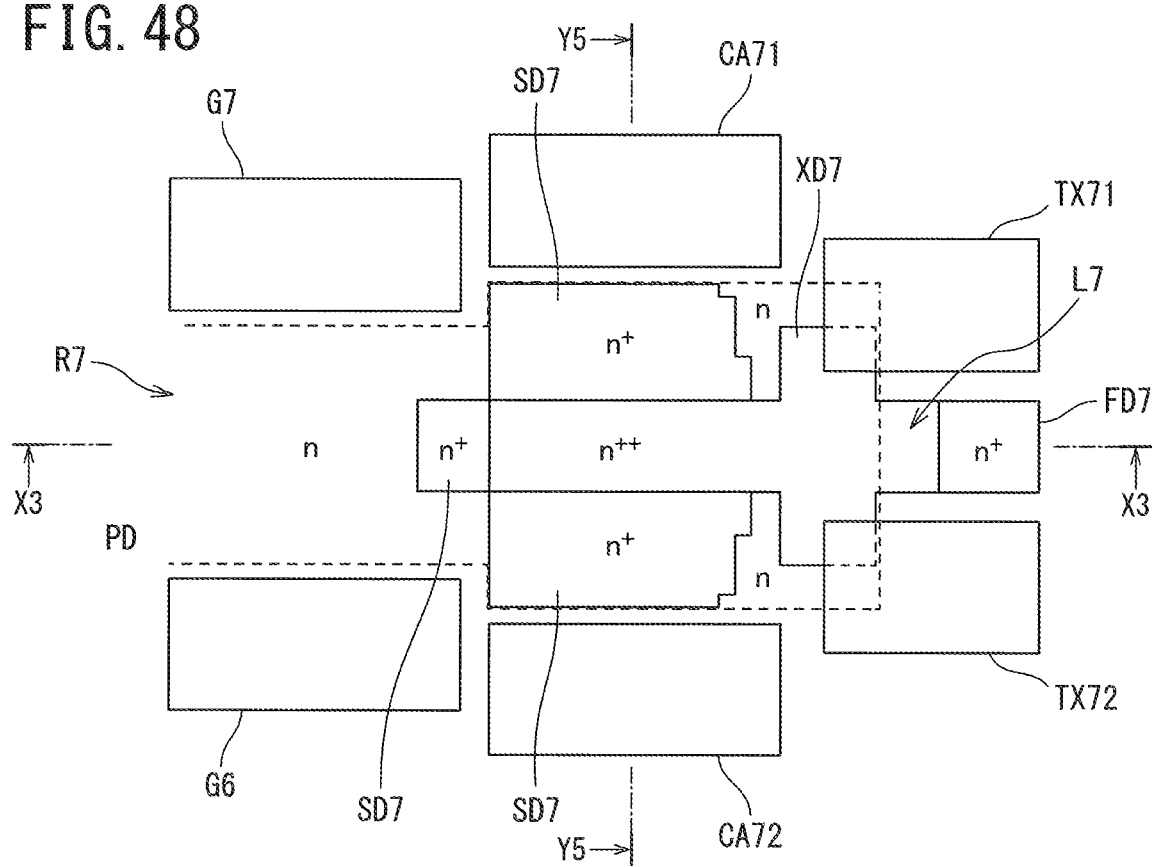
FIG. 48 is a schematic plan view (top view) according to a second modification of the charge-accumulation element.

Further, as illustrated in the enlarged view mainly focusing on the seventh charge-accumulation region SD7 of FIG. 48, in a second modification of the charge-accumulation element, the seventh charge-accumulation region SD7 may be formed only by a substantially rectangular region, and an ($n^{++}$)-type charge-accumulation auxiliary region XD7, which has impurity concentration higher than that of the seventh charge-accumulation region SD7 and extends from the rectangular region to the seventh charge read-out region FD7, may be provided. In this manner, the potentials of the electrons may become deep.

As illustrated in FIG. 48, the charge-accumulation auxiliary region XD7 has a substantially cross-like shape in a planar pattern, and is arranged so that an area corresponding to a part of a vertical bar of the cross-like shape on a side lower than the horizontal bar partially overlaps with the seventh charge-accumulation region SD7. In this manner, the potential of the electrons becomes deep. An area corresponding to a part of the vertical bar of the cross-like shape of the charge-accumulation auxiliary region XD7 on a side upper than the vertical bar is held in contact with the seventh charge read-out region FD7 on the output side. Areas corresponding to parts of the horizontal bar of the cross-like shape of the charge-accumulation auxiliary region XD7, which extend rightward and leftward are arranged so that the ends of the horizontal bar and the ends of the couple of the output-electrode pair (TX71 and TX72) partially overlap with each other.

Figure 49:
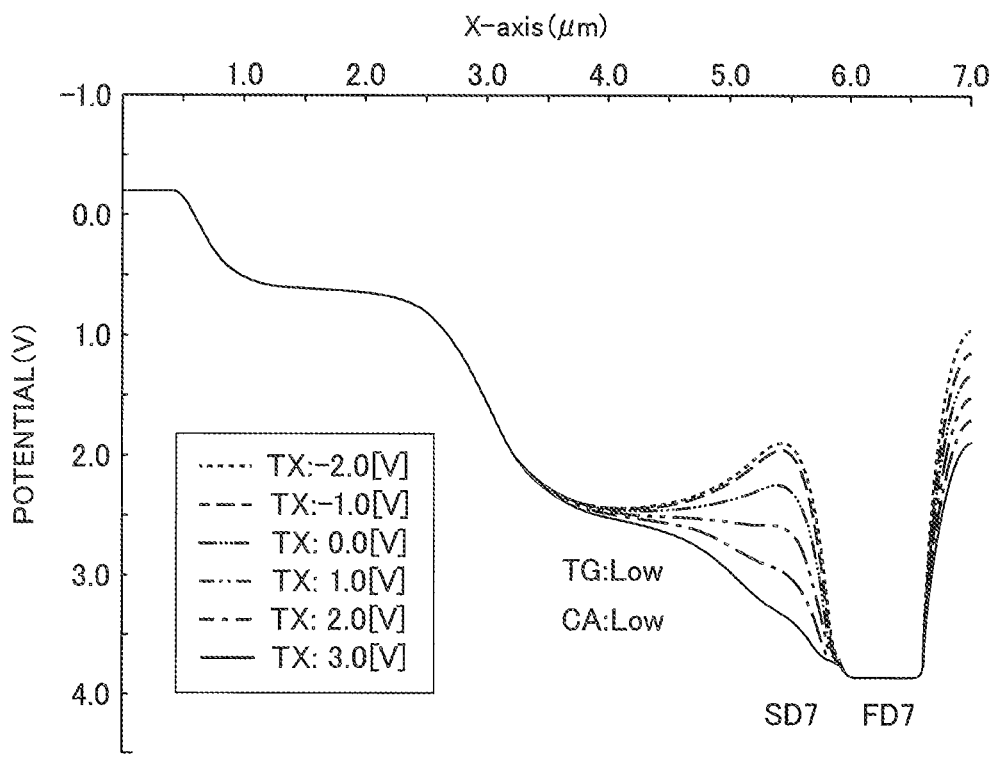
FIG. 49 is a view illustrating potential profiles of electrons of a band edge (bottom) of a conduction band of the charge-accumulation element in the second example, X-axis is taken along a cross section in the X3-X3 direction of FIG. 48, depending on a magnitude of the control voltage to be applied to the transfer electrodes.
Figure 50:
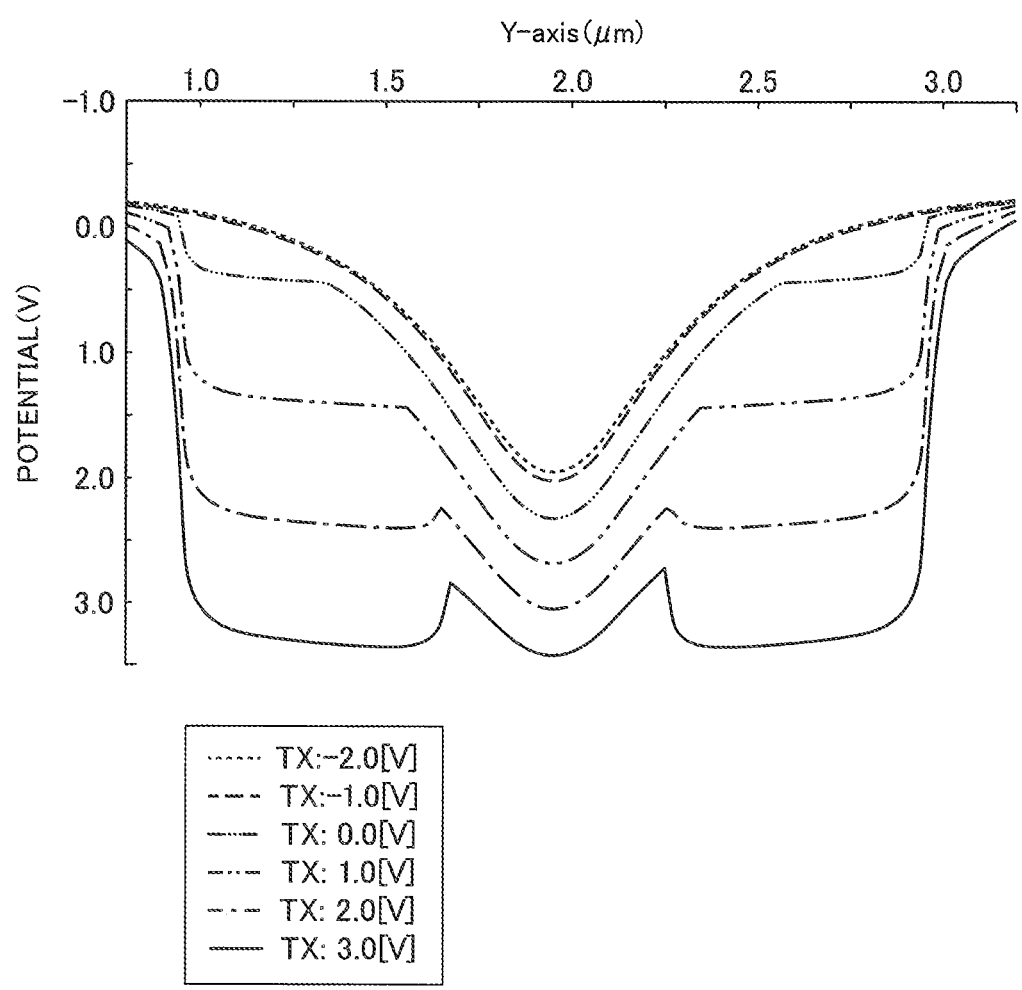
FIG. 50 is a view illustrating potential profiles of electrons of a band edge (bottom) of a conduction band of the charge-accumulation element in the second example, Y-axis is taken along a cross section in the Y5-Y5 direction of FIG. 48, depending on a magnitude of the control voltage to be applied to the transfer electrodes.

As illustrated in FIG. 49 and FIG. 50, the potential profile of the electrons, which is obtained by changing the voltage applied to the couple of charge-augmentation electrode pair (CA71 and CA72), changes substantially from −2.0 volts to 3.0 volts under a condition in which the voltages applied to the sixth field-control electrode G6, the seventh field-control electrode G7, and the couple of charge-augmentation electrode pair (CA71 and CA72) are at a low level. The potential profiles are illustrated regarding the position in the cross section viewed from the X3-X3 direction and the position in the cross section viewed from the Y5-Y5 direction of FIG. 48. As illustrated in FIG. 49 and FIG. 50, as the voltage applied to the couple of the output-electrode pair (TX71 and TX72) becomes larger, the potential-gradient of the charges of the seventh charge read-out region FD7 on the output side becomes steep.

Figure 51:
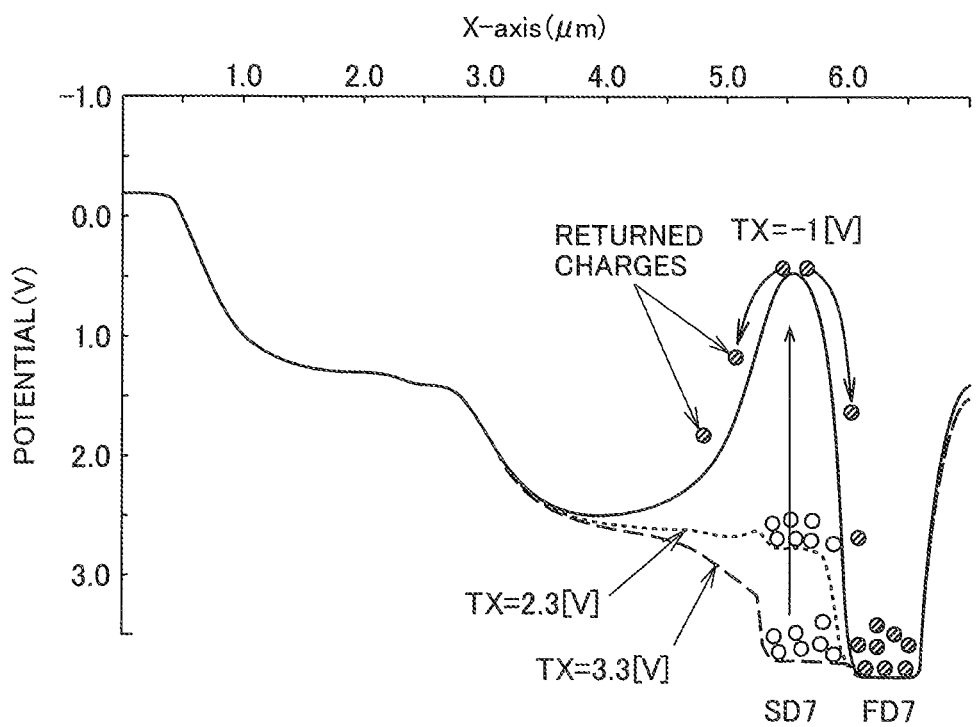
FIG. 51 is a view for illustrating potential profiles of electrons of a band edge (bottom) of a conduction band of a charge-accumulation element in a comparative example, depending on a magnitude of control voltage to be applied to transfer electrodes.

In contrast, as illustrated in FIG. 51, in the case of the charge-accumulation element without the couple of charge-augmentation electrode pair (CA71 and CA72), when the voltage applied to the couple of the output-electrode pair (TX71 and TX72), for example, the potential is substantially 3.3 volts, and a substantially flat potential regime is generated at the boundary between the seventh charge-accumulation region SD7 and the seventh charge read-out region FD7. In the flat potential regime, a relatively large amount of charges will stagnate. Thus, as illustrated in FIG. 51, when the voltage applied to the couple of the output-electrode pair (TX71 and TX72) is changed to, for example, substantially −1.0 volt, the potential of the flat potential regime becomes shallow, and part of the stagnating charges falls onto the seventh charge read-out region FD7. Still, a large amount of so-called "returned charges" from the output side, which are part of the charges falling onto the seventh charge-accumulation region SD7, are generated. The returned charges cause increase of noise.

Regarding the returned charges, in the case of the second modification of the charge-accumulation element, the voltage applied to the couple of the output-electrode pair (TX71 and TX72) is changed under the condition in which the couple of charge-augmentation electrode pair (CA71 and CA72) is included. Thus, even when the voltage applied to the couple of the output-electrode pair (TX71 and TX72) is at a low level, the potential-gradient of the electrons of the seventh charge read-out region FD7 is steep, and the flat potential regime illustrated in FIG. 51 is not generated on the output side. Thus, in the second modification of the charge-accumulation element, in addition to the technical advantages of the charge-accumulation element illustrated in FIG. 33 to FIG. 44, the returned charges can further be prevented from being generated, and noise of the charge-accumulation element can be suppressed.

Comparative Example of Charge-Accumulation Element

Figure 52:
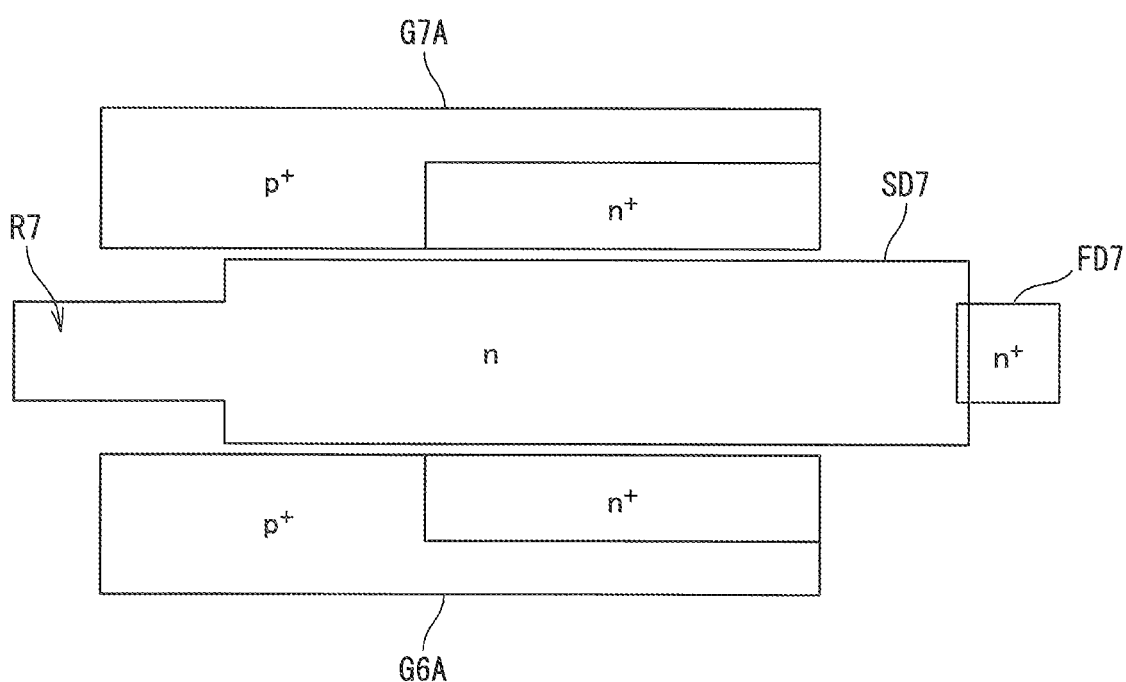
FIG. 52 is a schematic plan view (top view) for illustrating a charge-transfer structure of a charge-accumulation element in the comparative example.

Further, in FIG. 52, as a comparative example, a charge-accumulation element is illustrated. In the comparative example, without encompassing the couple of charge-augmentation electrode pair independently, the seventh charge-accumulation region SD7 is connected to the n-type seventh charge-transfer channel R7 continuous from the light receiving region PD forming a charge-supply region on the input side. In the structure illustrated in FIG. 52, a single-step long charge-transfer structure is achieved by a pair of field-control electrode-pair (G6A and G7A) along the charge-transfer channel. In the charge-accumulation element in the comparative example, the following structure is given. That is, the signal charges are transferred from the light receiving region PD on the input side to the seventh charge-transfer channel R7, and the accumulated-charge capacitance in the seventh charge-transfer channel R7 is increased. Further, the pair of field-control electrode-pair (G6A and G7A) for assisting the signal charges, configured to be transferred, is provided.

The field-control electrodes G6A and G7A implementing the pair of field-control electrode-pair (G6A and G7A) are provided, sandwiching the seventh charge-transfer channel R7 and the seventh charge-accumulation region SD7 at the positions slightly away from the seventh charge-transfer channel R7 from both the sides. Each of the field-control electrodes G6A and G7A has a rectangular shape in a planar pattern. In an area of each of the rectangular shape, which is near the seventh charge read-out region FD7 and on the output side close to the seventh charge-accumulation region SD7, a complex structure formed of polycrystalline silicon (doped polysilicon) to which $n^+$-type impurities are doped is formed. The zero-biased potential of the seventh charge-accumulation region SD7 near the seventh charge read-out region FD7, which is sandwiched by the $n^+$-type doped polysilicon regions on both the sides becomes deeper by depending on the surface potentials of the $n^+$-type doped polysilicon regions. In each of the complex structures of the field-control electrodes G6A and G7A, parts other than the $n^+$-type doped polysilicon regions are formed of $p^+$-type doped polysilicon regions. The zero-biased potentials of the seventh charge-accumulation region SD7 and the seventh charge-transfer channel R7 on the input side close to the left side, which are sandwiched by the $p^+$-type doped polysilicon regions on both the sides become shallow by depending on the surface potentials of the $p^+$-type doped polysilicon regions.

Third Modification of Charge-Accumulation Element

Figure 53:
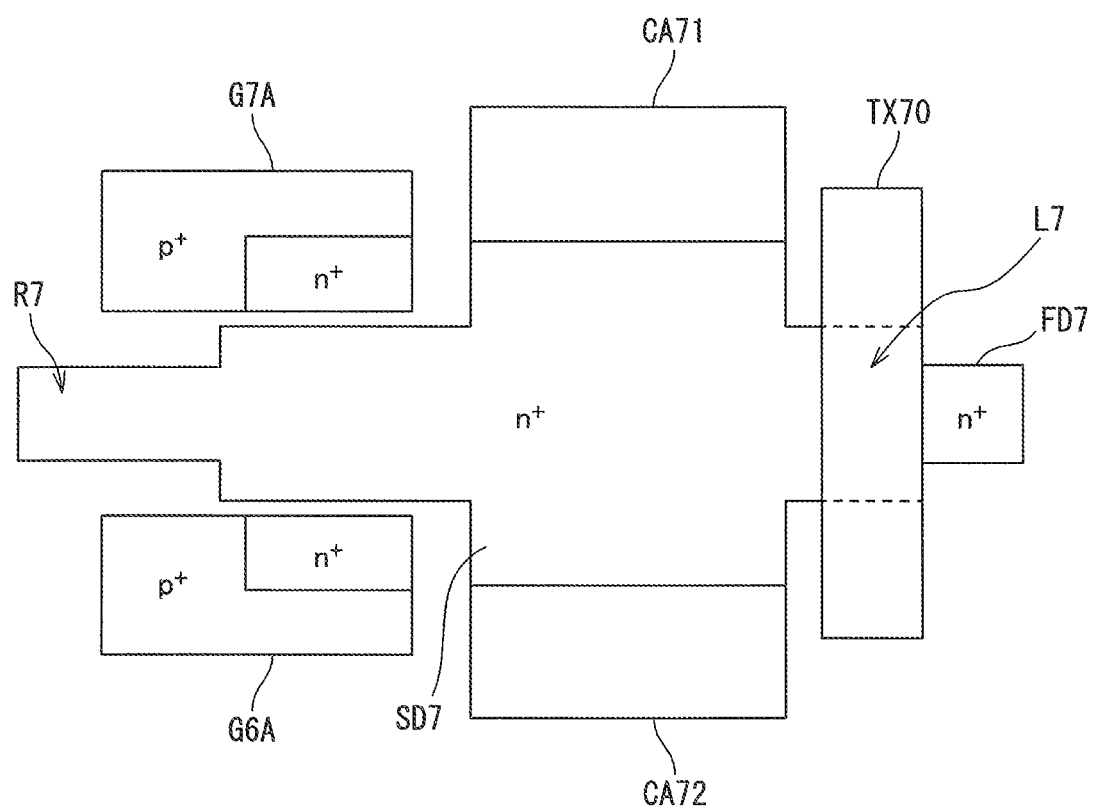
FIG. 53 is a schematic plan view (top view) for illustrating a charge-transfer structure according to a third modification of the charge-accumulation element.

A third modification of the charge-accumulation element in which the seventh charge-accumulation region SD7 is provided to the charge-accumulation element having a single-step charge-transfer structure illustrated in FIG. 52 is illustrated in FIG. 53. As illustrated in FIG. 53, together with the couple of charge-augmentation electrode pair (CA71 and CA72), the pair of field-control electrode-pair (G6A and G7A) including the $n^+$-type doped polysilicon regions may be arranged partially close to the seventh charge read-out region FD7. The field-control electrodes G6A and G7A implementing the pair of field-control electrode-pair (G6A and G7A), which are illustrated on the left side of FIG. 53, are provided, sandwiching a connection portion between the seventh charge-transfer channel R7 having a stepped-shape and a narrow part of the seventh charge-accumulation region SD7 on the left side at the positions slightly away from the left part of the seventh charge-accumulation region SD7 from both the sides. Each of the field-control electrodes G6A and G7A has a rectangular shape in a planar pattern, but has an area smaller than that of the structure illustrated in FIG. 52. The part of the area close to the left part of the seventh charge-accumulation region SD7 has a complex structure formed of the $n^+$-type doped polysilicon. The zero-biased potential of the left part of the seventh charge-accumulation region SD7 sandwiched by the $n^+$-type doped polysilicon regions on both the sides is deep while depending on the surface potentials of the $n^+$-type doped polysilicon region. The regions other than the $n^+$-type doped polysilicon regions in the complex structure of each of the field-control electrodes G6A and G7A are formed of the $p^+$-type doped polysilicon regions. The zero-biased potential of the seventh charge-transfer channel R7 sandwiched by the $p^+$-type doped polysilicon regions on both the sides is shallow by depending on the surface potentials of the $p^+$-type doped polysilicon regions.

Substantially the same as the case already described with reference to FIG. 46 and FIG. 47, as the voltage applied to the couple of charge-augmentation electrode pair CA71 and CA72 close to the thick portion of the seventh charge-accumulation region SD7 on the right side becomes higher, the depth of the potential of the electrons of the thick portion of the seventh charge-accumulation region SD7 on the right side can be controlled to be deeper. Accordingly, the charge amount accumulated in the seventh charge-accumulation region SD7 can be increased. As illustrated in FIG. 53, also with the third modification of the charge-accumulation element in which the couple of charge-augmentation electrode pair CA71 and CA72, and the field-control electrodes G6A and G7A implementing the pair of field-control electrode-pair (G6A and G7A) are oppoisingly arranged in the vicinity of the charge-accumulation region SD7, similarly to the charge-accumulation element illustrated in FIG. 33 to FIG. 44, the accumulated-charge capacitance in the charge-transfer path can be enlarged, and the transfer of the signal charges to the charge read-out regions FD1, FD2, FD3, . . . , and FD8 can be assisted.

Fourth Modification of Charge-Accumulation Element

Figure 54:
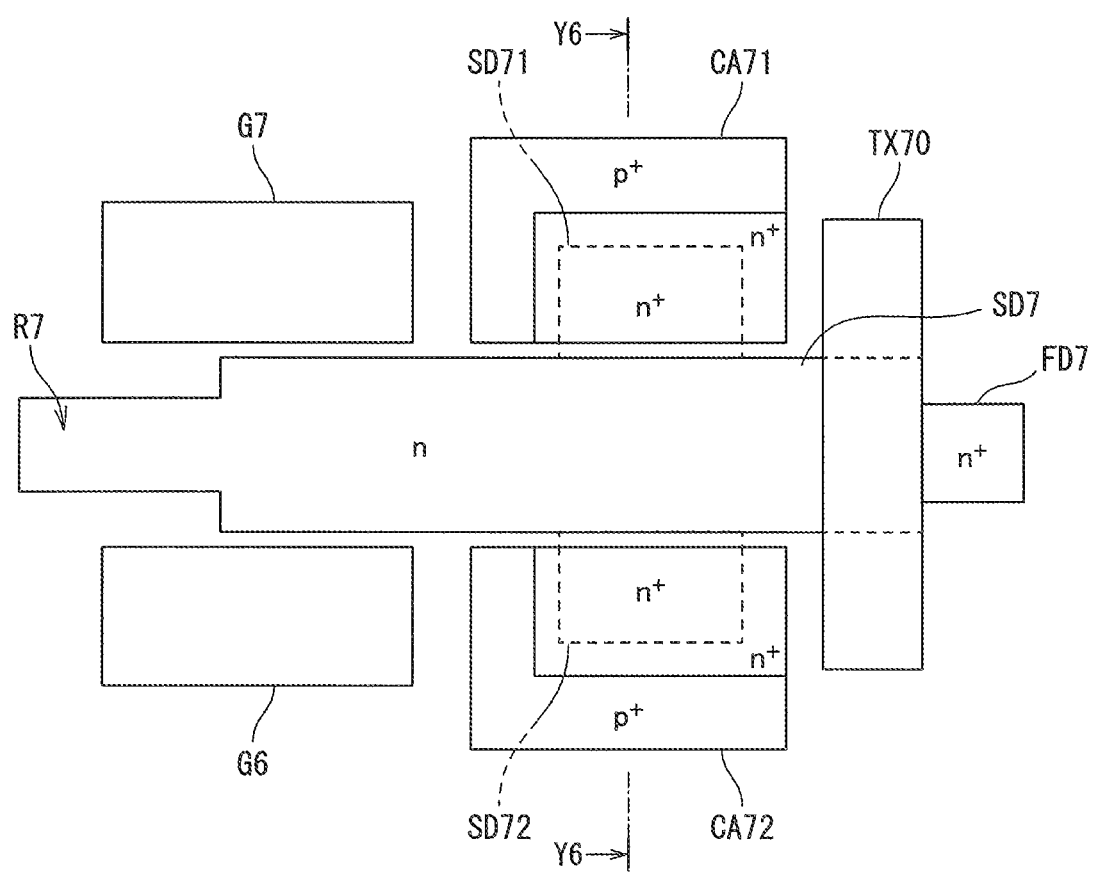
FIG. 54 is a schematic plan view (top view) for illustrating a charge-transfer structure of a charge-accumulation element according to a fourth modification.
Figure 55A:
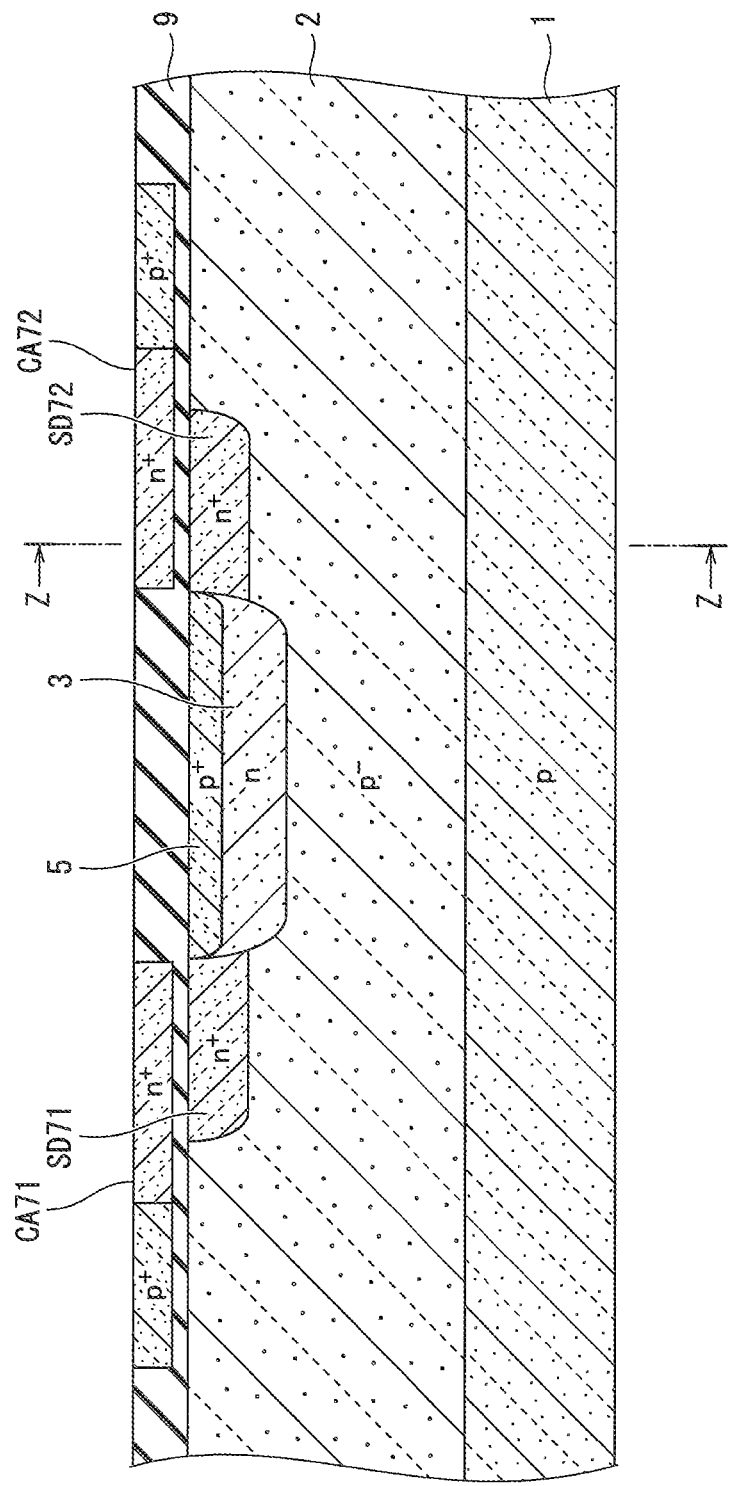
FIG. 55A is a schematic cross-sectional view illustrating an outline structure according to the fourth modification of the charge-accumulation element, Y-axis is taken along a cross section in the Y6-Y6 direction of FIG. 54.

Further, as illustrated in FIG. 54 and FIG. 55A, $n^+$-type charge-accumulation promotion regions SD71 and SD72 may be provided, being contacted with the surface buried region 3 on the upper portion of the element-allocating layer 2 below the couple of charge-augmentation electrode pair (CA71 and CA72). In the couple of charge-augmentation electrode pair (CA71 and CA72) of the fourth modification of the charge-accumulation element, which is illustrated in FIG. 54 and FIG. 55A, the rectangular region partially close to the seventh charge-transfer channel R7 is made of the n$^+$-type doped polysilicon.

The auxiliary electrodes CA71 and CA72 implementing the couple of charge-augmentation electrode pair (CA71 and CA72), which are illustrated on the right side of FIG. 54, are provided, sandwiching the right-side portion of the seventh charge-accumulation region SD7 slightly away from the right-side portion of the seventh charge-accumulation region SD7. Each of the auxiliary electrodes CA71 and CA72 has a rectangular shape in a planar pattern. A part of the region of the auxiliary electrodes CA71 and CA72 on the output side, which is close to the right-side portion of the seventh charge-accumulation region SD7, has a complex structure made of the n$^+$-type doped polysilicon. The zero-biased potential of the right-side portion of the seventh charge-accumulation region SD7 sandwiched by the n$^+$-type doped polysilicon regions on both the sides is deep by depending on the surface potentials of the n$^+$-type doped polysilicon regions. The regions other than the n$^+$-type doped polysilicon regions in the complex structure of each of the auxiliary electrodes CA71 and CA72 are made of the p$^+$-type doped polysilicon regions. The zero-biased potential of the seventh charge-accumulation region SD7 sandwiched by the p$^+$-type doped polysilicon regions on both the sides is shallow by depending on the surface potentials of the p$^+$-type doped polysilicon regions.

Figure 55B:
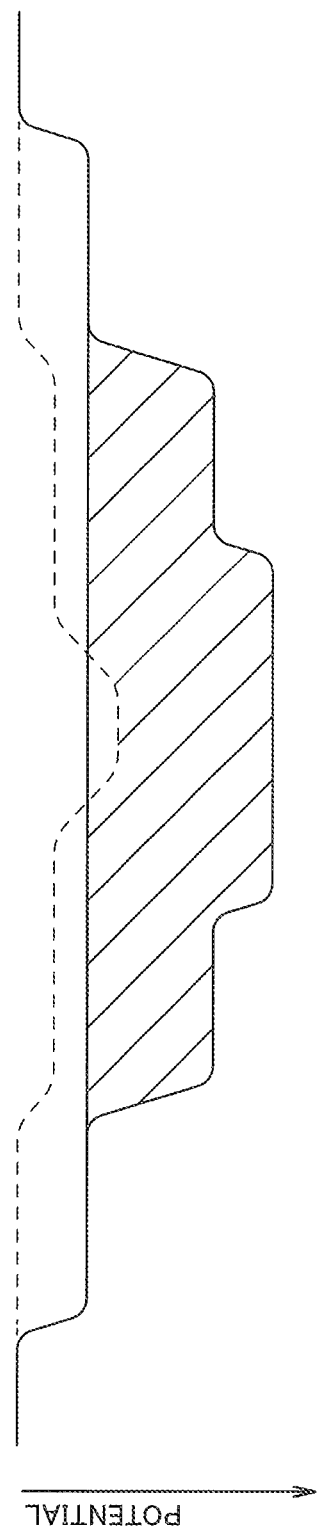
FIG. 55B is a view illustrating a potential profile of electrodes of a band edge (bottom) of a conduction band in the region illustrated in FIG. 55A.
Figure 56:
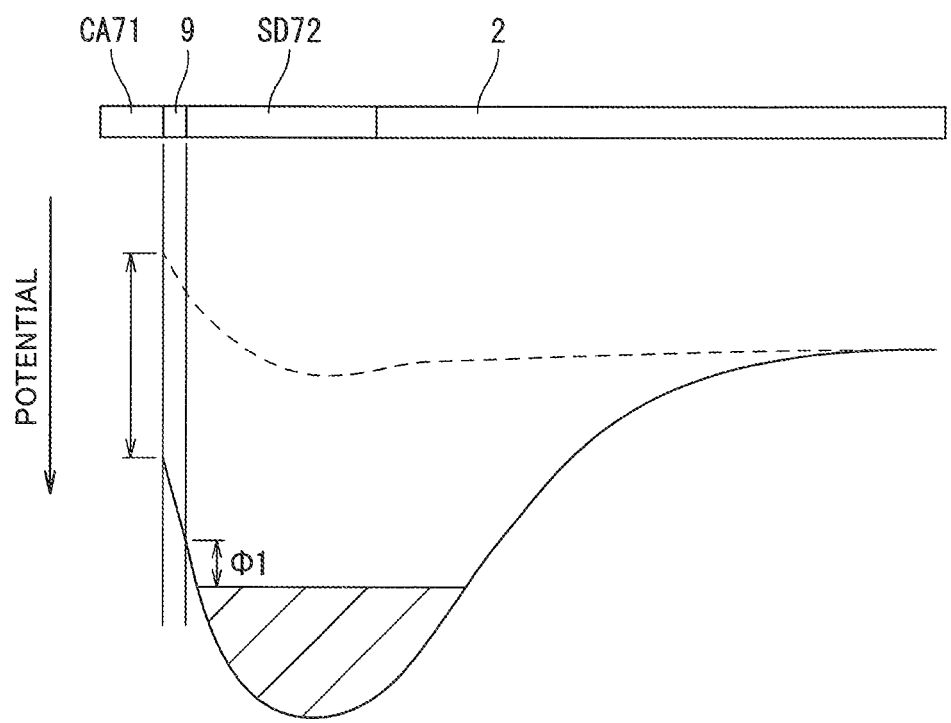
FIG. 56 is a view illustrating a potential profile of electrodes of the band edge (bottom) of the conduction band, the depth is corresponding to a cross section viewed at a level in the Z-Z direction of FIG. 55A.

As indicated with the hatched portion in FIG. 55B and FIG. 56, in the fourth modification of the charge-accumulation element, a potential well of the electrons for accumulating the charges can be created also under the couple of charge-augmentation electrode pair (CA71 and CA72). In FIG. 56, a profile of a deep potential well including the potential of electrons, which corresponds to a potential $\Phi1$ between the insulator 9 and the top of the charge-accumulation promotion region 72, is illustrated as an example. In the fourth modification of the charge-accumulation element, in addition to the effectiveness of the charge-accumulation element illustrated in FIG. 33 to FIG. 44, the accumulated-charge amount can further be increased.

Other Embodiments

The present invention is described above with reference to the first and second embodiments. However, it should not be understood that the description and the drawings consisting of the part of this disclosure are intended to limit this disclosure. From this disclosure, a person skilled in the art understands various alternative embodiments, examples, and operation techniques.

In the already-given description of the first and second embodiments, the first conductivity type is assigned as a p-type, and the second conductivity type is assigned as an n-type. However, even when the first conductivity type is assigned as an n-type, and the second conductivity type is assigned as a p-type, it can easily be understood that the similar technical advantages can be obtained by reversing the electric polarity.

Further, in the description of the first and second embodiments, the signal charges subjected to processing such as transfer and accumulation are electrons, and in the potential diagram, a lower direction (depth direction) of the drawing is a positive direction of the electric potential. However, in a case where the electric polarity is reversed, the charges subjected to the processing are positive holes. Thus, the potential profile for indicating the potential barrier, the potential valley, and the potential well in the photoelectric-conversion element is expressed in a negative direction of the potential.

Further, the semiconductor material forming the semiconductor region in which the charge-transport path and the charge-transfer channels are defined is not limited to silicon (Si). Particularly, in a case of a compound semiconductor, the problem of the interface defects and the interface states at the interface between a surface of the compound semiconductor and an insulator arises. The method of controlling the potential in the semiconductor by the lateral static induction effect according to the present invention shall avoid the influences of the interface defects and the interface states. Thus, even in a case of a photoelectric-conversion element and a solid-state image sensor using miscellaneous compound semiconductors such as III-V compound semiconductors and II-VI compound semiconductors, the architectures and the technical ideas of the photoelectric-conversion element and the solid-state image sensor, which are illustratively described in the first and second embodiments, shall be regarded as an important technology.

Further, the case, where the light receiving region of the eight-tap LEF-control photoelectric-conversion element is assigned as the light receiving region PD of the charge-accumulation element, is mainly described. However, as illustrated in FIG. 31, as the light receiving region PD connected to the input side of the charge-accumulation element, the present invention is not limited to the eight-tap LEF-control photoelectric-conversion element, and the number of taps can be optionally changed to, for example, a single-tap scheme and a five-tap scheme. Further, the light receiving region PD connected to the input side is not necessarily be the light receiving region of the photoelectric-conversion element, and may be other semiconductor regions, as far as the regions can supply the signal charges.

Further, description is made of the case where the light receiving region PD connected to the input side has a regular octagonal shape. However, the present invention is not limited to the regular octagonal shape, and may be changed as appropriate in accordance with design-specifications of the charge-accumulation elements such as the number of taps. Further, the photoelectric-conversion element according to the present invention can be achieved by partially combining the structures illustrating in FIG. 1 to FIG. 56 with each other. As described above, the present invention includes various embodiments other than the above-mentioned embodiments, and the technical scope of the present invention is defined only by the technical features specifying the claimed invention, which are recited in claims, reasonably derived from the above-mentioned description.

REFERENCE SIGNS LIST 1 semiconductor substrate
2 element-allocating layer
3, 3a surface buried region
5 pinning layer
7 potential-hill creating-portion
9 insulator
13,13a guide region
11 shielding plate
15 selection circuit 17 microlens
21 horizontal shift register
22 column-parallel/folding-integration/cyclic-A/D converter
23 vertical shift register
24 charge-modulation driver
CA11, CA21, CA31, ..., CA81 auxiliary electrode
CA12, CA22, CA32, ..., CA82 auxiliary electrode
TX11, TX21, TX31, ..., TX81 auxiliary electrode
TX12, TX22, TX32, ..., TX82 auxiliary electrode
TX70 transfer electrode
FD1 to FD8 first to eighth charge read-out region
G1 to G8 first to eighth field-control electrode
G6A, G7A field-control electrode
SD1 to SD8 first to eight charge-accumulation region (charge-exhaust region)
SD71, SD72 charge-accumulation promotion region
XD7 charge-accumulation auxiliary region
RT1 to RT8 first reset transistor to eight reset transistor
SEL1 to SEL8 first to eighth switching transistor
D0, RD1 to RD8 charge-exhaust region
TD0, TD1 to TD8 charge-exhaust electrode
$X_{ij}$ pixel
L1 to L8 first to eighth charge read-out channel
R1 to R8 first to eighth charge-transfer channel

The invention claimed is:

1. A photoelectric-conversion element comprising:
an image-capturing region including a buried photodiode having an element-allocating layer of a first conductivity type and a surface buried region of a second conductivity type, the surface buried region being buried in an upper portion of the element-allocating layer;
a plurality of charge read-out regions of n pieces, having the second conductivity type, provided away from one another, being disposed at quintuple or more positions, surrounding a light receiving region defined in a center of the image-capturing region, and having impurity concentration higher than that of the element-allocating layer;
a plurality of charge-transfer channels having the second conductivity type, having independent paths extending from the light receiving region to the plurality of charge read-out regions, respectively;
a plurality of paired field-control electrodes disposed at both sides of the plurality of charge-transfer channels, the paired field-control electrodes are arranged at positions surrounding the light receiving region;
a plurality of charge-accumulation regions having the second conductivity type, provided between the plurality of charge-transfer channels and the plurality of charge read-out regions, and having impurity concentration higher than that of the element-allocating layer and lower than that of the plurality of charge read-out regions;
a plurality of charge read-out channels having the second conductivity type, extending from the plurality of charge-accumulation regions to the plurality of charge read-out regions, each of which corresponding to the charge-accumulation regions, respectively; and
a plurality of transfer electrodes being arranged for the plurality of charge read-out channels, respectively,
wherein a destination of majority carriers generated in the surface buried region is sequentially controlled to be determined toward any one of the plurality of charge-accumulation regions, by sequentially and cyclically applying field-control pulses having different phases to the plurality of field-control electrodes, and by sequentially changing depletion potentials of the surface buried region and the plurality of charge-transfer channels, and
wherein charge-transfer pulses for transferring the majority carriers to the determined charge read-out regions are simultaneously applied from the plurality of charge-accumulation regions, which correspond to the determined charge read-out regions, to the plurality of transfer electrodes.

2. A photoelectric-conversion element comprising:
an image-capturing region including a buried photodiode having an element-allocating layer of a first conductivity type and a surface buried region having a second conductivity type, the surface buried region being buried in an upper portion of the element-allocating layer;
a plurality of charge read-out regions of n pieces, having the second conductivity type, provided away from one another, being disposed at quintuple or more positions surrounding a light receiving region defined in a center of the image-capturing region, and having impurity concentration higher than that of the element-allocating layer;
a plurality of charge-transfer channels having the second conductivity type, having independent paths extending from the light receiving region to the plurality of charge read-out regions, respectively;
a plurality of paired field-control electrodes disposed at both sides of the plurality of charge-transfer channels, the paired field-control electrodes are arranged at positions surrounding the light receiving region; and
a plurality of charge-exhaust regions, having the second conductivity type, the charge-exhaust regions are arranged to be away from the plurality of charge read-out regions at positions surrounding the light receiving region and have impurity concentration higher than that of the element-allocating layer,
wherein a destination of majority carriers being generated in the surface buried region is sequentially controlled to be determined toward any one of the plurality of charge read-out regions, by sequentially and cyclically applying field-control pulses having different phases to the plurality of field-control electrodes, and by sequentially changing depletion potentials of the surface buried region and the plurality of charge-transfer channels, and
wherein each of the charge read-out regions of n pieces reads out the majority carriers generated in the surface buried region as signal charges.

3. The photoelectric-conversion element of claim 1, wherein the plurality of transfer electrodes is arranged to be paired on both sides of each of the plurality of charge read-out channels so as to perform lateral electric field control.

4. The photoelectric-conversion element of claim 1, wherein the plurality of charge read-out regions is arranged in a topology of n-fold rotational symmetry with respect a center position of the light receiving region.

5. The photoelectric-conversion element of claim 1, wherein each of the charge read-out regions of (n−1) pieces, among the plurality of charge read-out regions, reads out the majority carriers being generated in the surface buried region as signal charges, and
wherein one of the charge read-out regions, which is remaining among the plurality of charge read-out regions, exhausts charges ascribable to background light generated in the surface buried region by background light.

6. The photoelectric-conversion element of claim 1, further comprising charge-exhaust regions, having the second conductivity type, which are arranged to be away from the plurality of charge read-out regions at positions surrounding the light receiving region and have impurity concentration higher than that of the element-allocating layer,
wherein each of the charge read-out regions of the n pieces reads out the majority carriers generated in the surface buried region as signal charges.

7. The photoelectric-conversion element of claim 1, further comprising a potential-hill creating-portion of the first conductivity type in a center of the light receiving region, the potential-hill creating-portion being surrounded by the surface buried region.

8. The photoelectric-conversion element of claim 1, further comprising a guide region having the second conductivity type, surrounding a periphery of the surface buried region and has impurity concentration higher than that of the surface buried region.

9. The photoelectric-conversion element of claim 1, further comprising:
a plurality of charge-accumulation regions having the second conductivity type provided between the plurality of charge-transfer channels and the plurality of charge read-out regions, the charge-accumulation regions having impurity concentration higher than that of the element-allocating layer and lower than that of the plurality of charge read-out regions; and
auxiliary electrodes being opposingly arranged closely to the plurality of field-control electrodes at positions on output sides with respect to the plurality of field-control electrodes so to be paired on both sides of the plurality of charge-accumulation regions, the auxiliary electrodes control depletion potentials of the plurality of charge-accumulation regions by lateral static induction effect,
wherein an amount of signal charges being accumulated in the plurality of charge-accumulation regions is increased by voltages applied to the auxiliary electrodes.

10. The photoelectric-conversion element of claim 9, wherein each of the auxiliary electrodes is divided into a region having the first conductivity type polycrystalline silicon film and another region having the second conductivity type polycrystalline silicon film.

11. The photoelectric-conversion element of claim 10, wherein the region having the second conductivity type polycrystalline silicon film are arranged at positions close to the plurality of charge-accumulation regions on output sides of the plurality of charge-accumulation regions.

12. The photoelectric-conversion element of claim 1, wherein each of the plurality of field-control electrodes is divided into a region having the first conductivity type polycrystalline silicon film and another region having the second conductivity type polycrystalline silicon film, and
wherein the regions of the plurality of field-control electrodes made of the second conductivity type polycrystalline silicon film, are arranged at positions in a direction away from input sides of the plurality of charge-transfer channels.

13. The photoelectric-conversion element of claim 9, wherein charge-accumulation promotion regions having the second conductivity type, having impurity concentration higher than that of the plurality of charge-accumulation regions, are arranged in an upper portion of the element-allocating layer below the auxiliary electrodes on the output sides of the plurality of charge-accumulation regions through intermediation of an insulator.

14. The photoelectric-conversion element of claim 9, wherein each of the plurality of field-control electrodes is divided into a region having the first conductivity type polycrystalline silicon film and another region having the second conductivity type polycrystalline silicon film, the field-control electrodes are arranged symmetrically on both the sides of the plurality of charge-accumulation regions, and control depletion potentials of the plurality of charge-accumulation regions by lateral static induction effect,
wherein the regions having the first conductivity type polycrystalline silicon film are opposingly arranged to be paired on both the sides of the plurality of charge-transfer channels, which are defined on input sides of the plurality of charge-accumulation regions, control depletion potentials of the plurality of charge-transfer channels by lateral static induction effect, the regions having the first conductivity type are assigned as field-control electrodes configured to introduce signal charges from the surface buried region to the plurality of charge-accumulation regions, and
wherein the regions having the second conductivity type polycrystalline silicon film are arranged at positions close to the plurality of charge-accumulation regions on the output sides of the plurality of charge-accumulation regions, the regions having the second conductivity type increase amounts of signal charges to be accumulated in the plurality of charge-accumulation regions, by controlling depletion potentials of the plurality of charge-accumulation regions with lateral static induction effect.

15. A solid-state image sensor, in which a plurality of pixels is arrayed on a single semiconductor chip, each of the plurality of pixels comprising:
an image-capturing region including a buried photodiode having an element-allocating layer of the first conductivity type and a surface buried region having the second conductivity type, the surface buried region being buried in an upper portion of the element-allocating layer;
a plurality of charge read-out regions of n pieces, having the second conductivity type, provided away from one another, being disposed at quintuple or more positions, surrounding a light receiving region defined in a center of the image-capturing region, and having impurity concentration higher than that of the element-allocating layer;
a plurality of charge-transfer channels having the second conductivity type, having independent paths extending from the light receiving region to the plurality of charge read-out regions, respectively;
a plurality of paired field-control electrodes disposed at both sides of the plurality of charge-transfer channels, the paired field-control electrodes are arranged at positions surrounding the light receiving region;
a plurality of charge-accumulation regions having the second conductivity type provided between the plurality of charge-transfer channels and the plurality of charge read-out regions, and having impurity concentration higher than that of the element-allocating layer and lower than that of the plurality of charge read-out regions;
a plurality of charge read-out channels having the second conductivity type, extending from the plurality of charge-accumulation regions to the plurality of charge read-out regions, each of which corresponding to the charge-accumulation regions, respectively; and a plurality of transfer electrodes being arranged for the plurality of charge read-out channels, respectively, wherein, in each of the plurality of pixels, a destination of majority carriers being generated in the surface buried region is sequentially controlled to be determined toward any one of the plurality of charge-accumulation regions by sequentially and cyclically applying field-control pulses having different phases to the plurality of field-control electrodes, and by sequentially changing depletion potentials of the surface buried region and the plurality of charge-transfer channels, and wherein charge-transfer pulses for transferring the majority carriers to the determined charge read-out regions are simultaneously applied from the plurality of charge-accumulation regions, which correspond to the determined charge read-out regions, to the plurality of transfer electrodes.

16. The solid-state image sensor of claim 15, wherein, in each of the plurality of pixels, the plurality of transfer electrodes are arranged to be paired on both sides of each of the plurality of charge read-out channels so as to perform lateral electric field control.

17. The solid-state image sensor of claim 15, wherein the plurality of charge read-out regions implementing each of the plurality of pixels is arranged in a topology of n-fold rotational symmetry with respect a center position of the light receiving region.

18. The solid-state image sensor of claim 15, wherein, in each of the plurality of pixels, each of the charge read-out regions of (n−1) pieces among the plurality of charge read-out regions reads out the majority carriers being generated in the surface buried region as signal charges, and wherein, in each of the plurality of pixels, one of the charge read-out regions, which is remaining among the plurality of charge read-out regions exhausts charges ascribable to background light generated in the surface buried region by background light.

19. The solid-state image sensor of claim 15, wherein each of the plurality of pixels further comprises charge-exhaust regions, having the second conductivity type, which are arranged to be away from the plurality of charge read-out regions at positions surrounding the light receiving region and have impurity concentration higher than that of the element-allocating layer, wherein, in each of the plurality of pixels, each of the charge read-out regions of the n pieces reads out the majority carriers generated in the surface buried region as signal charges.

20. The solid-state image sensor of claim 15, further comprising:

the plurality of charge-accumulation regions; and auxiliary electrodes being opposingly arranged closely to the plurality of field-control electrodes at positions on output sides with respect to the plurality of field-control electrodes so to be paired on both sides of the plurality of charge-accumulation regions, the auxiliary electrodes control depletion potentials of the plurality of charge-accumulation regions by lateral static induction effect, wherein an amount of signal charges being accumulated in the plurality of charge-accumulation regions is increased by voltages applied to the auxiliary electrodes.

* * * * *